United States Patent
Ogihara et al.

(10) Patent No.: US 12,174,541 B2
(45) Date of Patent: *Dec. 24, 2024

(54) COMPOSITION FOR FORMING SILICON-CONTAINING RESIST UNDERLAYER FILM AND PATTERNING PROCESS

(71) Applicant: SHIN-ETSU CHEMICAL CO., LTD., Tokyo (JP)

(72) Inventors: Tsutomu Ogihara, Joetsu (JP); Yusuke Biyajima, Joetsu (JP); Masahiro Kanayama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/184,709

(22) Filed: Mar. 16, 2023

(65) Prior Publication Data
US 2023/0244149 A1 Aug. 3, 2023

Related U.S. Application Data

(62) Division of application No. 16/928,777, filed on Jul. 14, 2020.

(30) Foreign Application Priority Data

Jul. 23, 2019 (JP) .................................. 2019-135144

(51) Int. Cl.
*C08G 77/18* (2006.01)
*C08G 77/26* (2006.01)
(Continued)

(52) U.S. Cl.
CPC ............... *G03F 7/11* (2013.01); *C08G 77/18* (2013.01); *C08G 77/26* (2013.01); *C09D 183/06* (2013.01); *C09D 183/08* (2013.01); *G03F 7/70383* (2013.01); *H01L 21/0274* (2013.01); *G03F 7/162* (2013.01); *G03F 7/168* (2013.01); *G03F 7/2006* (2013.01); *G03F 7/2041* (2013.01);
(Continued)

(58) Field of Classification Search
CPC ...... G03F 7/0757; G03F 7/075; G03F 7/0043; G03F 7/0045
See application file for complete search history.

(56) References Cited

U.S. PATENT DOCUMENTS 3,669,796 A 6/1972 Hall et al.
4,564,579 A 1/1986 Morita et al.
(Continued)

FOREIGN PATENT DOCUMENTS

EP 2063319 A1 5/2009
EP 2 426 558 A1 3/2012
(Continued)

OTHER PUBLICATIONS

Mar. 12, 2021 Office Action issued in Taiwanese Patent Application No. 109124498.
Apr. 25, 2022 Office Action issued in Korean Patent Application No. 10-2020-0090252.
Nov. 30, 2020 Extended European Search Report issued in European Application No. 20186739.7.
U.S. Appl. No. 16/928,777, filed Jul. 14, 2020 in the name of Ogihara et al.
(Continued)

*Primary Examiner* — Daborah Chacko-Davis
(74) *Attorney, Agent, or Firm* — Oliff PLC

(57) ABSTRACT

A composition for forming a silicon-containing resist underlayer film includes: a thermosetting silicon-containing material containing any one or more of a partial structure shown by the general formula (Sx-1), (Sx-2), and (Sx-3); and a compound shown by the general formula (P-0), where $R^1$ represents an organic group that has or generates a silanol group, a hydroxy group, or a carboxy group; $R^2$ and $R^3$ are each independently the same as $R^1$ or each represent a hydrogen atom or a monovalent substituent having 1 to 30 carbon atoms; $R^{100}$ represents a divalent organic group substituted with a fluorine atom; $R^{101}$ and $R^{102}$ each independently represents a monovalent hydrocarbon group having 1 to 20 carbon atoms; $R^{103}$ represents a divalent hydrocarbon group having 1 to 20 carbon atoms; and $L^{104}$ represents a single bond or a divalent hydrocarbon group having 1 to 20 carbon atoms.

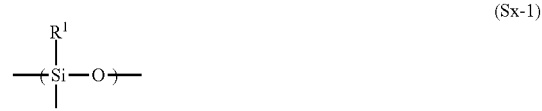

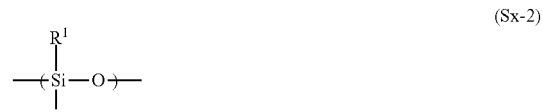

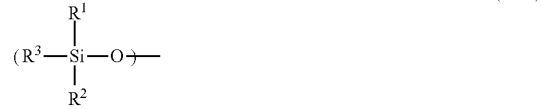

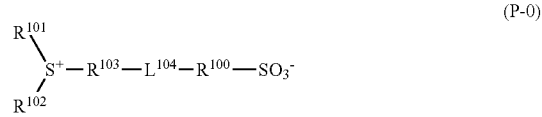

4 Claims, 2 Drawing Sheets

(51) Int. Cl.
  *C09D 183/06* (2006.01)
  *C09D 183/08* (2006.01)
  *G03F 7/00* (2006.01)
  *G03F 7/11* (2006.01)
  *H01L 21/027* (2006.01)
  *G03F 7/16* (2006.01)
  *G03F 7/20* (2006.01)
  *G03F 7/32* (2006.01)
  *G03F 7/38* (2006.01)
  *G03F 7/40* (2006.01)
  *H01L 21/308* (2006.01)
  *H01L 21/311* (2006.01)
  *H01L 21/3213* (2006.01)

(52) U.S. Cl.
  CPC ............... *G03F 7/325* (2013.01); *G03F 7/38* (2013.01); *G03F 7/40* (2013.01); *H01L 21/3081* (2013.01); *H01L 21/3086* (2013.01); *H01L 21/31138* (2013.01); *H01L 21/32139* (2013.01)

(56) References Cited

U.S. PATENT DOCUMENTS

| | | | |
|---|---|---|---|
| 11,385,544 | B2 | 7/2022 | Ogihara et al. |
| 11,485,824 | B2 | 11/2022 | Yano et al. |
| 2004/0236057 | A1 | 11/2004 | Chevalier et al. |
| 2006/0019195 | A1 | 1/2006 | Hatakeyama et al. |
| 2009/0011366 | A1 | 1/2009 | Tsubaki et al. |
| 2009/0136869 | A1 | 5/2009 | Ogihara et al. |
| 2010/0040972 | A1 | 2/2010 | Tarutani et al. |
| 2010/0069603 | A1 | 3/2010 | Tanaka et al. |
| 2011/0008735 | A1 | 1/2011 | Ohsawa et al. |
| 2012/0052685 | A1 | 3/2012 | Ogihara et al. |
| 2012/0238095 | A1 | 9/2012 | Ogihara et al. |
| 2012/0276483 | A1 | 11/2012 | Ogihara et al. |
| 2013/0005150 | A1 | 1/2013 | Ogihara et al. |
| 2013/0045601 | A1 | 2/2013 | Ogihara et al. |
| 2013/0137041 | A1 | 5/2013 | Ogihara et al. |
| 2013/0210229 | A1 | 8/2013 | Ogihara et al. |
| 2013/0210236 | A1 | 8/2013 | Ogihara et al. |
| 2013/0280912 | A1 | 10/2013 | Ogihara et al. |
| 2013/0323645 | A1 | 12/2013 | Komuro et al. |
| 2014/0232018 | A1 | 8/2014 | Shigaki et al. |
| 2014/0235796 | A1 | 8/2014 | Ogihara et al. |
| 2014/0322650 | A1 | 10/2014 | Ohashi et al. |
| 2017/0153549 | A1 | 6/2017 | Shibayama et al. |
| 2017/0154766 | A1 | 6/2017 | Ogihara et al. |
| 2017/0322491 | A1 | 11/2017 | Shibayama et al. |
| 2018/0267402 | A1 | 9/2018 | Hatakeyama et al. |
| 2018/0292753 | A1 | 10/2018 | Tanaka et al. |
| 2018/0364570 | A1 | 12/2018 | Hatakeyama et al. |
| 2019/0064665 | A1 | 2/2019 | Fujiwara et al. |
| 2020/0159120 | A1 | 5/2020 | Ogihara et al. |
| 2020/0233303 | A1 | 7/2020 | Ogihara et al. |
| 2020/0319550 | A1 | 10/2020 | Fukushima et al. |

FOREIGN PATENT DOCUMENTS

| | | | |
|---|---|---|---|
| EP | 2518562 | A2 | 10/2012 |
| EP | 2 628 744 | A1 | 8/2013 |
| EP | 3657254 | A1 | 5/2020 |
| JP | S60-17443 | A | 1/1985 |
| JP | S60-80844 | A | 5/1985 |
| JP | H04-107461 | A | 4/1992 |
| JP | 2004-153125 | A | 5/2004 |
| JP | 2004-536210 | A | 12/2004 |
| JP | 2005-128509 | A | 5/2005 |
| JP | 2008-281974 | A | 11/2008 |
| JP | 2008-281980 | A | 11/2008 |
| JP | 2009-053657 | A | 3/2009 |
| JP | 2009-126940 | A | 6/2009 |
| JP | 2012-053253 | A | 3/2012 |
| JP | 2012-194216 | A | 10/2012 |
| JP | 2012-237975 | A | 12/2012 |
| JP | 2013-033187 | A | 2/2013 |
| JP | 2013-041140 | A | 2/2013 |
| JP | 2013-114059 | A | 6/2013 |
| JP | 2013-166812 | A | 8/2013 |
| JP | 2013-167669 | A | 8/2013 |
| JP | 2013-224279 | A | 10/2013 |
| JP | 2014-006489 | A | 1/2014 |
| JP | 2014-157242 | A | 8/2014 |
| JP | 2014-225005 | A | 12/2014 |
| JP | 2017-095643 | A | 6/2017 |
| JP | 2020-118960 | A | 8/2020 |
| KR | 10-2014-0089350 | A | 7/2014 |
| KR | 10-2017-0062395 | A | 6/2017 |
| KR | 10-2018-0106938 | A | 10/2018 |
| TW | 200846400 | A | 12/2008 |
| TW | 201308016 | A | 2/2013 |
| TW | 201841998 | A | 12/2018 |
| TW | 201904940 | A | 2/2019 |
| WO | 2013/051558 | A1 | 4/2013 |
| WO | 2016/052389 | A1 | 4/2016 |
| WO | 2016/093172 | A1 | 6/2016 |

OTHER PUBLICATIONS

Hutchinson. John M., "The Shot Noise Impact On Resist Roughness in EUV Lithography", SPIE, vol. 3331, pp. 531-536, (1998).
Apr. 29, 2020 Extended Search Report issued in European Patent Application No. 19210759.7.
Yoshifumi, Maegawa et al., "A New Synthetic Approach for Functional Triisopropoxyorganosilanes Using Molecular Building Blocks", Tetrahedron, Elsevier Science Publishers, Amsterdam, NL, vol. 69, No. 26, pp. 5312-5318, 2013.
Feb. 22, 2021 Office Action issued in Korean Patent Application No. 10-2019-0149730.
Aug. 11, 2021 Office Action issued U.S. Appl. No. 16/660,992.
Feb. 3, 2021 Office Action issued in Taiwanese Application No. 108142057.
Nov. 2, 2021 Office Action issued in Taiwanese Application No. 108142057.
Feb. 11, 2022 Office Action Issued In U.S. Appl. No. 16/660,992.
Sep. 27, 2022 Office Action issued in Japanese Application No. 2019-183751.
Feb. 28, 2023 Office Action issued in Japanese Application 2019-183751.
U.S. Appl. No. 16/660,992, filed Oct. 23, 2019 in the name of Ogihara et al.
Mar. 13, 2023 Office Action issued in U.S. Appl. No. 16/660,992.
May 2, 2023 Office Action issued in Japanese Patent Application No. 2020-103314.
Jun. 13, 2023 Office Action issued In U.S. Appl. No. 16/928,777.
Sep. 29, 2023 Notice Of Allowance issued in U.S. Appl. No. 16/660,992.
Dec. 28, 2023 Office Action issued in U.S. Appl. No. 16/928,777.
Mar. 22, 2024 Office Action issued in U.S. Appl. No. 18/340,442.
Oct. 8, 2024 Office Action issued in U.S. Appl. No. 18/340,442.

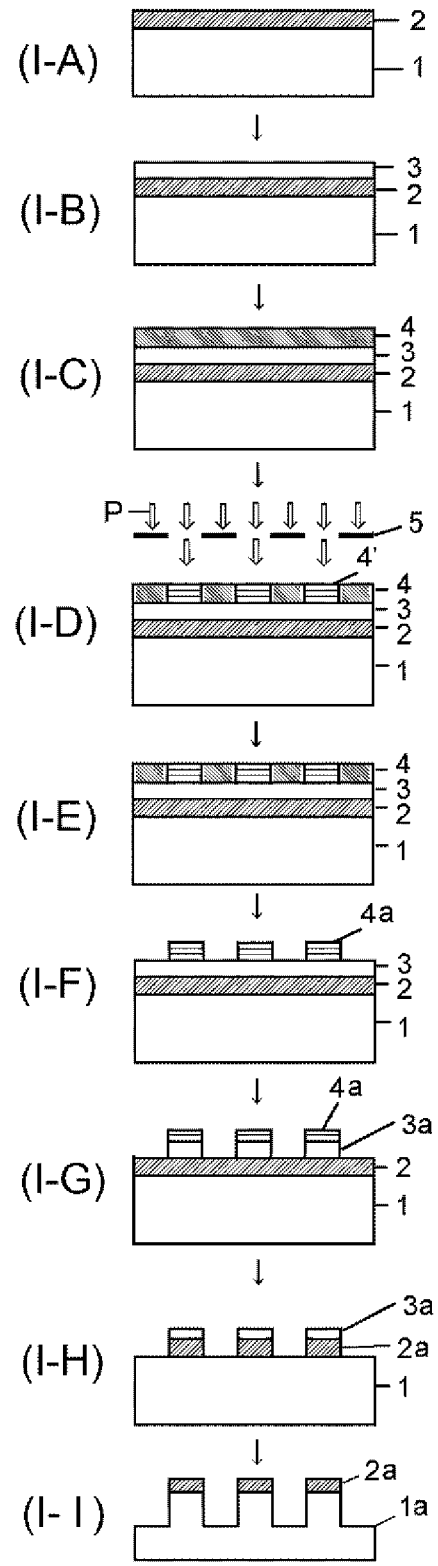
[FIG. 1]

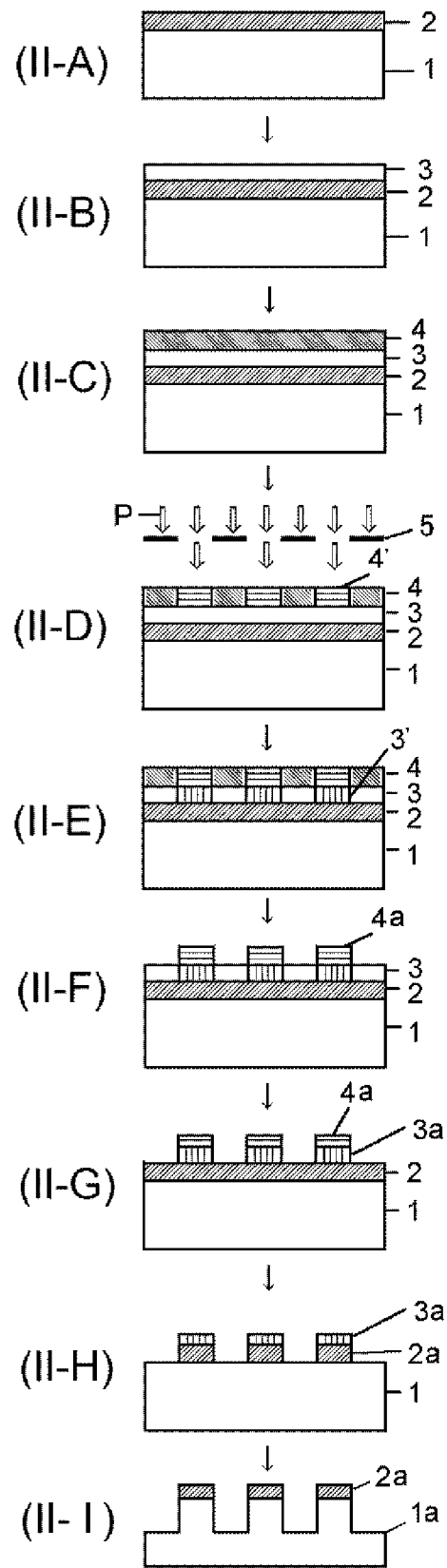

COMPOSITION FOR FORMING SILICON-CONTAINING RESIST UNDERLAYER FILM AND PATTERNING PROCESS

CROSS REFERENCE TO RELATED APPLICATIONS

This is a Division of application Ser. No. 16/928,777 filed Jul. 14, 2020, which claims priority to JP 2019-135144 filed Jul. 23, 2019. The disclosure of the prior applications is hereby incorporated by reference herein in its entirety.

TECHNICAL FIELD

The present invention relates to a composition for forming a silicon-containing resist underlayer film and a patterning process using the composition.

BACKGROUND ART

As Large-Scale Integrated circuits (LSIs) advance toward higher integration and higher processing speed, miniaturization in pattern rule has been required. In this situation, various technologies have been developed in regard to how patterning process can be performed more finely and precisely with light sources used in photolithography using a chemically amplified resist, which is a commonly-employed technique at present.

Meanwhile, as the miniaturization advances, light diffraction phenomenon is approaching the physical limit. Consequently, the contrast of exposure light employed in patterning has been lowered. Such physical limit causes low dissolution contrast in positive resist films, and thereby degrades focus margin and resolution of hole patterns and trench patterns. To prevent the degradation of patterning performance in such a limiting state, a technique is required which enhances the dissolution contrast of resist films. As a method for enhancing the dissolution contrast of a chemically amplified resist, efforts have been made by utilizing the proliferation mechanism of an acid generated from a photoacid generator so as to increase sensitivity and minimize the influence from the lowered contrast of exposure light.

Under such circumstances, organic solvent development is attracting attention as a technique for fine patterning. For example, for resolution of extremely fine hole patterns that cannot be achieved with a positive tone by negative tone exposure, it is possible to form negative patterns by organic solvent development using a high-resolution positive resist composition. Furthermore, a study is being made on obtaining twice as much resolving power by combining two developments: alkaline development and organic solvent development. As an ArF resist composition for negative tone development with an organic solvent, a conventional positive-type ArF resist composition can be used, and for example, patterning processes are shown in Patent Documents 1 to 3.

CITATION LIST

Patent Literature

Patent Document 1: Japanese Unexamined Patent Application Publication No. 2008-281974
Patent Document 2: Japanese Unexamined Patent Application Publication No. 2008-281980
Patent Document 3: Japanese Unexamined Patent Application Publication No. 2009-53657

SUMMARY OF INVENTION

Technical Problem

The present inventors have hitherto presented, for example, JP 2012-194216 A, JP 2012-237975 A, JP 2013-33187 A, JP 2013-41140 A, JP 2013-114059 A, JP 2013-167669 A, JP 2013-166812 A, and JP 2013-224279 A that disclose silicon-containing resist underlayer films suitable for negative tone patterning by developing a positive-type resist with organic solvent. However, recently, a higher-precision edge roughness (LWR) and critical dimension uniformity (CDU) of hole patterns are required in patterning.

The present invention has been accomplished in view of the above-described circumstances, and an object of the present invention is to provide a composition for forming a silicon-containing resist underlayer film that can form resist patterns excellent in LWR and CDU, and a patterning process using this composition.

Solution to Problem

To solve the above-described problem, the present invention provides a composition for forming a silicon-containing resist underlayer film comprising: a thermosetting silicon-containing material containing any one or more of a repeating unit shown by the following general formula (Sx-1), a repeating unit shown by the following general formula (Sx-2), and a partial structure shown by the following general formula (Sx-3); and a compound shown by the following general formula (P-0),

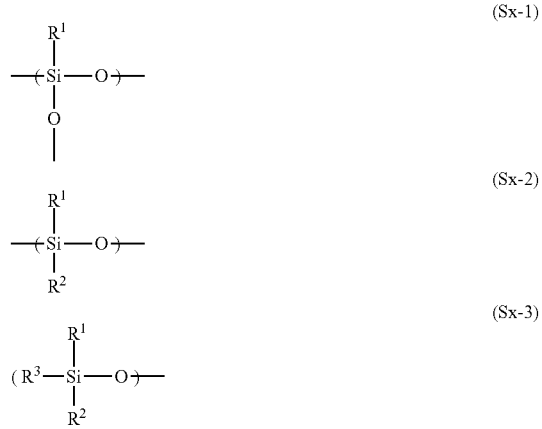

wherein $R^1$ represents an organic group having one or more silanol groups, hydroxy groups, or carboxy groups, or an organic group from which a protecting group is eliminated by an action of acid and/or heat to generate one or more silanol groups, hydroxy groups, or carboxy groups; $R^2$ and $R^3$ are each independently the same as $R^1$ or each represent a hydrogen atom or a monovalent substituent having 1 to 30 carbon atoms, and

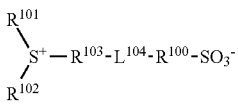

(P-0)

wherein in the formula (P-0), $R^{100}$ represents a divalent organic group substituted with one or more fluorine atoms, $R^{101}$ and $R^{102}$ each independently represents a linear, branched, or cyclic monovalent hydrocarbon group having 1 to 20 carbon atoms optionally substituted with a hetero atom or optionally interposed by a hetero atom; $R^{103}$ represents a linear, branched, or cyclic divalent hydrocarbon group having 1 to 20 carbon atoms optionally substituted with a hetero atom or optionally interposed by a hetero atom; $R^{101}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms optionally substituted with a hetero atom or optionally interposed by a hetero atom.

A resist pattern excellent in LWR and CDU can be formed with such a composition for forming a silicon-containing resist underlayer film.

The composition for forming a silicon-containing resist underlayer film may further comprise a crosslinking catalyst.

A silicon-containing resist underlayer film crosslinked at high density can be formed with such a composition for forming a silicon-containing resist underlayer film since the crosslinking catalyst can promote siloxane bond formation when a thermosetting polysiloxane is cured.

In this case, the crosslinking catalyst may be a sulfonium salt, an iodonium salt, a phosphonium salt, an ammonium salt or a polysiloxane having a structure partially containing one of these salts, or an alkaline metal salt.

A resist pattern more excellent in LWR and CDU can be formed by combining such a crosslinking catalyst with the thermosetting silicon-containing material of the present invention.

The composition for forming a silicon-containing resist underlayer film may further comprise a nitrogen-containing compound having an acid-decomposable substituent.

Such a composition for forming a silicon-containing resist underlayer film can inactivate excess acid by containing the nitrogen-containing compound, and in this manner, diffusion of acid to the upper layer resist can be suppressed, and it is possible to form an upper layer resist pattern that is even more excellent in LWR and CDU.

Furthermore, the present invention provides a patterning process comprising:
  forming an organic underlayer film on a body to be processed using a coating-type organic underlayer film material;
  forming a silicon-containing resist underlayer film on the organic underlayer film using the composition for forming a silicon-containing resist underlayer film described above;
  forming a photoresist film on the silicon-containing resist underlayer film using a chemically amplified resist composition;
  exposing the photoresist film after a heat treatment and dissolving an unexposed portion of the photoresist film using an organic solvent developer to form a negative-type pattern;
  transferring the pattern to the silicon-containing resist underlayer film by dry etching using the photoresist film having the formed pattern as a mask;
  transferring the pattern to the organic underlayer film by dry etching using the silicon-containing resist underlayer film having the transferred pattern as a mask; and
  transferring the pattern to the body to be processed by dry etching using the organic underlayer film having the transferred pattern as a mask.

Using the inventive composition for forming a silicon-containing resist underlayer film, an upper layer resist pattern with favorable LWR and CDU can be formed, and in addition, a semiconductor-device pattern can be formed on a substrate with high yield since the silicon-containing resist underlayer film formed in this manner has excellent dry etching selectivity relative to an upper layer resist (photoresist film) and an organic underlayer film.

Furthermore, the present invention also provides a patterning process comprising:
  forming an organic hard mask mainly containing carbon on a body to be processed by a CVD method; forming a silicon-containing resist underlayer film on the organic hard mask using the composition for forming a silicon-containing resist underlayer film described above;
  forming a photoresist film on the silicon-containing resist underlayer film using a chemically amplified resist composition;
  exposing the photoresist film after a heat treatment and dissolving an unexposed portion of the photoresist film using an organic solvent developer to form a negative-type pattern;
  transferring the pattern to the silicon-containing resist underlayer film by dry etching using the photoresist film having the formed pattern as a mask;
  transferring the pattern to the organic hard mask by dry etching using the silicon-containing resist underlayer film having the transferred pattern as a mask; and
  transferring the pattern to the body to be processed by dry etching using the organic hard mask having the transferred pattern as a mask.

Using the inventive composition for forming a silicon-containing resist underlayer film, an upper layer resist pattern with favorable LWR and CDU can be formed, and in addition, a semiconductor-device pattern can be formed on a substrate with high yield since the silicon-containing resist underlayer film formed in this manner has excellent dry etching selectivity relative to an upper layer resist (photoresist film) and an organic hard mask.

In the patterning process, the pattern may be formed in the photoresist film by a photolithography with a wavelength of 10 nm or more and 300 nm or less, direct drawing with an electron beam, nanoimprinting, or a combination thereof.

A suitable negative-type resist pattern can be obtained by performing a treatment in accordance with necessity after patterning under conditions adapted to the photoresist film.

Furthermore, in the patterning process, the body to be processed may be a semiconductor device substrate, a metal film, an alloy film, a metal carbide film, a metal oxide film, a metal nitride film, a metal oxycarbide film, or a metal oxynitride film.

A high-precision pattern can be formed on the substrate (film) without changing the size when an organic underlayer film or an organic hard mask is formed on the body to be processed in the inventive patterning process.

In addition, in the patterning process, the metal of the body to be processed may be silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

Using a body to be processed constituted by such a metal, a negative-type pattern can be transferred to the body to be processed with high precision by etching precisely.

Advantageous Effects of Invention

The inventive composition for forming a silicon-containing resist underlayer film contains a betaine-type acid generator, thereby making it possible to form an upper layer resist pattern excellent in LWR and CDU, and also the inventive composition for forming a silicon-containing resist underlayer film has high etching selectivity relative to an organic material (organic underlayer film or organic hard mask), so that a formed photoresist pattern can be successively transferred to the silicon-containing resist underlayer film and the organic underlayer film or CVD organic hard mask by dry etching process. In particular, as the semiconductor-device manufacturing process progresses toward miniaturization recently, multiple exposure process is often used, and the LWR and CDU in the developed pattern greatly influence the device performances. Hence, it is important to enhance LWR and CDU properties. An upper layer resist pattern excellent in LWR and CDU can be formed by using the inventive composition for forming a silicon-containing resist underlayer film. Further, since the inventive composition for forming a silicon-containing resist underlayer film has favorable dry etching selectivity ratio, it is possible to suppress deformation of an upper layer resist pattern during dry etching and to transfer the pattern to a substrate with high precision while maintaining the excellent LWR and CDU, even when the silicon-containing resist underlayer film is used as a dry etching mask.

BRIEF DESCRIPTION OF DRAWINGS

FIG. 1 is a flow diagram showing the inventive patterning process.

FIG. 2 is a flow diagram showing a different patterning process of the present invention.

DESCRIPTION OF EMBODIMENTS

The present invention relates to a composition for forming an underlayer film suitable for a resist material and patterning using the composition. By a deprotection reaction by acid and/or heat after exposure, the resist material forms a negative tone pattern where an unexposed part is dissolved and an exposed part is not dissolved by organic solvent development.

As stated above, development of a composition for forming a resist underlayer film that makes it possible to form an upper layer resist pattern excellent in LWR and CDU has been required.

To achieve the above object, the present inventors have earnestly studied and found out that a resist underlayer film formed from a composition for forming a silicon-containing resist underlayer film containing a thermosetting silicon-containing material having an organic group having a silanol group, a hydroxy group, or a carboxy group, or an organic group generating a silanol group, a hydroxy group, or a carboxy group by an action of acid and/or heat, and a betaine-type compound having an anion moiety and a cation moiety in one molecule, has a lowered contact angle on a surface of the underlayer film in a portion that comes into contact with the upper layer resist pattern to have favorable pattern adhesiveness; and that furthermore, LWR and CDU of the upper layer resist can be improved since a diffusion distance of the generated acid derived from the betaine-type compound is small. Thus, the present invention has been completed.

That is, the present invention is a composition for forming a silicon-containing resist underlayer film comprising: a thermosetting silicon-containing material containing any one or more of a repeating unit shown by the following general formula (Sx-1), a repeating unit shown by the following general formula (Sx-2), and a partial structure shown by the following general formula (Sx-3); and a compound shown by the following general formula (P-0),

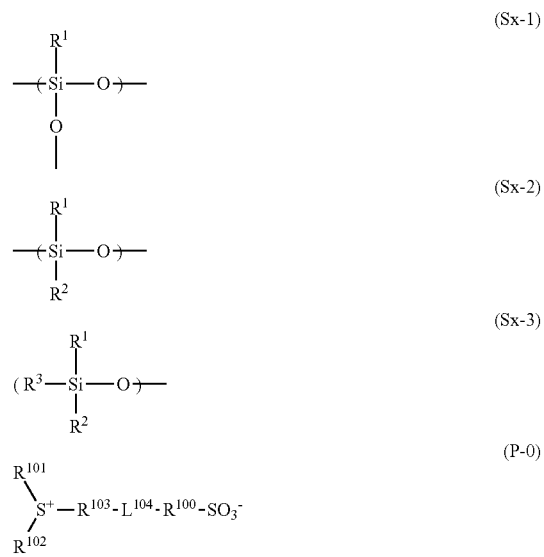

wherein $R^1$ represents an organic group having one or more silanol groups, hydroxy groups, or carboxy groups, or an organic group from which a protecting group is eliminated by an action of acid and/or heat to generate one or more silanol groups, hydroxy groups, or carboxy groups; $R^2$ and $R^3$ are each independently the same as $R^1$ or each represent a hydrogen atom or a monovalent substituent having 1 to 30 carbon atoms; and $R^{100}$ represents a divalent organic group substituted with one or more fluorine atoms, $R^{101}$ and $R^{102}$ each independently represents a linear, branched, or cyclic monovalent hydrocarbon group having 1 to 20 carbon atoms optionally substituted with a hetero atom or optionally interposed by a hetero atom; $R^{103}$ represents a linear, branched, or cyclic divalent hydrocarbon group having 1 to 20 carbon atoms optionally substituted with a hetero atom or optionally interposed by a hetero atom; $R^{101}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms optionally substituted with a hetero atom or optionally interposed by a hetero atom.

In a negative tone pattern obtained by a solvent development, acid-labile group in a resin forming the pattern is eliminated by an acid generated in exposure, and the amount of hydrophilic groups such as carboxy groups and phenolic hydroxy groups in the resin increases. As a result, the pattern surface becomes hydrophilic, and a contact angle with water becomes small. In accordance with such properties of negative tone patterns, the present inventors have made the contact angle of the underlayer film surface with water small by the effect of acid that is generated in the upper layer resist in an exposed portion to provide an underlayer film favorable in adhesiveness with the negative tone pattern. However, in fine patterns of recent years, application of a photo-acid generator having cation and anion structures in one molecule, that is, a betaine structure in an upper layer resist for improvement of LWR and CDU is also known (JP 2014-225005 A). As a characteristic of this structure, a salt compound is formed from molecules when acids are generated, possibly forming a giant compound by appearance. As a result, presumably, the generated acids diffuse less. Therefore, since generated acids diffuse less in upper layer resists of recent years, action on the underlayer film surface is also lessened, and as a result, influence on change in contact angle is also lessened, and adhesiveness of negative tone patterns is degraded. Accordingly, there is a method of adding a photo-acid generator to the underlayer film in order to maintain the adhesiveness of negative tone patterns, but with a conventional photo-acid generator, diffusion of generated acids is large, and therefore, the generated acids diffuse to the upper layer resist, causing degradation of LWR and CDU of the upper layer resist. Accordingly, by using a photo-acid generator with less diffusion of generated acids as the photo-acid generator added for lowering the contact angle on the underlayer film surface as well, adhesiveness with the negative tone pattern and LWR or CDU can be improved at the same time, and this can be extremely effective.

When the inventive composition for forming a silicon-containing resist underlayer film contains a crosslinking catalyst, the crosslinking catalyst can promote siloxane bond formation when a thermosetting polysiloxane is cured, and a silicon-containing resist underlayer film crosslinked at high density can be formed. In this manner, not only is the diffusion of acid generated from the acid generator of the present invention reduced, but it is also possible to inactivate the acid present in excess by containing a nitrogen-containing compound having a substituent that is decomposed by acid. In this way, diffusion of acid to the upper layer resist is suppressed and an upper layer resist pattern excellent in LWR and CDU can be formed.

Furthermore, the inventive composition for forming a silicon-containing resist underlayer film makes it possible to form an upper layer resist pattern with favorable LWR and CDU, and also to form a semiconductor-device pattern on a substrate with high yield because of excellent dry etching selectivity relative to an upper layer resist and an underlayer organic film or a CVD carbon film.

Hereinafter, the present invention will be described in detail, but the present invention is not limited thereto.

[Composition for Forming Silicon-Containing Resist Underlayer Film]

The inventive composition for forming a silicon-containing resist underlayer film includes a thermosetting silicon-containing material containing any one or more of a repeating unit shown by the above general formula (Sx-1), a repeating unit shown by the general formula (Sx-2), and a partial structure shown by the general formula (Sx-3), and a compound shown by the general formula (P-0) as essential components. The composition may contain other components, as necessary, such as a crosslinking catalyst or a nitrogen-containing compound having an acid-decomposable substituent. Hereinafter, these components will be described.

[Thermosetting Silicon-Containing Material]

The inventive thermosetting silicon-containing material (Sx) contains any one or more of a repeating unit shown by the following general formula (Sx-1), a repeating unit shown by the following general formula (Sx-2), and a partial structure shown by the following general formula (Sx-3).

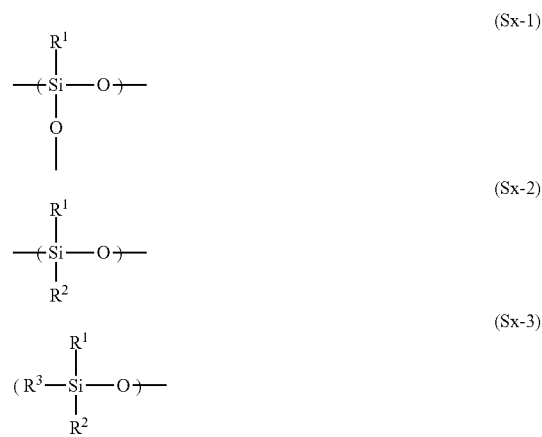

In the formula, $R^1$ represents an organic group having one or more silanol groups, hydroxy groups, or carboxy groups; or $R^1$ represents an organic group from which a protecting group is eliminated by an action of acid and/or heat to generate one or more silanol groups, hydroxy groups, or carboxy groups. $R^2$ and $R^3$ are each independently the same as $R^1$ or each represent a hydrogen atom or a monovalent substituent having 1 to 30 carbon atoms.

The above $R^1$ is not particularly limited as long as it is an organic group having one or more silanol groups, hydroxy groups, or carboxy groups, or an organic group from which a protecting group is eliminated by an action of acid and/or heat to generate one or more of the above groups.

Examples of such an $R^1$ of the thermosetting silicon-containing material (Sx) include the following. Note that, in the following formulae, (Si) is depicted to show a bonding site to Si (same hereinafter).

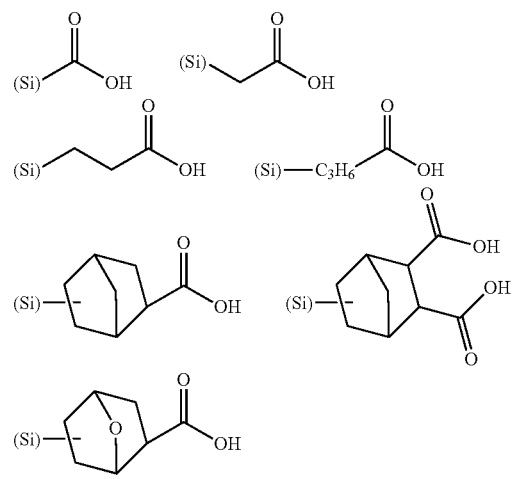

-continued
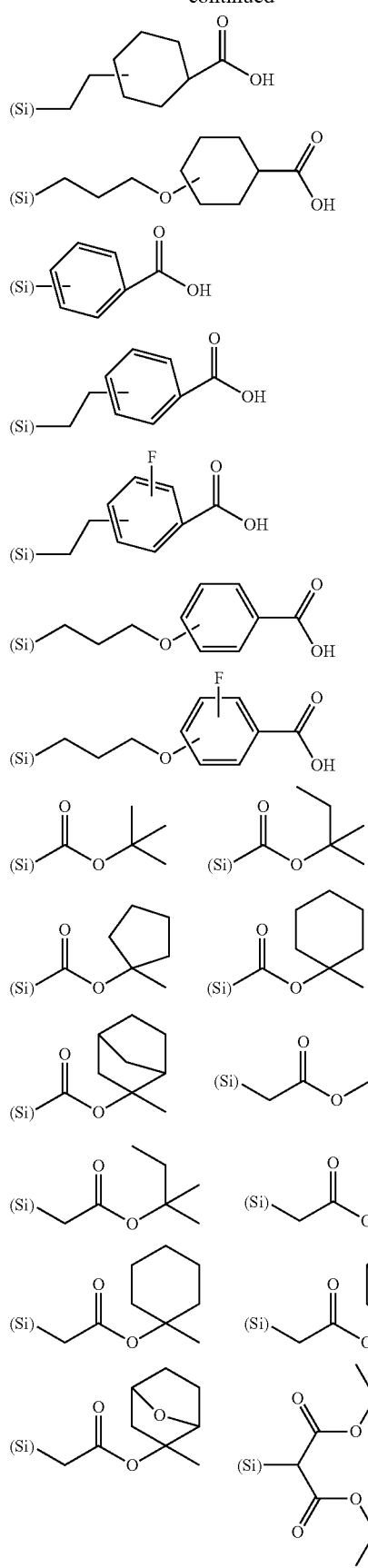
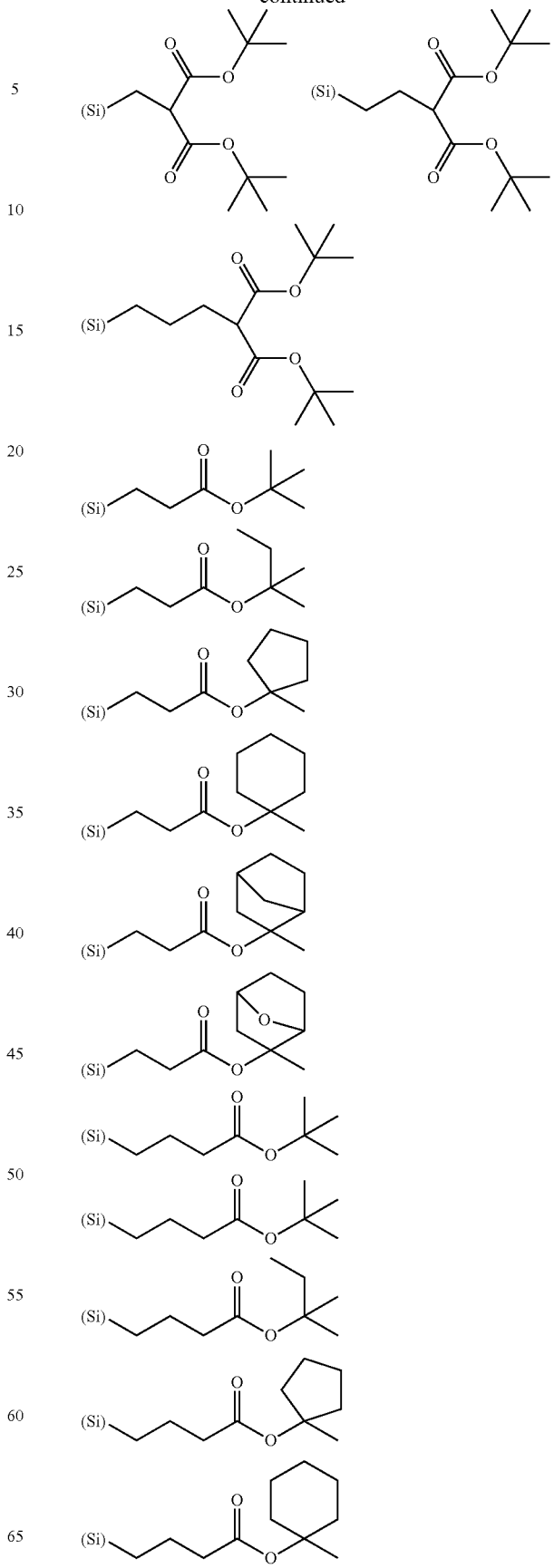

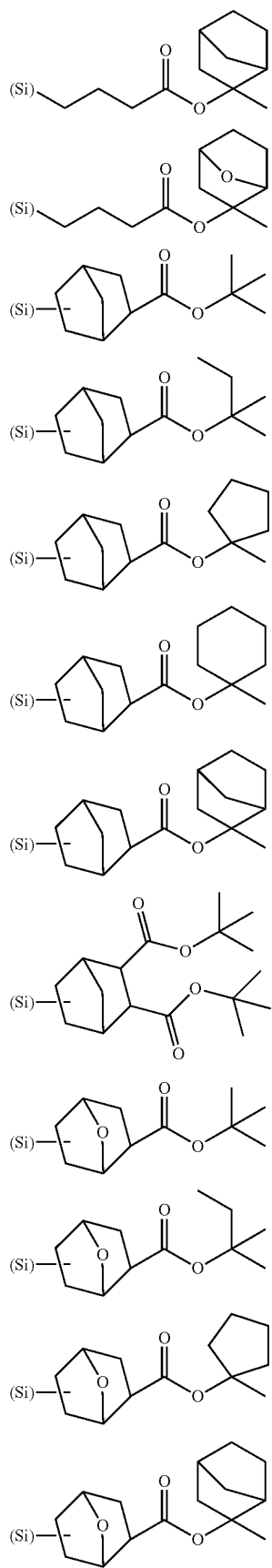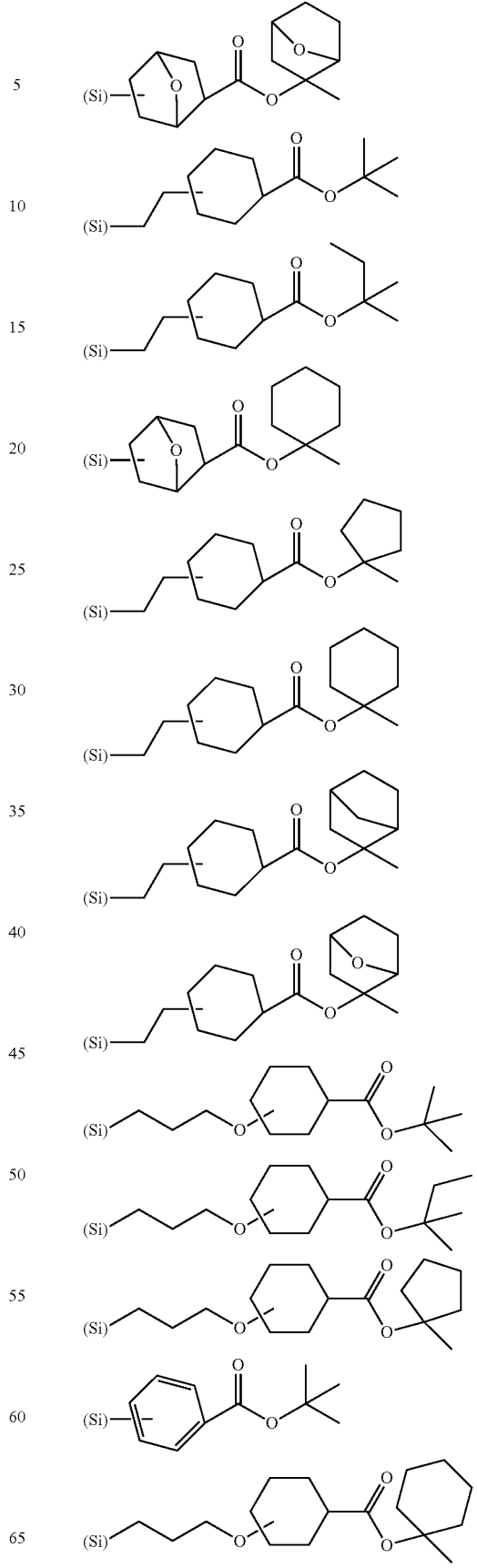

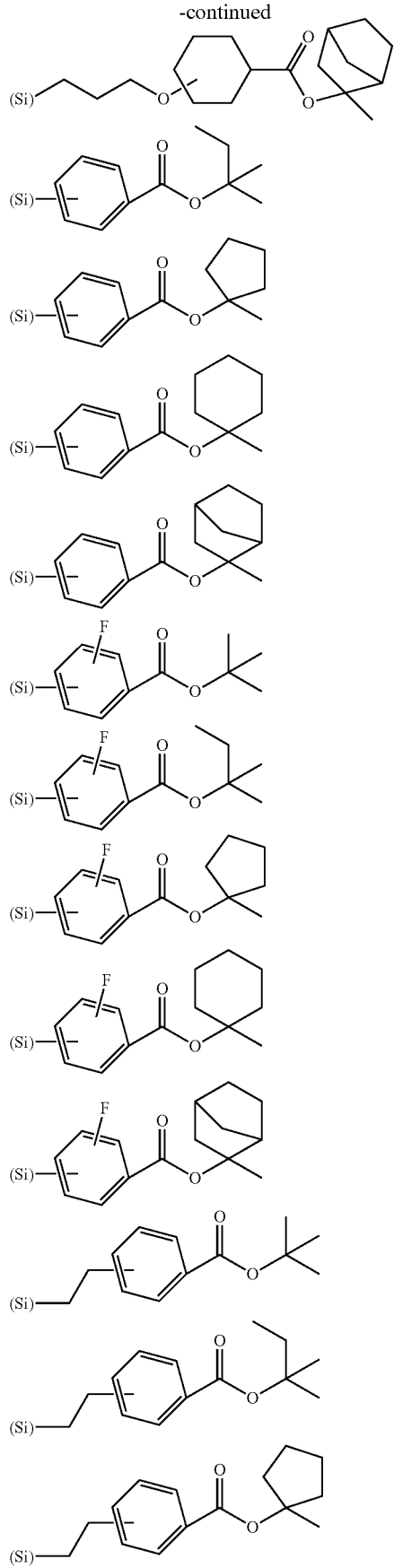
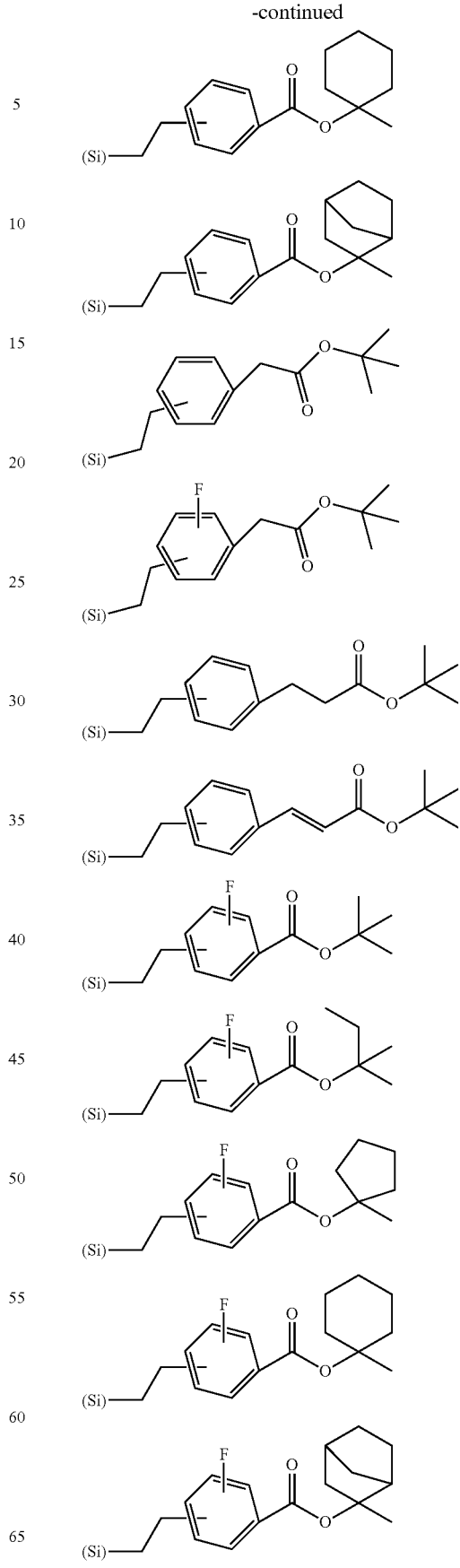

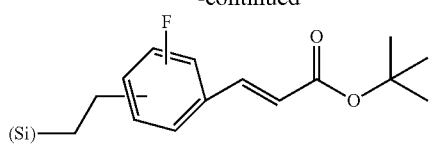
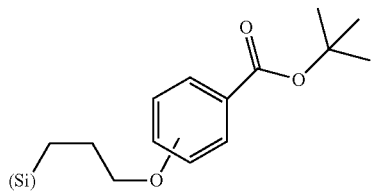
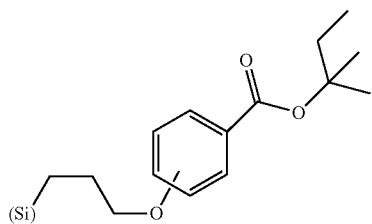
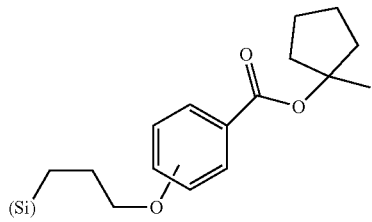
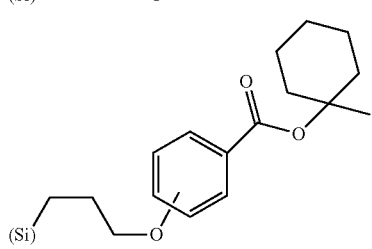
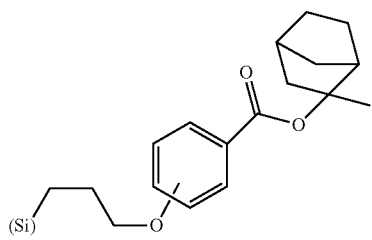
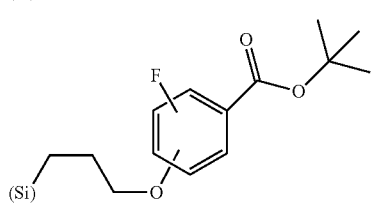
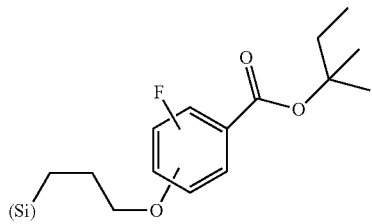
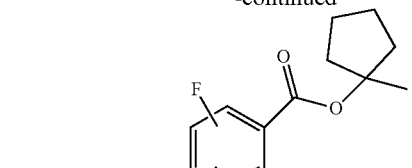
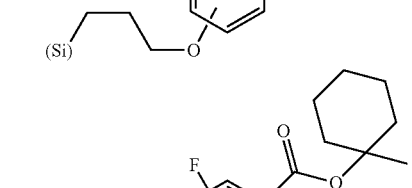
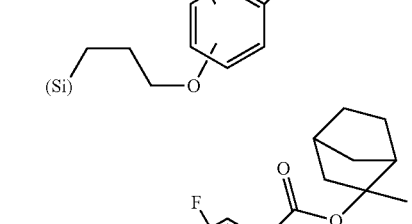
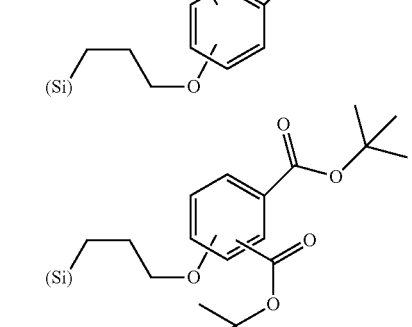
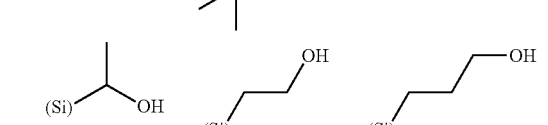
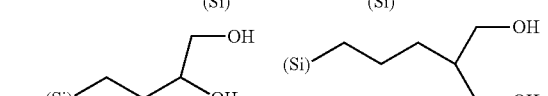
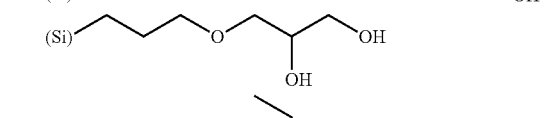
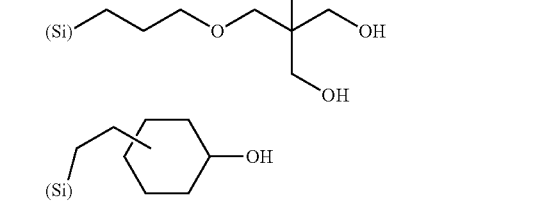
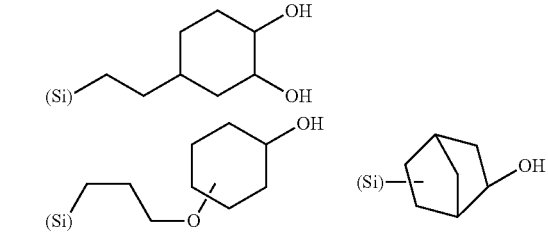

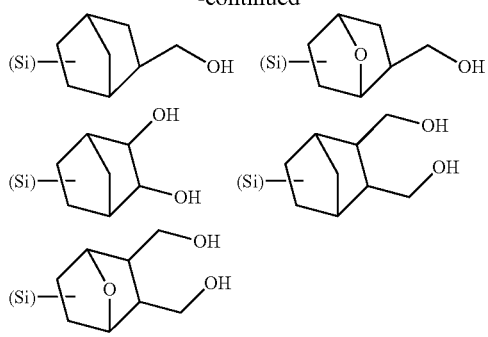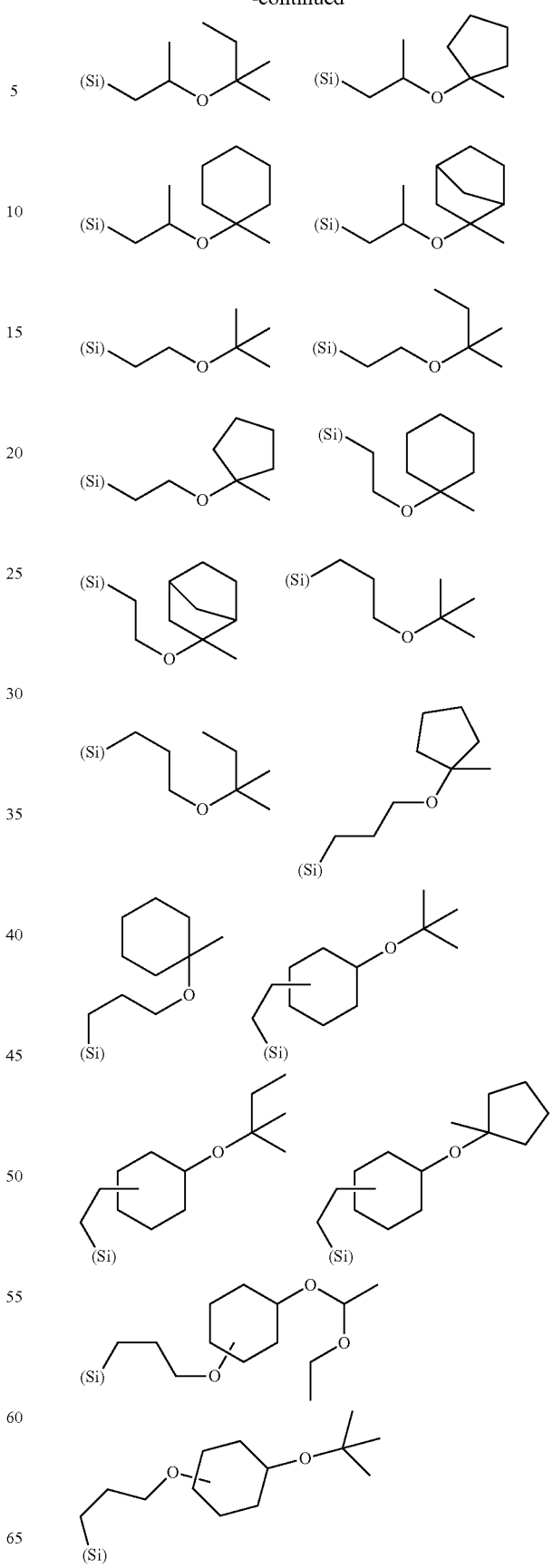

-continued
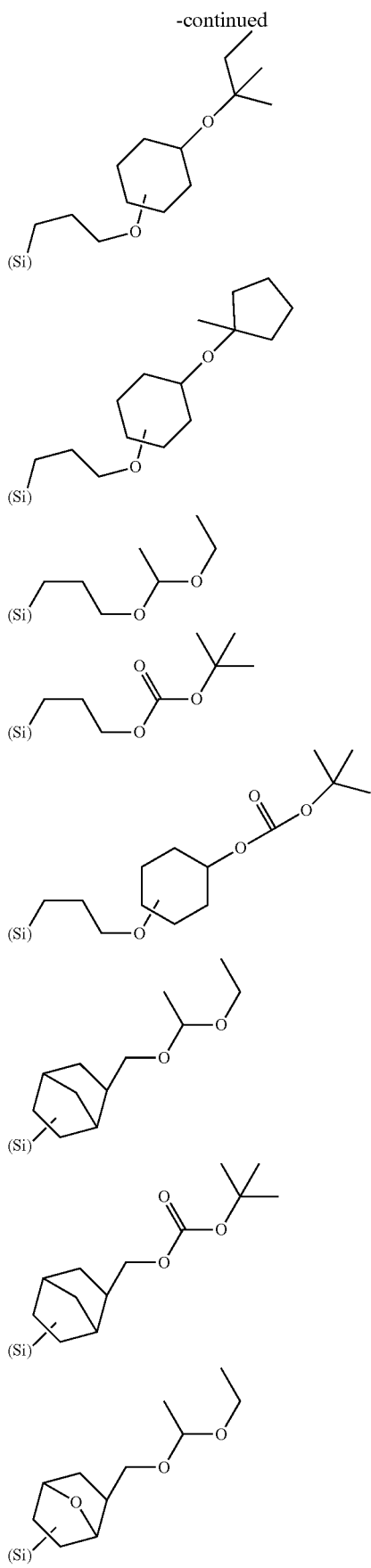
-continued
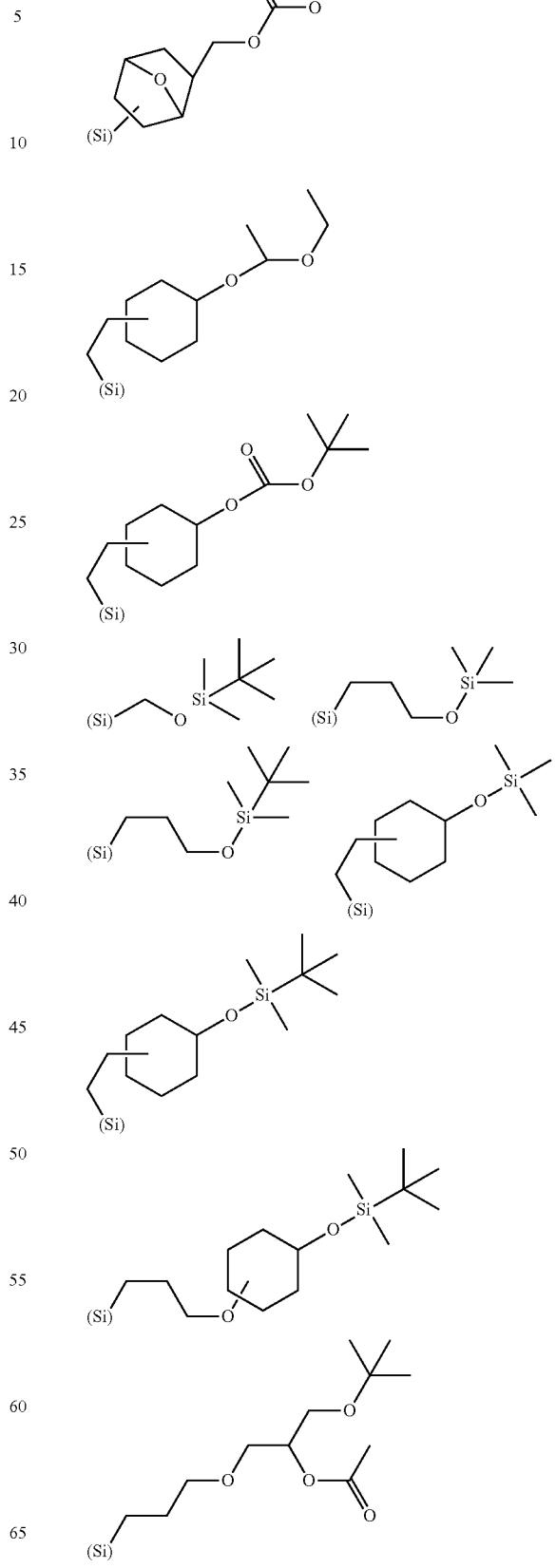

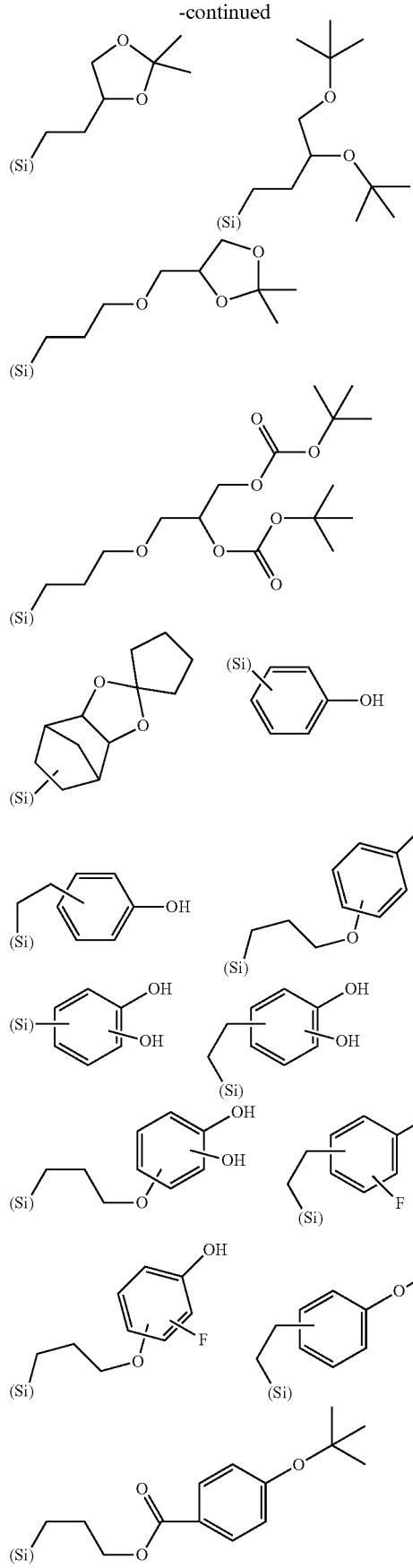
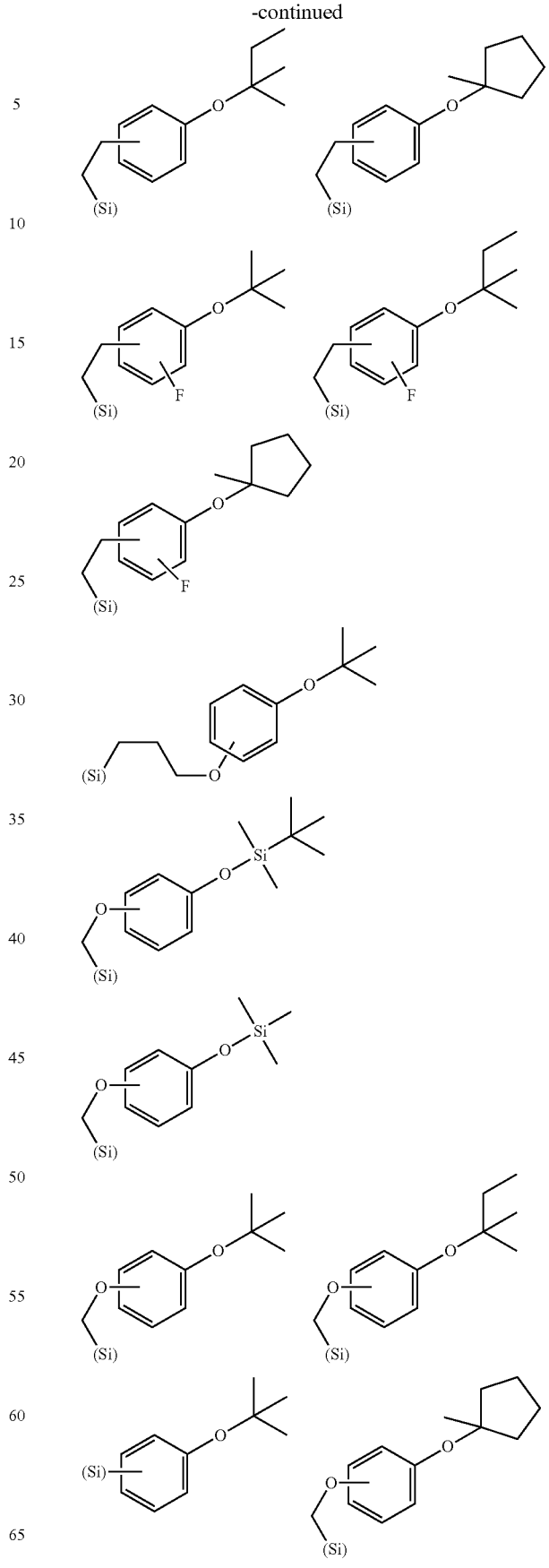

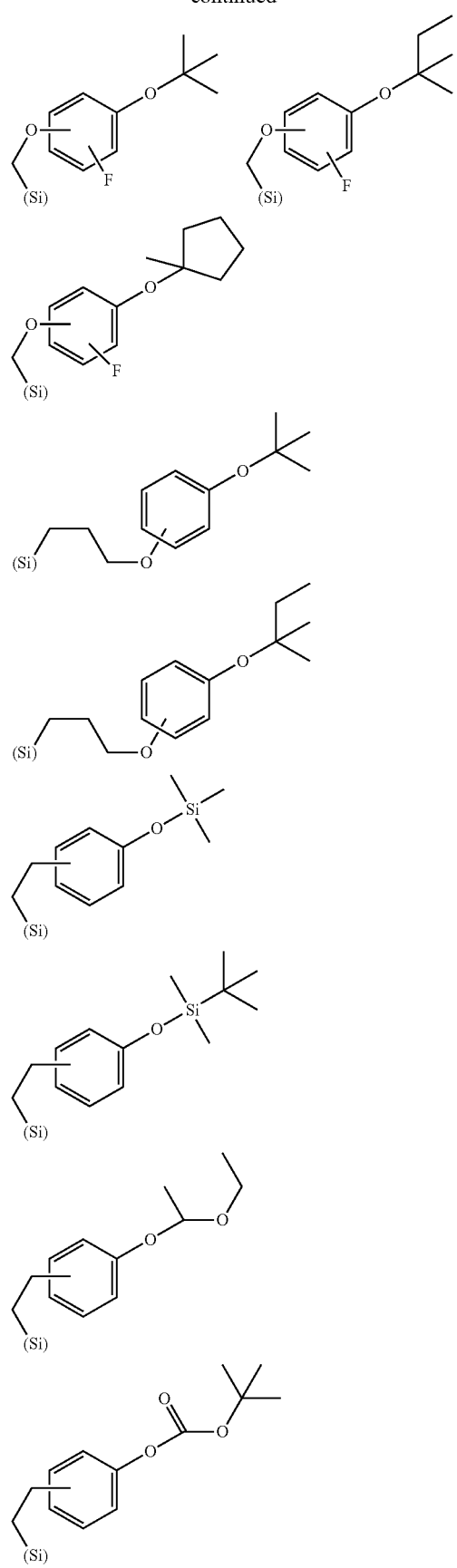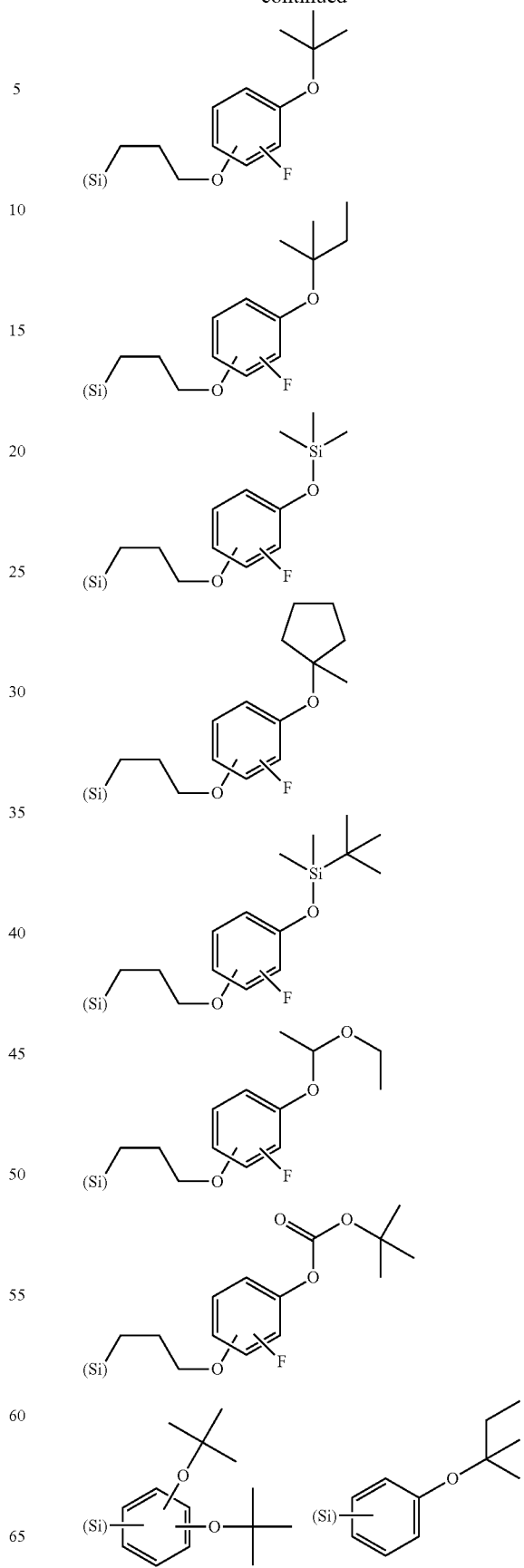

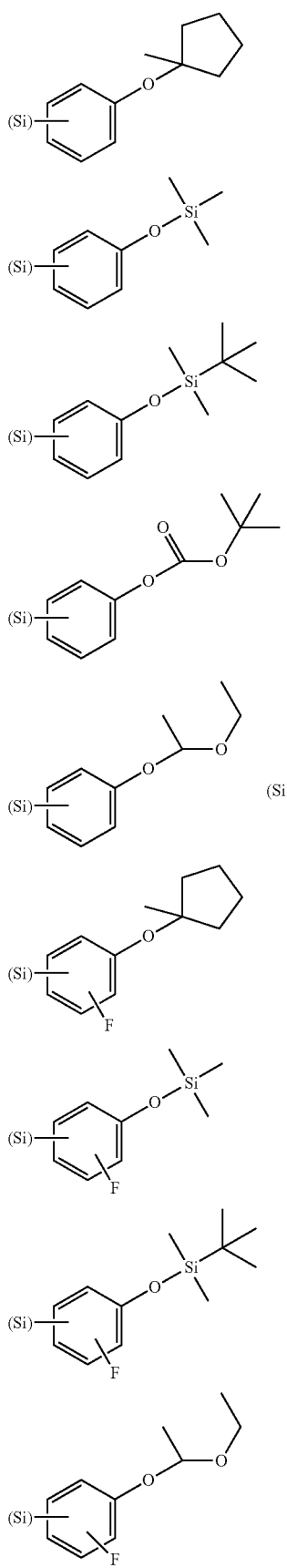
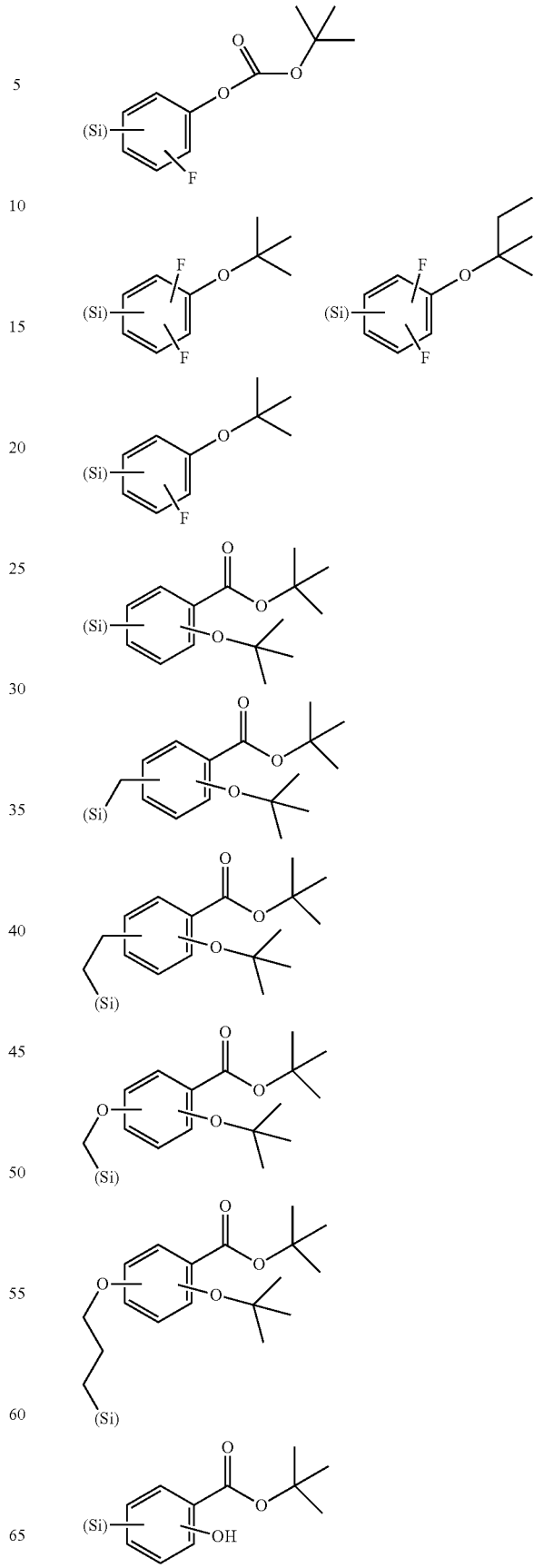

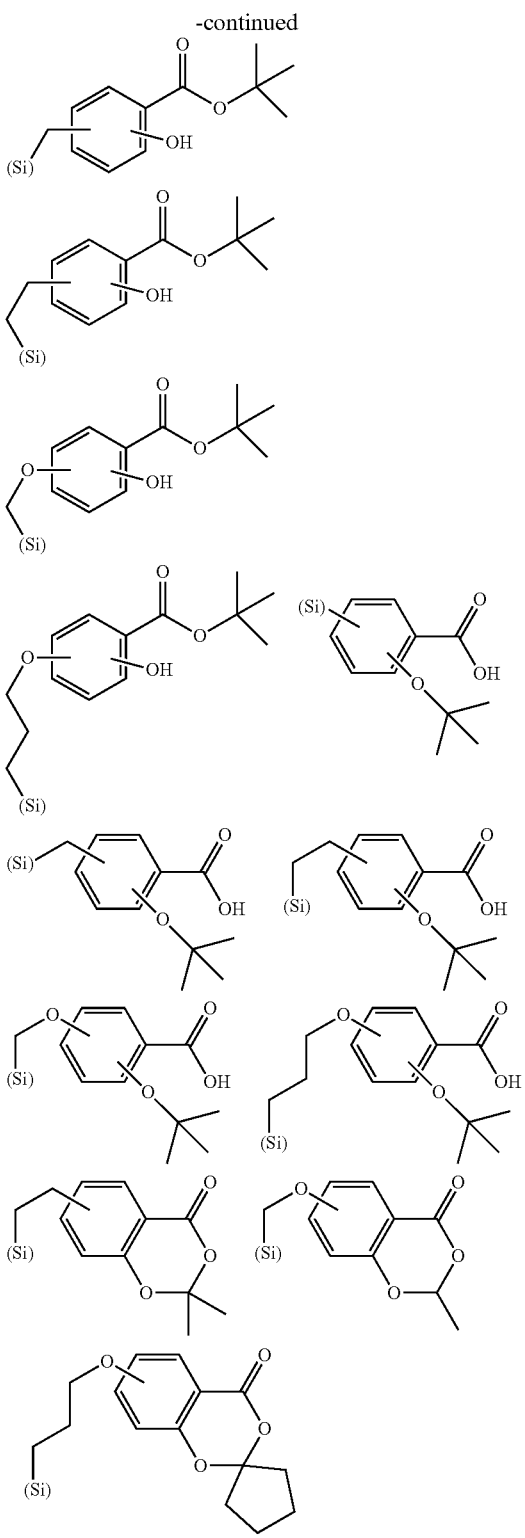

As a hydrolysable monomer (Sm) used as a raw material for forming the structure of the present invention, a monomer having the above structure on a silicon atom, further containing, as a hydrolysable group(s): one, two or three among chlorine, bromine, iodine, an acetoxy group, a methoxy group, an ethoxy group, a propoxy group, a butoxy group, and so forth, and if present, containing a hydrogen atom or a monovalent organic group having 1 to 30 carbon atoms as $R^2$ and $R^3$ can be used alone or in combination of two or more thereof.

Examples of the organic group shown by $R^2$ and $R^3$ include methyl, ethyl, vinyl, propyl, cyclopropyl, butyl, cyclobutyl, pentyl, cyclopentyl, hexyl, cyclohexyl, cyclohexenyl, cyclopentylmethyl, heptyl, cyclohexylmethyl, cyclohexenylmethyl, bicyclo[2,2,1]heptyl, octyl, cyclooctyl, cyclohexylethyl, decyl, adamanthyl, dodecyl, phenyl, benzyl, phenethyl, naphthyl, and anthranil, and may be the same or different.

Other examples of the organic group shown by $R^2$ and $R^3$ include organic groups having one or more carbon-oxygen single bonds or carbon-oxygen double bonds, specifically, organic groups having one or more groups selected from the group consisting of an ether bond, an ester bond, alkoxy groups, a hydroxy group, and the like. Examples of the organic groups include ones shown by the following general formula (Sm—R).

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \qquad (Sm\text{—}R)$$

In the general formula (Sm—R), P represents a hydrogen atom, a cyclic ether group, a hydroxy group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent $-C_qH_{(2q\text{-}p)}P_p\text{-}$, where P is as defined above, "p" represents an integer of 0 to 3, and "q" represents an integer of 0 to 10, provided that q=0 means a single bond; "u" represents an integer of 0 to 3; $S_1$ and $S_2$ each independently represent $-O-$, $-CO-$, $-OCO-$, $-COO-$, or $-OCOO-$. v1, v2, and v3 each independently represent 0 or 1. In addition, T represents a divalent atom other than carbon, or a divalent group of an alicyclic, aromatic, or heterocyclic ring.

As T, examples of the alicyclic, aromatic, or heterocyclic ring optionally containing a hetero-atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

T = 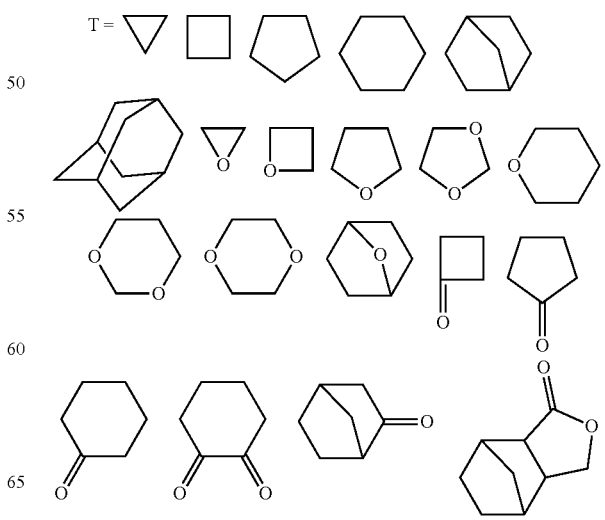

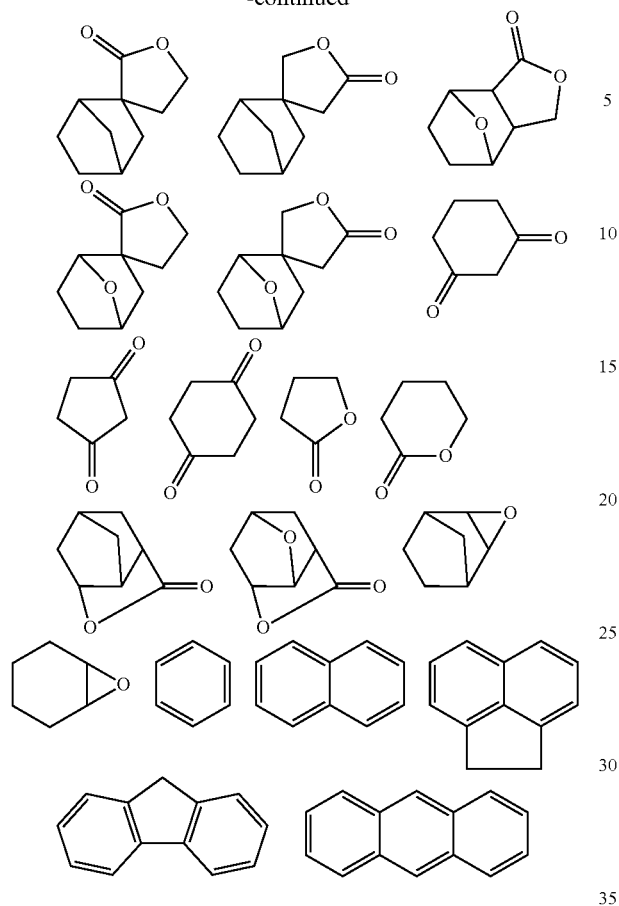
Favorable examples of the organic group having one or more carbon-oxygen single bonds or carbon-oxygen double bonds in the general formula (Sm—R) include the following.
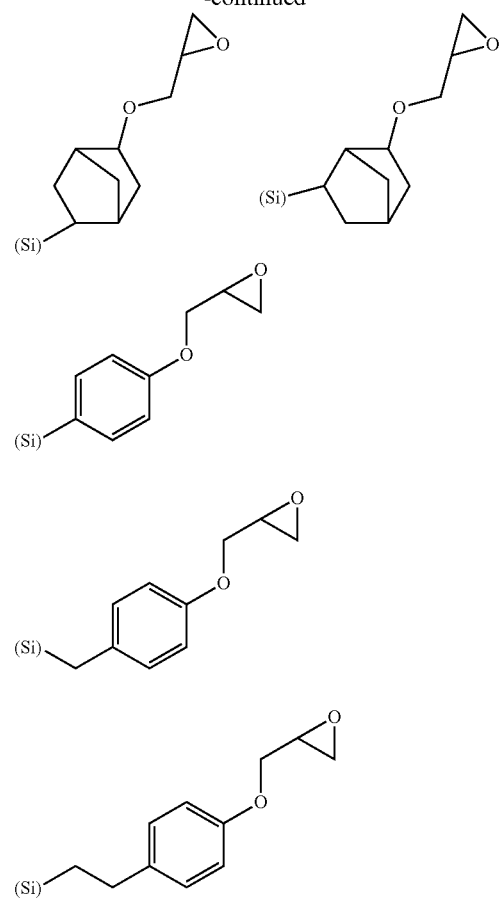

-continued
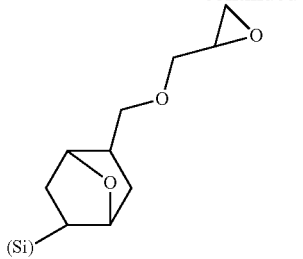
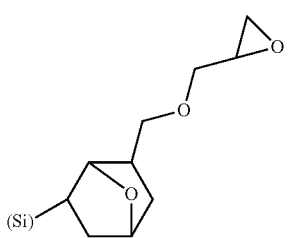
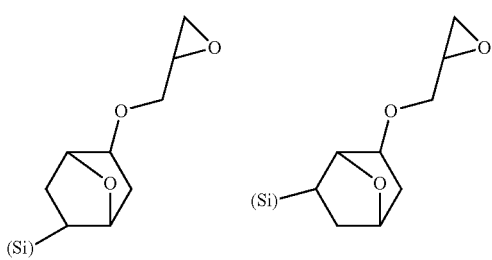
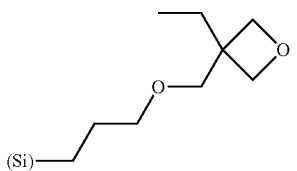
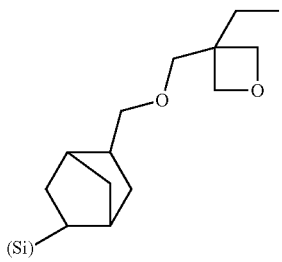
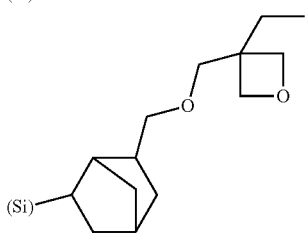
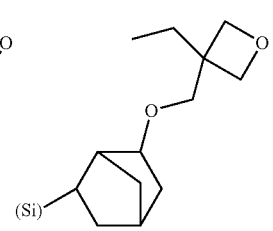
-continued
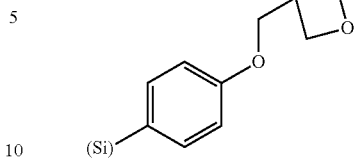
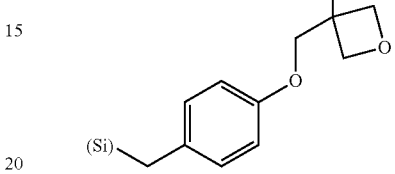
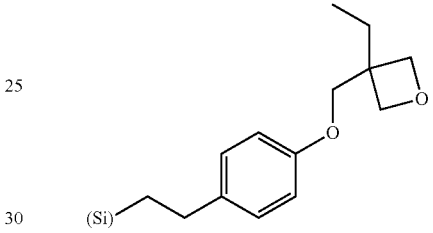
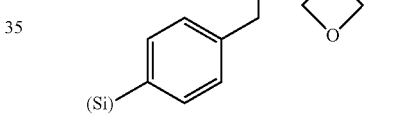
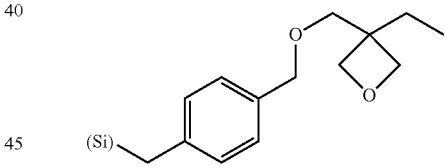
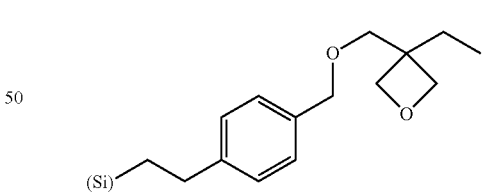
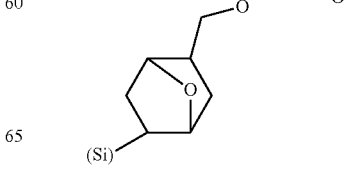

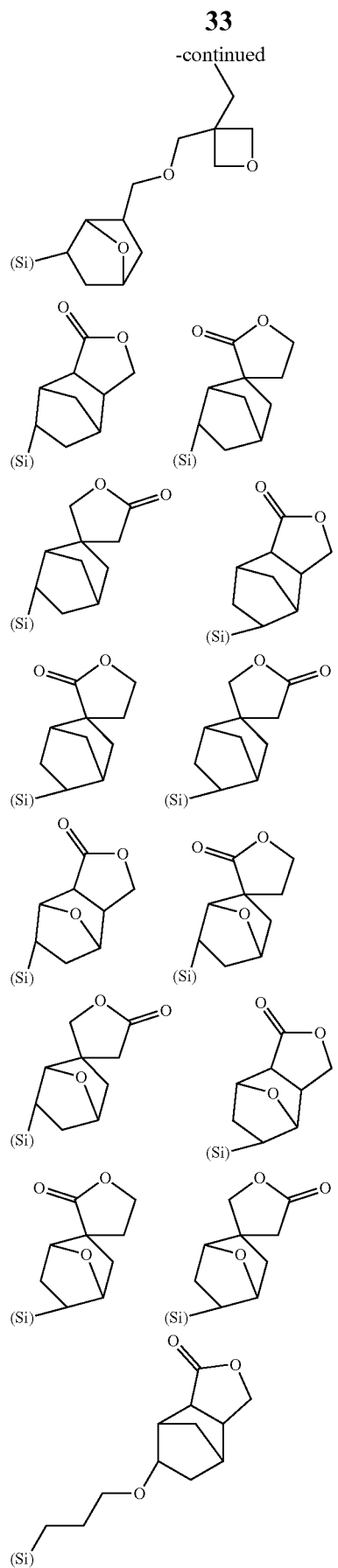
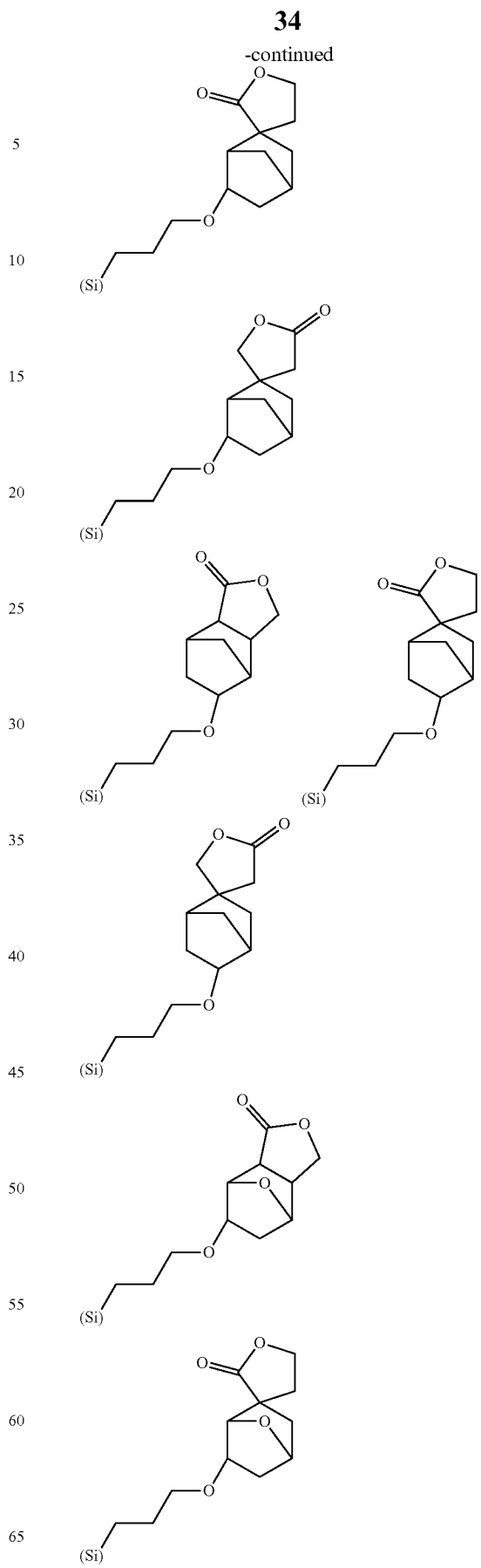

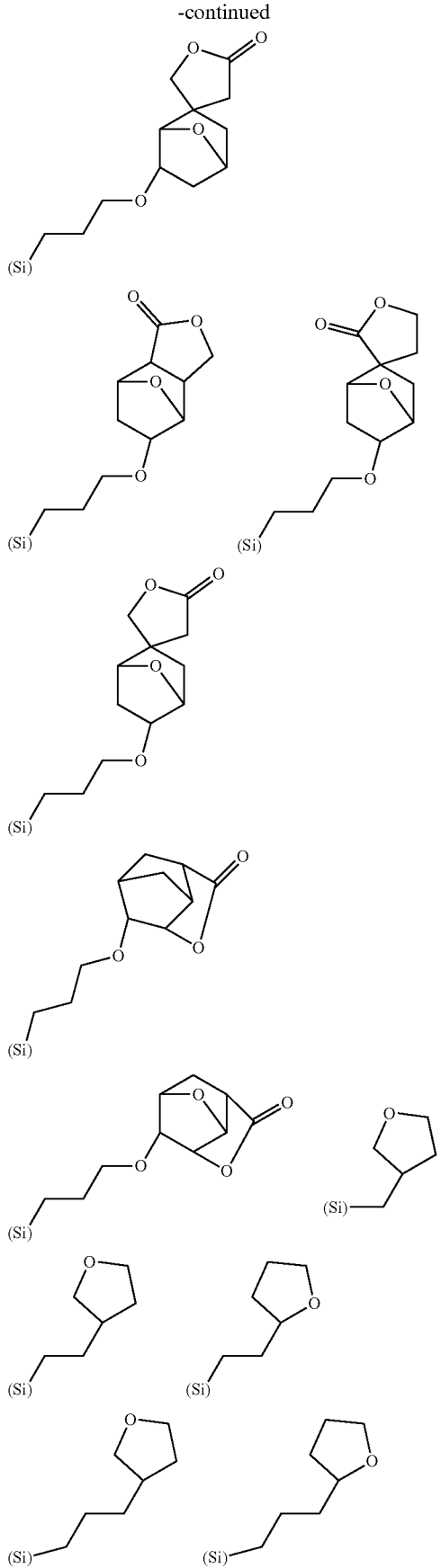
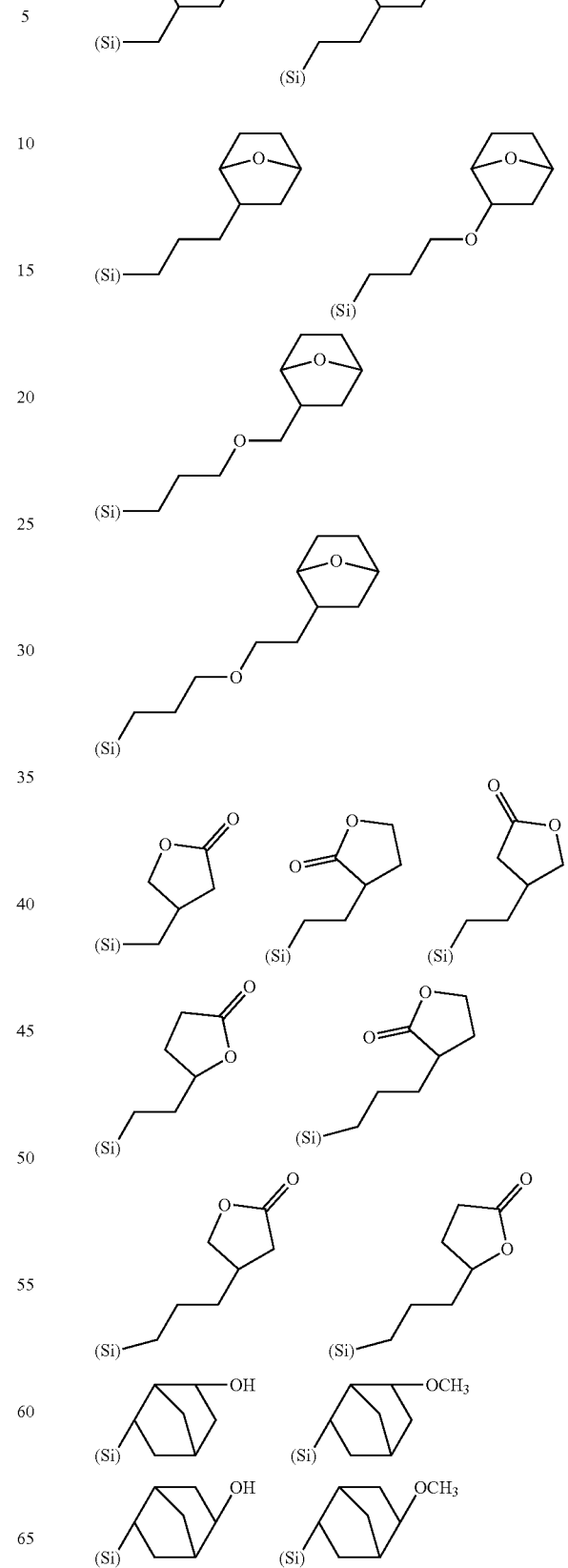

-continued
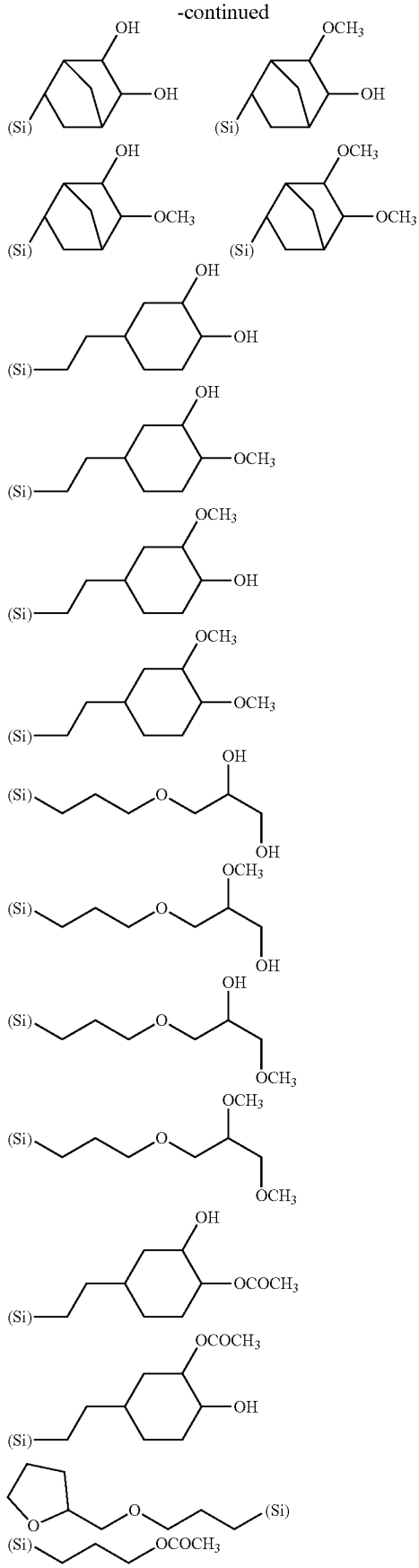
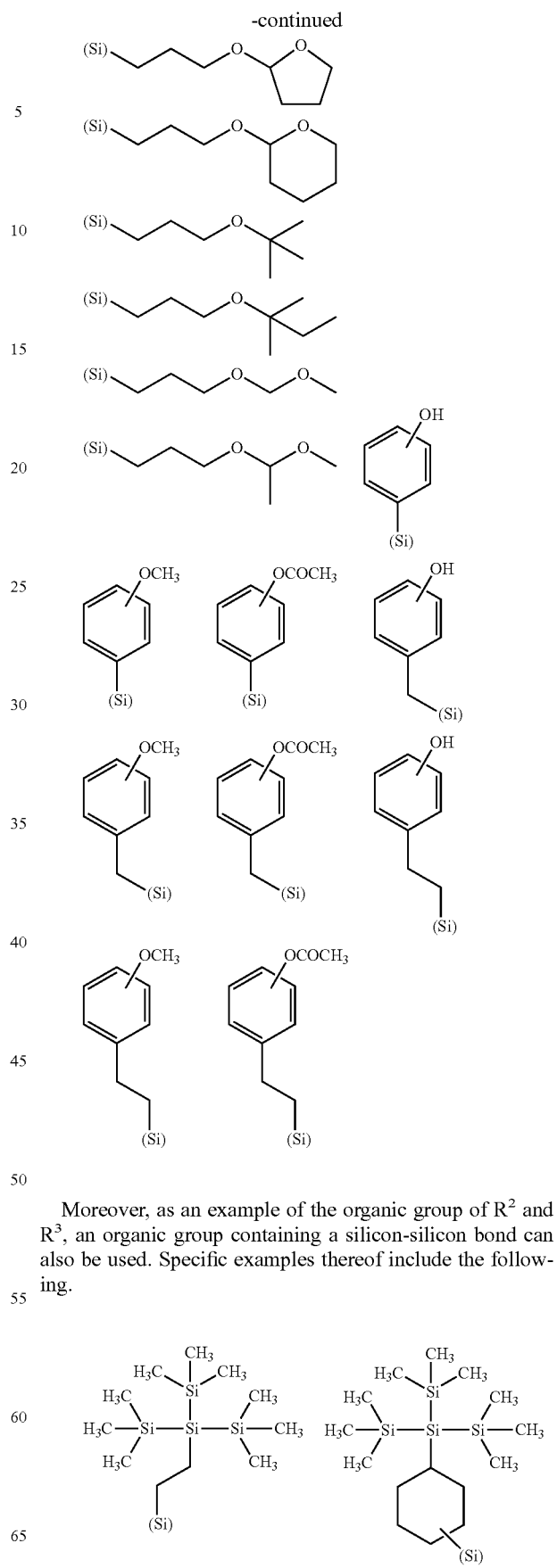
Moreover, as an example of the organic group of $R^2$ and $R^3$, an organic group containing a silicon-silicon bond can also be used. Specific examples thereof include the following.
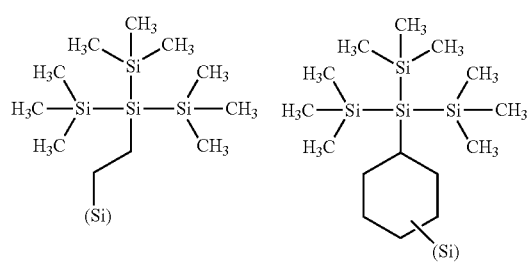

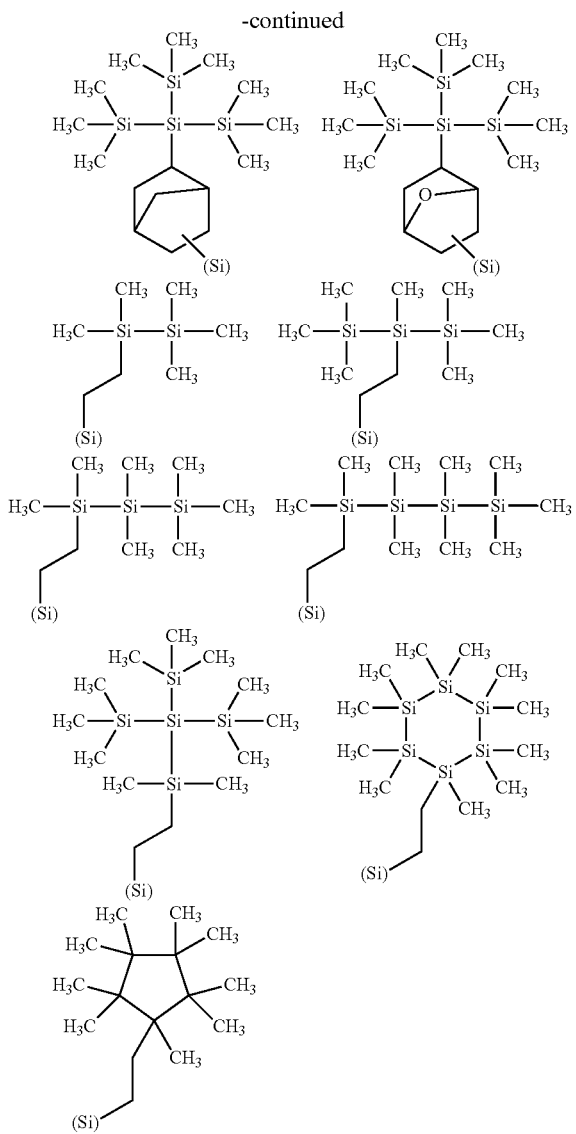

Further, as an example of the organic group of $R^2$ and $R^3$, an organic group having a fluorine atom can also be used. Specific examples thereof include organic groups obtained from silicon compounds shown from paragraphs (0059) to (0065) of Japanese Unexamined Patent Application Publication No. 2012-53253.

In the hydrolysable monomer (Sm), one, two, or three among chlorine, bromine, iodine, an acetoxy group, a methoxy group, an ethoxy group, a propoxy group, a butoxy group, and so forth are bonded as a hydrolysable group(s) on silicon shown by (Si) in the partial structure.

Furthermore, the silicon-containing material (Sx) of the present invention can be produced by hydrolysis condensation of a mixture containing the following hydrolysable monomer(s) (Sm).

Specific examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl) dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, and the like.

Preferable examples of the compound include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, and the like.

[Method for Synthesizing Thermosetting Silicon-Containing Material (Sx)]
(Synthesis Method 1: Acid Catalyst)

The thermosetting silicon-containing material of the present invention (Sx: hereinafter, also referred to as thermosetting polysiloxane) can be produced by hydrolysis condensation of one of the hydrolysable monomers (Sm) or a mixture of two or more kinds thereof (hereinafter, also referred to simply as "monomer") in the presence of an acid catalyst.

Examples of the acid catalyst used in this event include organic acids such as formic acid, acetic acid, oxalic acid, maleic acid, methanesulfonic acid, benzenesulfonic acid, and toluenesulfonic acid; and inorganic acids such as hydrofluoric acid, hydrochloric acid, hydrobromic acid, sulfuric acid, nitric acid, perchloric acid, phosphoric acid. The catalyst can be used in an amount of $1 \times 10^{-6}$ to 10 mol, preferably $1 \times 10^{-5}$ to 5 mol, more preferably $1 \times 10^{-4}$ to 1 mol, relative to 1 mol of the monomer.

When the thermosetting polysiloxane is obtained from these monomers by the hydrolysis condensation, water is preferably added in an amount of 0.01 to 100 mol, more preferably 0.05 to 50 mol, further preferably 0.1 to 30 mol, per mol of the hydrolysable substituent bonded to the monomer. When the amount is 100 mol or less, a device used for the reaction can be made small and economical.

As the operation method, the monomer is added to a catalyst aqueous solution to initiate the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

The organic solvent which can be added to the catalyst aqueous solution or with which the monomer can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, and the like.

Among these solvents, water-soluble solvents are preferable. Examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, and the like. Among these, particularly preferable is one having a boiling point of 100° C. or less.

Note that the organic solvent is used in an amount of preferably 0 to 1,000 ml, particularly preferably 0 to 500 ml, relative to 1 mol of the monomer. When the organic solvent is used in a smaller amount, only a smaller reaction vessel is required and more economical.

Then, if necessary, neutralization reaction of the catalyst is carried out to obtain a reaction mixture aqueous solution. In this event, the amount of an alkaline substance usable for the neutralization is preferably 0.1 to 2 equivalents relative to the acid used as the catalyst. This alkaline substance may be any substance as long as it shows alkalinity in water.

Subsequently, by-products such as alcohol produced by the hydrolysis condensation reaction are preferably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. In this case, it is difficult to accurately know the amount of alcohol to be removed, but it is desirable to remove about 80 mass % or more of the produced alcohol, etc.

Next, the acid catalyst used in the hydrolysis condensation may be removed from the reaction mixture. As a method for removing the acid catalyst, the thermosetting polysiloxane solution is mixed with water, and the thermosetting polysiloxane is extracted with an organic solvent. Preferably, the organic solvent used in this event is capable of dissolving the thermosetting polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, and the like. However, the combination is not limited thereto.

The mixing ratio of the water-soluble organic solvent and the slightly-water-soluble organic solvent is appropriately selected. The amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermosetting polysiloxane may be washed with neutral water. The water which is commonly called deionized water or ultrapure water may be used. The amount of the water may be 0.01 to 100 L, preferably 0.05 to 50 L, more preferably 0.1 to 5 L, relative to 1 L of the thermosetting polysiloxane solution. This washing procedure may be performed by putting both the thermosetting polysiloxane and water into the same container, followed by stirring and then leaving to stand to separate the aqueous layer. The washing may be performed once or more, preferably once to approximately five times because washing ten times or more does not always produce the full washing effects thereof.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-washing operation, a part of the thermosetting polysiloxane escapes into the aqueous layer, so that substantially the same effect as fractionation operation is obtained in some cases. Hence, the number of water-washing operations and the amount of washing water may be appropriately determined in view of the catalyst removal effect and the fractionation effect.

To a solution of either the thermosetting polysiloxane with the acid catalyst still remaining or the thermosetting polysiloxane with the acid catalyst having been removed, a final solvent may be added for solvent exchange under reduced pressure. Thus, a desired thermosetting polysiloxane solution is obtained. The temperature during this solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the thermosetting polysiloxane may become unstable by the solvent exchange. This occurs due to incompatibility of the thermosetting polysiloxane with the final solvent. Thus, in order to prevent this phenomenon, a monohydric, dihydric, or polyhydric alcohol having cyclic ether substituent as shown in paragraphs (0181) to (0182) of JP 2009-126940 A may be added as a stabilizer. The alcohol may be added in an amount of 0 to 25 parts by mass, preferably 0 to 15 parts by mass, more preferably 0 to 5 parts by mass, based on 100 parts by mass of the thermosetting polysiloxane in the solution before the solvent exchange. When the alcohol is added, the amount is preferably 0.5 parts by mass or more. If necessary, the monohydric, dihydric, or polyhydric alcohol having cyclic ether substituent may be added to the solution in advance of the solvent exchange operation, and then the operation is performed.

If the thermosetting polysiloxane is concentrated above a certain concentration level, the condensation reaction may further progress, so that the thermosetting polysiloxane becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the thermosetting polysiloxane solution is preferably an alcohol-based solvent, particularly preferably monoalkyl ether derivatives of ethylene glycol, diethylene glycol, triethylene glycol, propylene glycol, dipropylene glycol, butanediol, and so on. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, and the like.

When these solvents are used as the main component, a non-alcohol-based solvent can also be added as an adjuvant solvent. Examples of the adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

As an alternative reaction operation using an acid catalyst, water or a water-containing organic solvent is added to the monomer or an organic solution of the monomer to initiate the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for aging.

When the organic solvent is used, a water-soluble solvent is preferable. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The organic solvent is used in an amount of preferably 0 to 1,000 ml, particularly preferably 0 to 500 ml, relative to 1 mol of the monomer. When the organic solvent is used in a small amount, only a small reaction vessel is required and economical. The obtained reaction mixture may be subjected to post-treatment by the same procedure as mentioned above to obtain a thermosetting polysiloxane.

(Synthesis Method 2: Alkali Catalyst)

Alternatively, the thermosetting silicon-containing material (Sx: thermosetting polysiloxane) can be produced by hydrolysis condensation of one of the hydrolysable monomers (Sm) or a mixture of two or more kinds thereof in the presence of an alkali catalyst. Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, and the like. The catalyst can be used in an amount of $1 \times 10^{-6}$ mol to 10 mol, preferably $1 \times 10^{-5}$ mol to 5 mol, more preferably $1 \times 10^{-4}$ mol to 1 mol, relative to 1 mol of the silicon monomer.

When the thermosetting polysiloxane is obtained from the monomer by the hydrolysis condensation, water is preferably added in an amount of 0.1 to 50 mol per mol of the hydrolysable substituent bonded to the monomer. When the amount is 50 mol or less, a reaction device can be made small and economical.

As the operation method, the monomer is added to a catalyst aqueous solution to initiate the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

As the organic solvent which can be added to the alkali catalyst aqueous solution or with which the monomer can be diluted, the same organic solvents exemplified as the organic solvents which can be added to the acid catalyst aqueous solution are preferably used. Note that the organic solvent is used in an amount of preferably 0 to 1,000 ml relative to 1 mol of the monomer because the reaction can be performed economically.

Then, if necessary, neutralization reaction of the catalyst is carried out to obtain a reaction mixture aqueous solution.

In this event, the amount of an acidic substance usable for the neutralization is preferably 0.1 to 2 equivalents relative to the alkaline substance used as the catalyst. This acidic substance may be any substance as long as it shows acidity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In this case, it is difficult to accurately know the amount of alcohol to be removed, but it is desirable to remove about 80 mass % or more of the produced alcohol.

Next, to remove the catalyst used in the hydrolysis condensation, the thermosetting polysiloxane may be extracted with an organic solvent. Preferably, the organic solvent used in this event is capable of dissolving the thermosetting polysiloxane and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Next, to remove the alkali catalyst used in the hydrolysis condensation, the thermosetting polysiloxane may be extracted with an organic solvent. Preferably, the organic solvent used in this event is capable of dissolving the thermosetting polysiloxane and achieves two-layer separation when mixed with water. Further, a mixture of a water-soluble organic solvent and a slightly-water-soluble organic solvent can also be used.

As concrete examples of the organic solvent used for removing the alkali catalyst, it is possible to use the aforementioned organic solvents specifically exemplified for the acid catalyst removal or the same mixtures of the water-soluble organic solvent and the slightly-water-soluble organic solvent.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the thermosetting polysiloxane may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the thermosetting polysiloxane solution. This washing procedure may be performed by putting both the thermosetting polysiloxane and water into the same container, followed by stirring and then leaving to stand to separate the aqueous layer. The washing may be performed once or more, preferably once to approximately five times because washing ten times or more does not always produce the full washing effects thereof.

To the washed thermosetting polysiloxane solution, a final solvent may be added for solvent exchange under reduced pressure. Thus, a desired thermosetting polysiloxane solution is obtained. The temperature during this solvent exchange is preferably 0 to 100° C., more preferably 10 to 90° C., further preferably 15 to 80° C., depending on the kind of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the thermosetting polysiloxane solution is preferably an alcohol-based solvent, particularly preferably a monoalkyl ether of ethylene glycol, diethylene glycol, triethylene glycol, etc. and a monoalkyl ether of propylene glycol, dipropylene glycol, etc. Specifically, preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, diacetone alcohol, and the like.

As an alternative reaction operation using an alkali catalyst, water or a water-containing organic solvent is added to the monomer or an organic solution of the monomer to initiate the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

The organic solvent usable for the organic solution of the monomer or the water-containing organic solvent is preferably a water-soluble solvent. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The molecular weight of the thermosetting polysiloxane obtained by the above synthesis method 1 or 2 can be adjusted not only through the selection of the monomer but also by controlling the reaction conditions during the polymerization, and it is preferable to use the thermosetting polysiloxane having a weight average molecular weight (Mw) of 100,000 or less, more preferably 200 to 50,000, further preferably 300 to 30,000. When a thermosetting polysiloxane has a weight average molecular weight of 100,000 or less, generation of foreign matters and coating spots do not occur.

Regarding data on the weight average molecular weight, the molecular weight is expressed in terms of polystyrene which is obtained by gel-permeation chromatography (GPC) using a refractive index (RI) detector, tetrahydrofuran as an eluent, and polystyrene as a reference substance.

Properties of the thermosetting polysiloxane used in the present invention vary depending on the kind of the acid or alkali catalyst used in the hydrolysis condensation and the reaction conditions. Thus, the catalyst and the reaction conditions can be appropriately selected in accordance with the characteristics of a resist underlayer film to be achieved.

Furthermore, a polysiloxane derivative produced from a mixture of these monomers with a hydrolysable metal compound shown by the following general formula (Mm) under the conditions using the acid or alkali catalyst can be used as a component of a composition for forming a resist underlayer film.

$$U(OR^7)_{m7}(OR^8)_{m8} \quad (Mm)$$

In the formula, $R^7$ and $R^8$ each represent an organic group having 1 to 30 carbon atoms; m7+m8 represents the same number as a valence determined by the kind of U; m7 and m8 each represent an integer of 0 or more; and U represents an element belonging to the group III, IV, or V in the periodic table, except for carbon and silicon.

Examples of the hydrolysable metal compound (Mm) used in this event include the following.

When U is boron, examples of the compound shown by the general formula (Mm) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, and the like.

When U is aluminum, examples of the compound shown by the general formula (Mm) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxy(ethyl acetoacetate), aluminum dibutoxy(ethyl acetoacetate), aluminum propoxy bis(ethyl acetoacetate), aluminum butoxy bis(ethyl acetoacetate), aluminum 2,4-pentanedionate, aluminum 2,2,6,6-tetramethyl-3,5-heptanedionate, and the like.

When U is gallium, examples of the compound shown by the general formula (Mm) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxy(ethyl acetoacetate), gallium dibutoxy(ethyl acetoacetate), gallium propoxy bis (ethyl acetoacetate), gallium butoxy bis(ethyl acetoacetate), gallium 2,4-pentanedionate, gallium 2,2,6,6-tetramethyl-3,5-heptanedionate, and the like.

When U is yttrium, examples of the compound shown by the general formula (Mm) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxy(ethyl acetoacetate), yttrium dibutoxy(ethyl acetoacetate), yttrium propoxy bis (ethyl acetoacetate), yttrium butoxy bis(ethyl acetoacetate), yttrium 2,4-pentanedionate, yttrium 2,2,6,6-tetramethyl-3,5-heptanedionate, and the like.

When U is germanium, examples of the compound shown by the general formula (Mm) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, and the like.

When U is titanium, examples of the compound shown by the general formula (Mm) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis(ethyl acetoacetate), titanium dipropoxy bis(2,4-pentanedionate), titanium dibutoxy bis(2,4-pentanedionate), and the like.

When U is hafnium, examples of the compound shown by the general formula (Mm) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bis(ethyl acetoacetate), hafnium dibutoxy bis(ethyl acetoacetate), hafnium dipropoxy bis(2,4-pentanedionate), hafnium dibutoxy bis(2,4-pentanedionate), and the like.

When U is tin, examples of the compound shown by the general formula (Mm) include, as monomers, methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like.

When U is arsenic, examples of the compound shown by the general formula (Mm) include, as monomers, methoxy arsenic, ethoxy arsenic, propoxy arsenic, butoxy arsenic, phenoxy arsenic, and the like.

When U is antimony, examples of the compound shown by the general formula (Mm) include, as monomers, methoxy antimony, ethoxy antimony, propoxy antimony, butoxy antimony, phenoxy antimony, antimony acetate, antimony propionate, and the like.

When U is niobium, examples of the compound shown by the general formula (Mm) include, as monomers, methoxy niobium, ethoxy niobium, propoxy niobium, butoxy niobium, phenoxy niobium, and the like.

When U is tantalum, examples of the compound shown by the general formula (Mm) include, as monomers, methoxy tantalum, ethoxy tantalum, propoxy tantalum, butoxy tantalum, phenoxy tantalum, and the like.

When U is bismuth, examples of the compound shown by the general formula (Mm) include, as monomers, methoxy bismuth, ethoxy bismuth, propoxy bismuth, butoxy bismuth, phenoxy bismuth, and the like.

When U is phosphorus, examples of the compound shown by the general formula (Mm) include, as monomers, trimethyl phosphate, triethyl phosphate, tripropyl phosphate, trimethyl phosphite, triethyl phosphite, tripropyl phosphite, diphosphorous pentaoxide, and the like.

When U is vanadium, examples of the compound shown by the general formula (Mm) include, as monomers, vanadium oxide bis(2,4-pentanedionate), vanadium 2,4-pentanedionate, vanadium tributoxide oxide, vanadium tripropoxide oxide, and the like.

When U is zirconium, examples of the compound shown by the general formula (Mm) include, as monomers, methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), and the like.

[Betaine-Type Compound]

The inventive composition for forming a silicon-containing resist underlayer film contains a betaine-type compound (acid generator), which has a cation moiety and a anion moiety in a molecule, shown by the following general formula (P-0) in addition to the thermosetting silicon-containing material (Sx). Note that hereinafter, the compound is also referred to as a photo-acid generator.

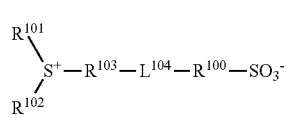
(P-0)

where in the formula (P-0), $R^{100}$ represents a divalent organic group substituted with one or more fluorine atoms, $R^{101}$ and $R^{102}$ each independently represents a linear, branched, or cyclic monovalent hydrocarbon group having 1 to 20 carbon atoms optionally substituted with a hetero atom or optionally interposed by a hetero atom; $R^{103}$ represents a linear, branched, or cyclic divalent hydrocarbon group having 1 to 20 carbon atoms optionally substituted with a hetero atom or optionally interposed by a hetero atom; $R^{101}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms optionally substituted with a hetero atom or optionally interposed by a hetero atom.

In the general formula (P-0), $R^{100}$ may be a linear, branched, or cyclic divalent hydrocarbon group such as an alkylene group, an alkenylene group, and an arylene group having 1 to 20 carbon atoms substituted with one or more fluorine atoms.

Specific examples of $R^{100}$ include the following. Note that in the following formulae, parts of the general formula (P-0) other than $R^{100}$ and "$SO_3^-$" will be expressed as $R^{200}$ for convenience.

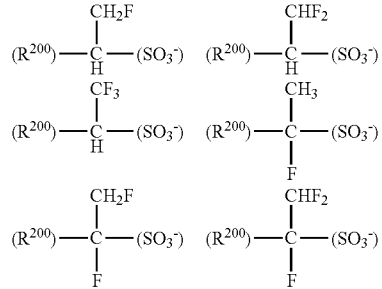

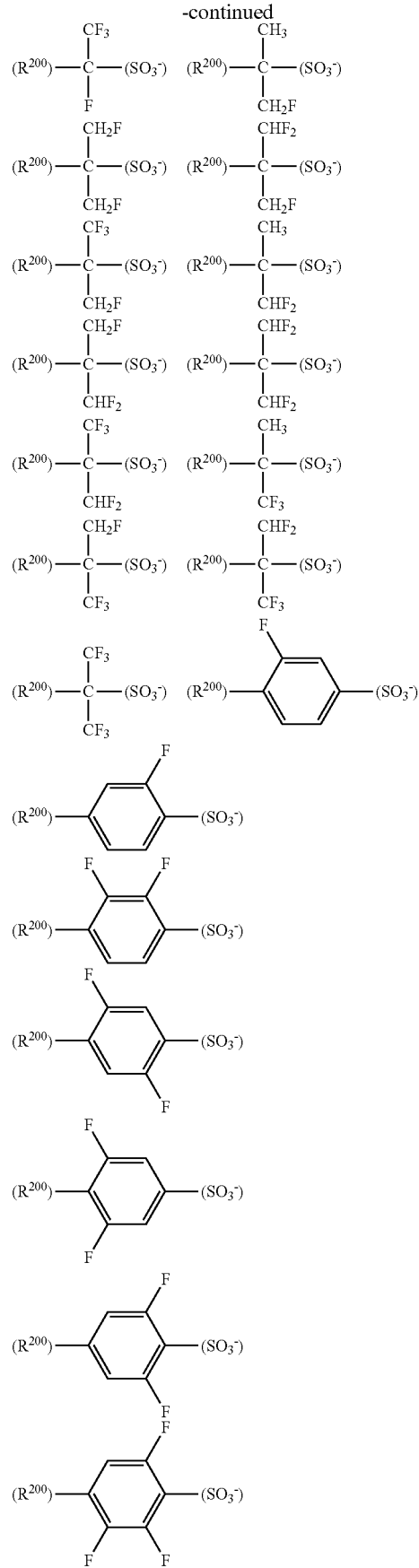

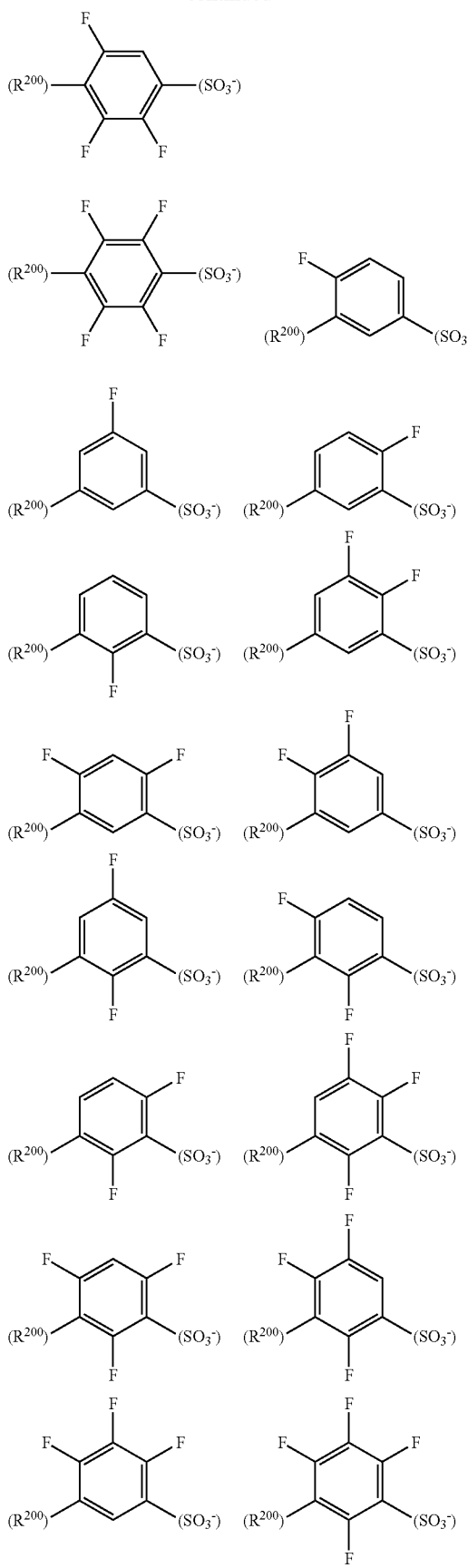

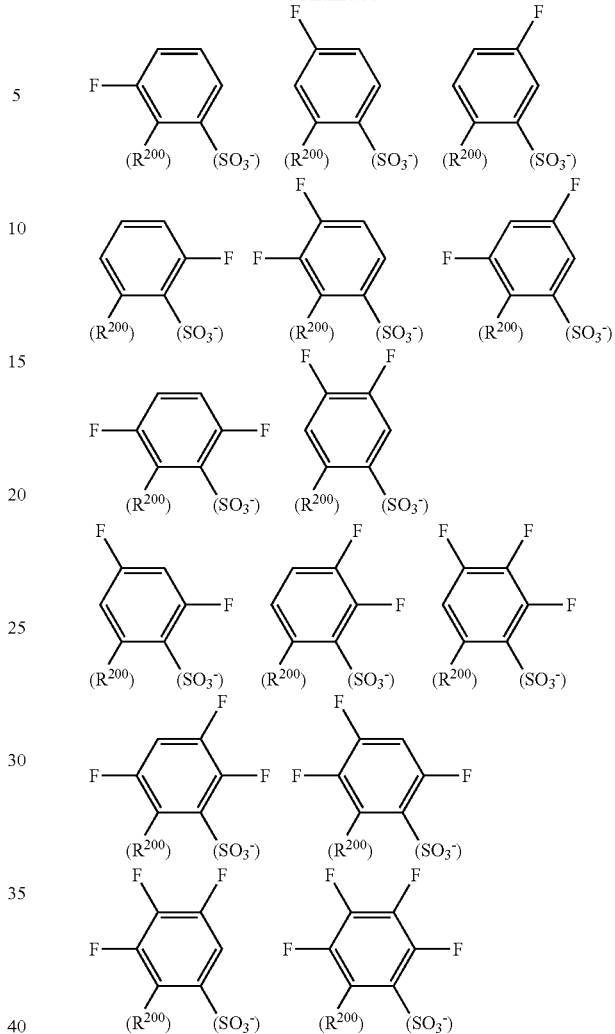

R[101] and R[102] each independently represents a linear, branched, or cyclic monovalent hydrocarbon group such as an alkyl group, an alkenyl group, an aryl group, and an aralkyl group having 1 to 20 carbon atoms optionally substituted with a hetero atom or optionally interposed by a hetero atom. As specific R[101] and R[102], examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, a thienyl group, and the like; a 4-hydroxyphenyl group; alkoxyphenyl groups such as a 4-methoxyphenyl group, a 3-methoxyphenyl group, a 2-methoxyphenyl group, a 4-ethoxyphenyl group, a 4-tertbutoxyphenyl group, and a 3-tert-butoxyphenyl group; alkylphenyl groups such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group; alkylnaphthyl groups such as a methylnaphthyl group and an ethylnaphthyl group; alkoxynaphthyl groups such as a methoxynaphthyl group, an ethoxynaphthyl group, an n-propoxynaphthyl group, and an n-butoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a 1-phenylethyl group, a 2-phenylethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

Additionally, $R^{101}$ and $R^{102}$ may be bonded to each other to form a ring together with the sulfur atom in the formula; in this case, examples of the ring include groups shown by the following formulae.

an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of the hydrogen atoms of these groups may be substituted with an alkyl group such as a methyl group, an ethyl group, a propyl group, an n-butyl group, and a tert-butyl group. Alternatively, some of these groups may be partly substituted with a hetero-atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed.

Further, $R^{101}$ and $R^{103}$ may be bonded to each other to form a ring together with the sulfur atom in the formula; in this case, examples of the ring include groups shown by the following formulae.

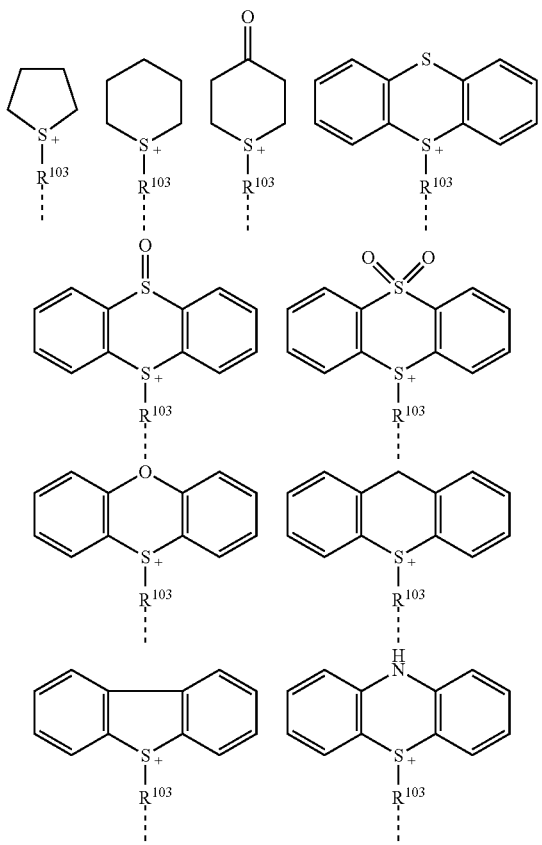

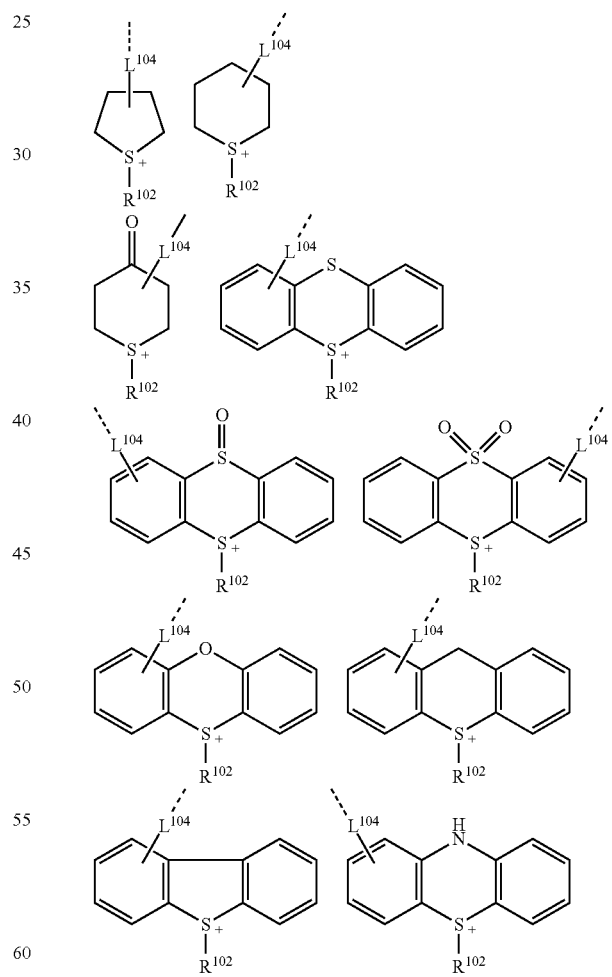

(a dotted line represents a bond)

In the general formula (P-0), $R^{103}$ represents a linear, branched, or cyclic divalent hydrocarbon group having 1 to 20 carbon atoms optionally substituted with a hetero-atom or optionally interposed by a hetero-atom. Specific examples of $R^{103}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, (a dotted line represents a bond)

In the general formula (P-0), $L^{104}$ represents a single bond or a linear, branched, or cyclic divalent hydrocarbon group having 1 to 20 carbon atoms optionally substituted with a hetero-atom or optionally interposed by a hetero-atom. Specific examples of $L^{104}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of the hydrogen atoms of these groups may be substituted with an alkyl group such as a methyl group, an ethyl group, a propyl group, an n-butyl group, and a tert-butyl group. Alternatively, some of these groups may be partly substituted with a hetero-atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed.

The compound (photo-acid generator) shown by the general formula (P-0) is preferably shown by the following general formula (P-1).

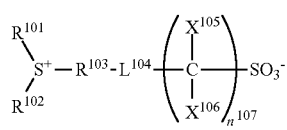

(P-1)

In the general formula (P-1), $X^{105}$ and $X^{106}$ each independently represent any of a hydrogen atom, a fluorine atom, and a trifluoromethyl group. $n^{107}$ represents an integer of 1 to 4.

The photo-acid generator shown by the general formula (P-0) or (P-1) is more preferably shown by the following general formula (P-1-1).

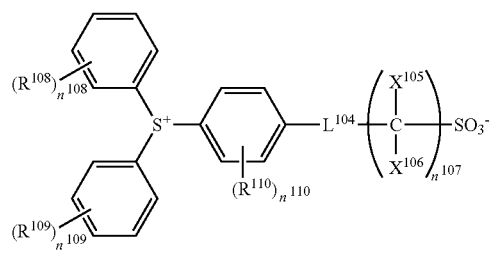

(P-1-1)

In the general formula (P-1-1), $R^{108}$, $R^{109}$ and $R^{110}$ each independently represent a hydrogen atom or a linear, branched, or cyclic monovalent hydrocarbon group having 1 to 20 carbon atoms optionally interposed by a hetero-atom. Specific examples of the monovalent hydrocarbon group include a methyl group, an ethyl group, a propyl group, an isopropyl group, an n-butyl group, a sec-butyl group, a tert-butyl group, a tert-amyl group, an n-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo[5.2.1.0$^{2,6}$]decanyl group, an adamantyl group, and the like. Additionally, some of hydrogen atoms of these groups may be substituted with a hetero-atom such as an oxygen atom, a sulfur atom, a nitrogen atom, and a halogen atom. Alternatively, the monovalent hydrocarbon group may be interposed by a hetero-atom such as an oxygen atom, a sulfur atom, and a nitrogen atom. As a result, the monovalent hydrocarbon group may be formed to have or interposed by a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like. The monovalent hydrocarbon group is preferably a methyl group, a methoxy group, a tert-butyl group, or a tert-butoxy group.

In the general formula (P-1-1), $n^{108}$ and $n^{109}$ each represent an integer of 0 to 5, preferably 0 or 1. $n^{110}$ represents an integer of 0 to 4, preferably 0 or 2. $L^{104}$, $X^{105}$, $X^{106}$, and $n^{107}$ are as have been described in detail above.

The photo-acid generator shown by the general formula (P-0), (P-1), or (P-1-1) is further preferably shown by the following general formula (P-1-2).

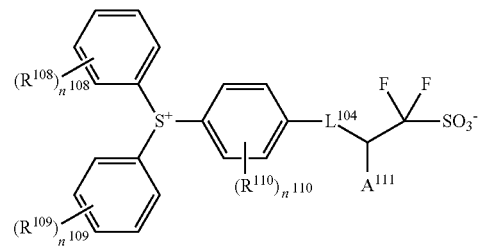

(P-1-2)

In the general formula (P-1-2), $A^{111}$ represents a hydrogen atom or a trifluoromethyl group. $R^{108}$, $R^{109}$, $R^{110}$, $n^{108}$, $n^{109}$, $n^{110}$, and $L^{104}$ are as have been described in detail above.

More specific examples of the photo-acid generators shown by the general formulae (P-0), (P-1), (P-1-1), and (P-1-2) include ones with structures shown below. However, the present invention is not limited thereto.

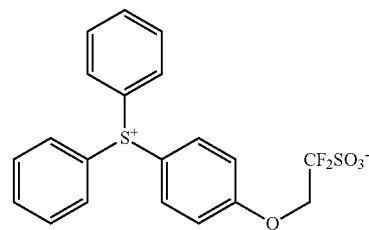

59
-continued
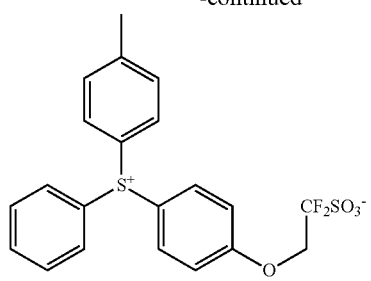
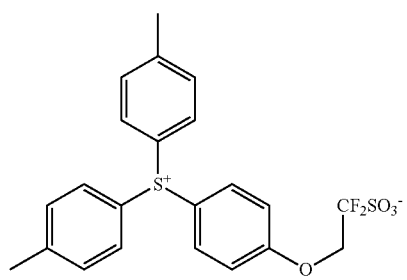
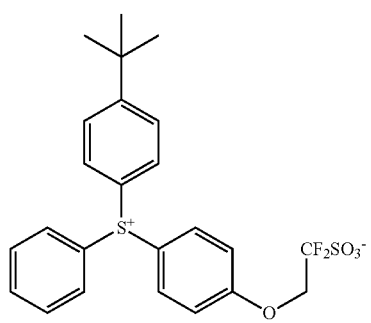
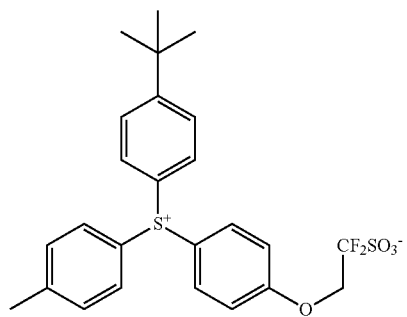
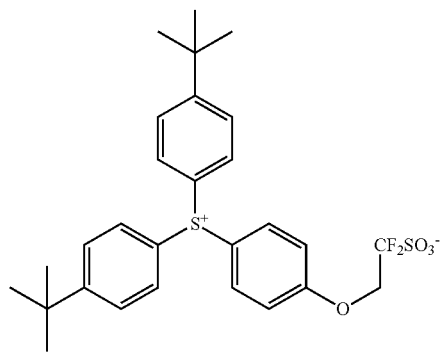
60
-continued
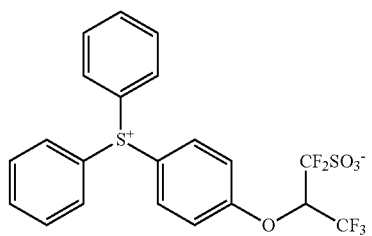
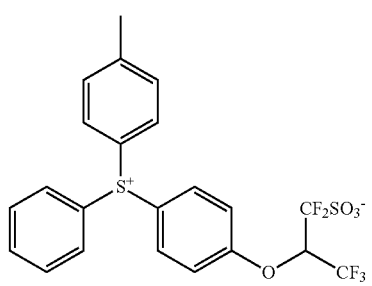
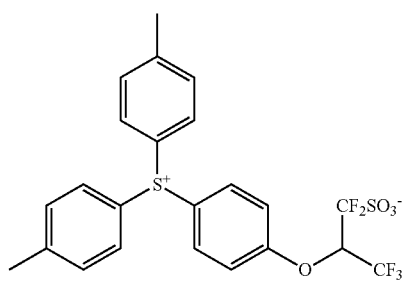
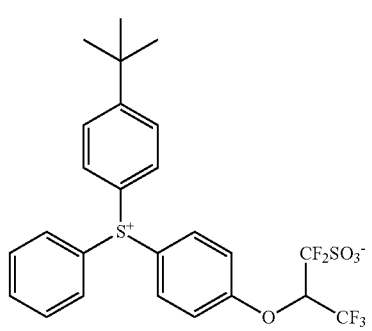
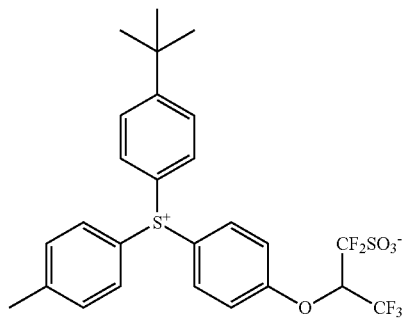

-continued
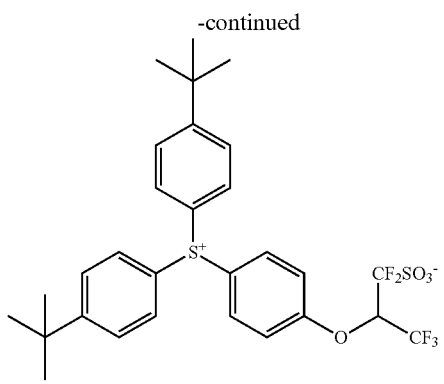
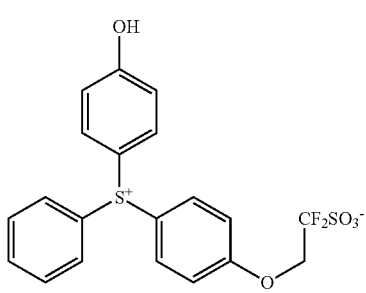
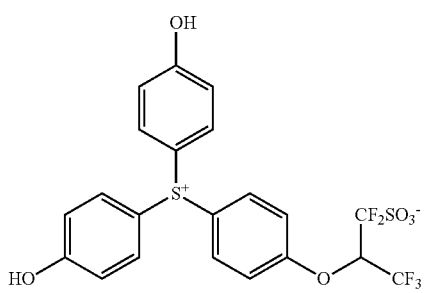
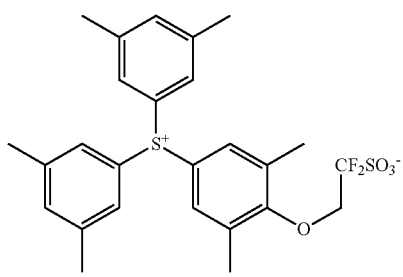
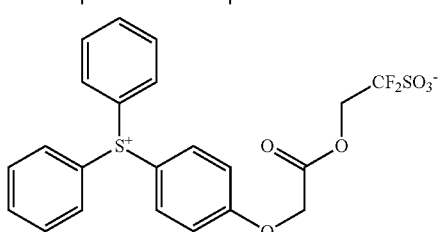
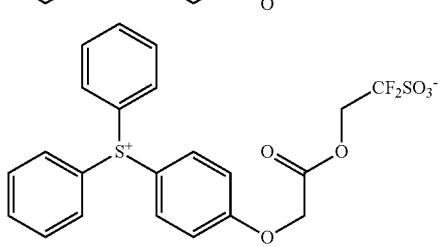
-continued
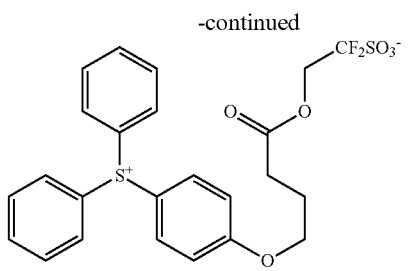
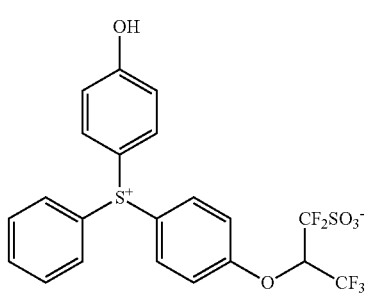
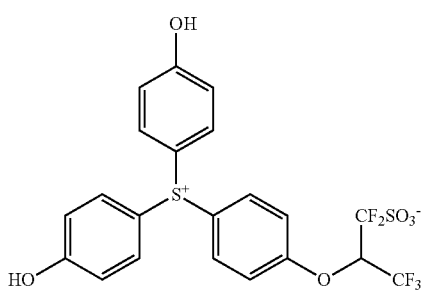
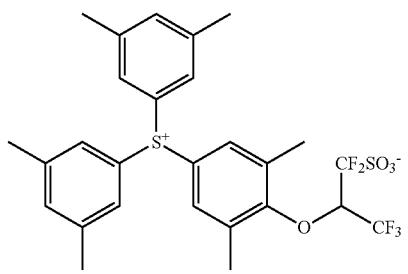
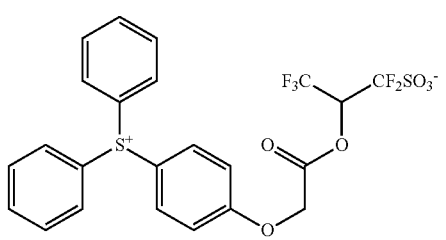
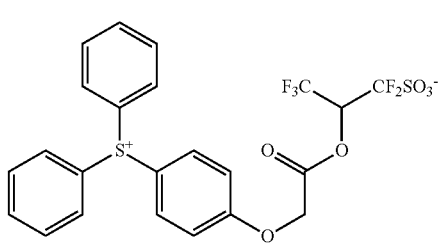

63
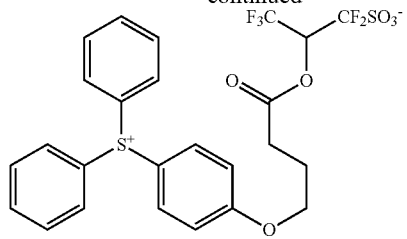
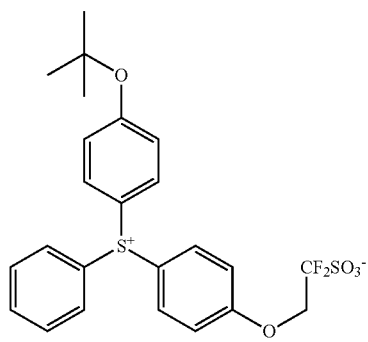
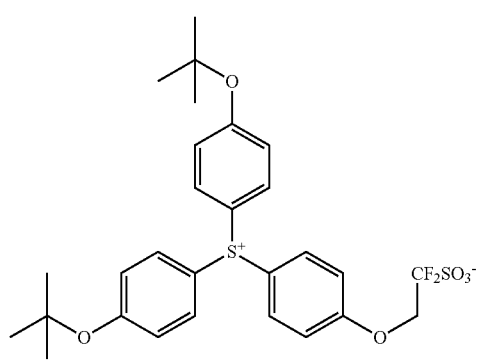
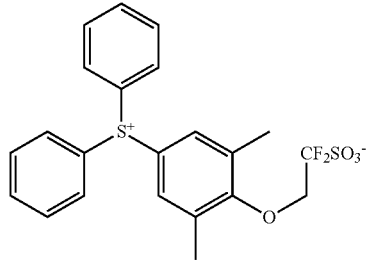
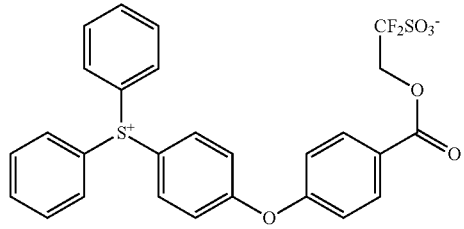
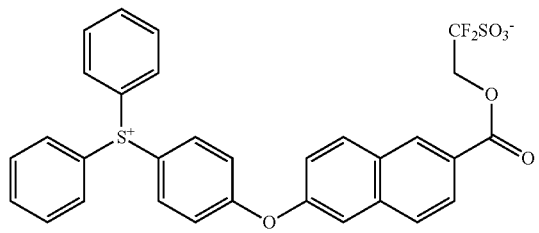
64
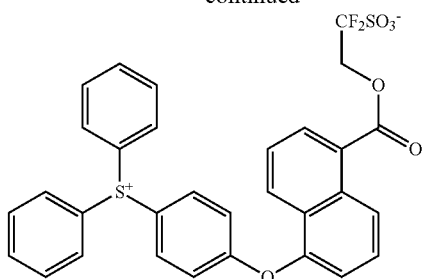
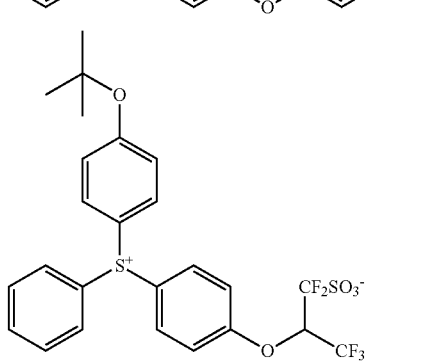
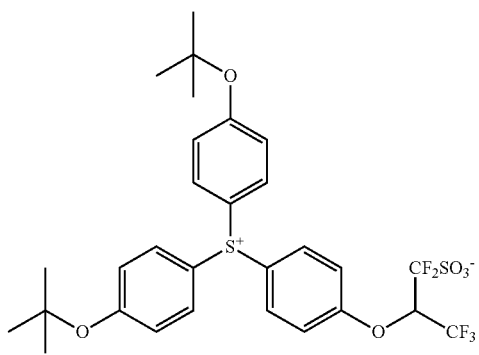
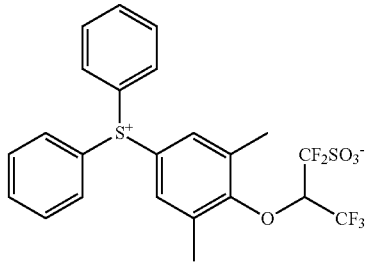
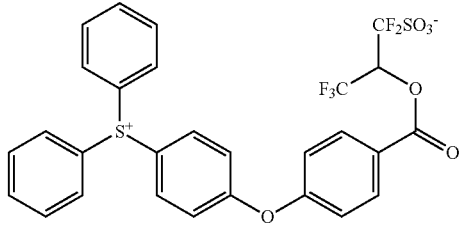
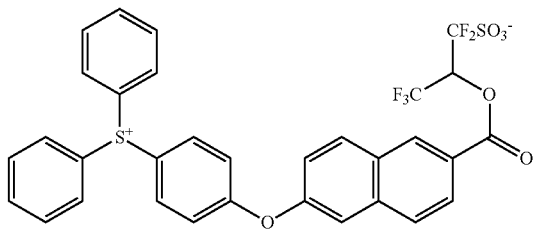

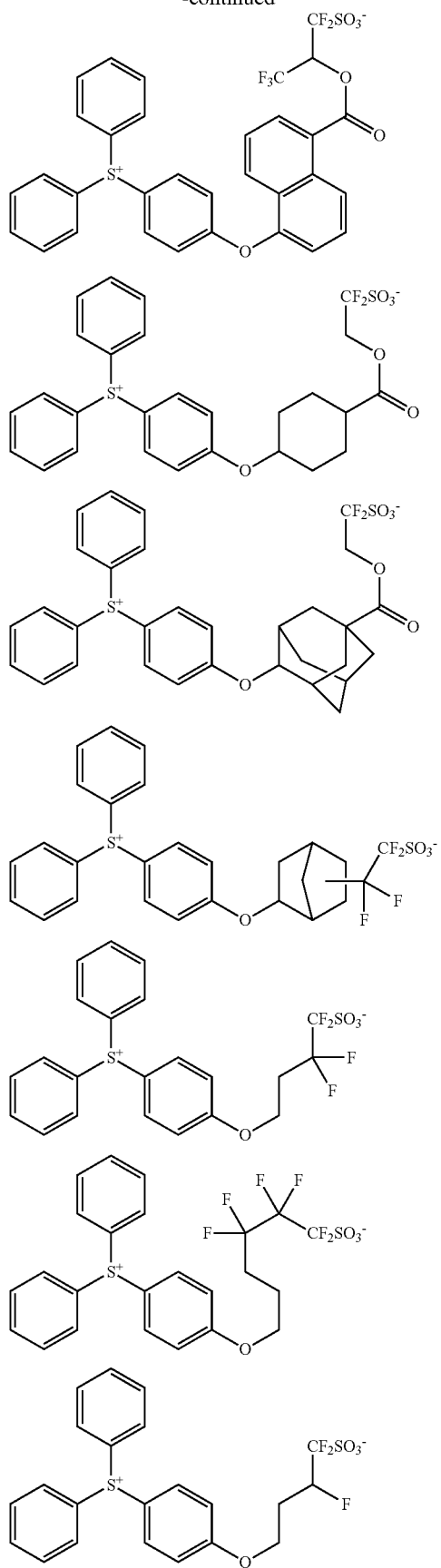
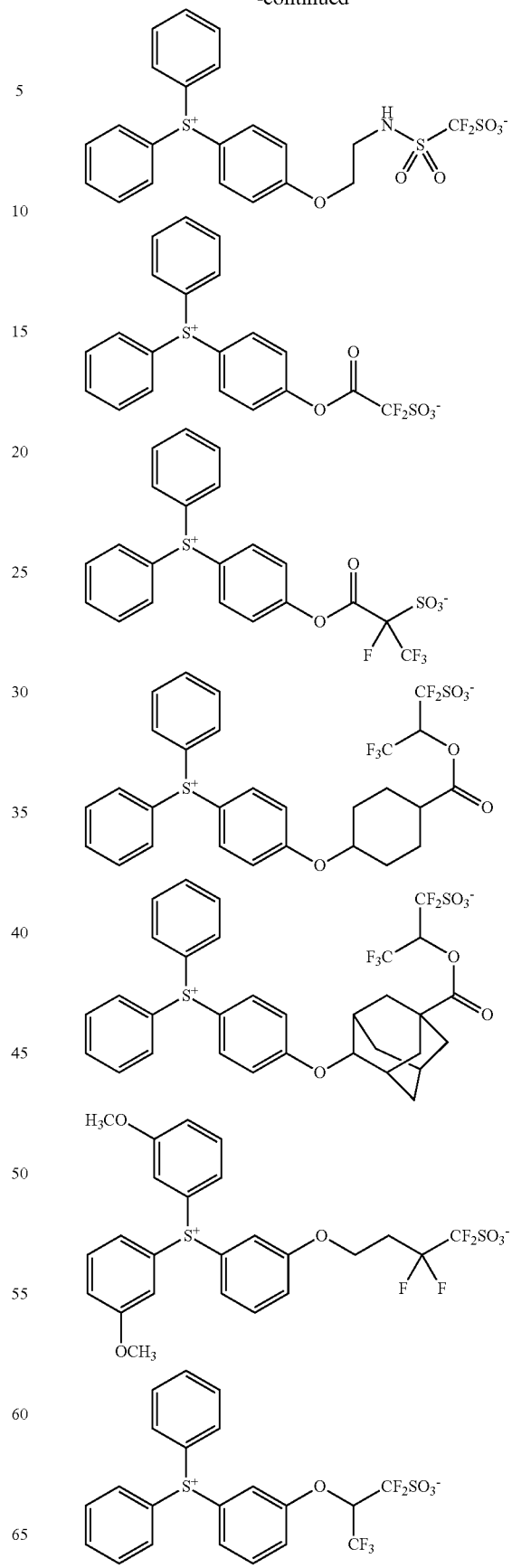

67
-continued
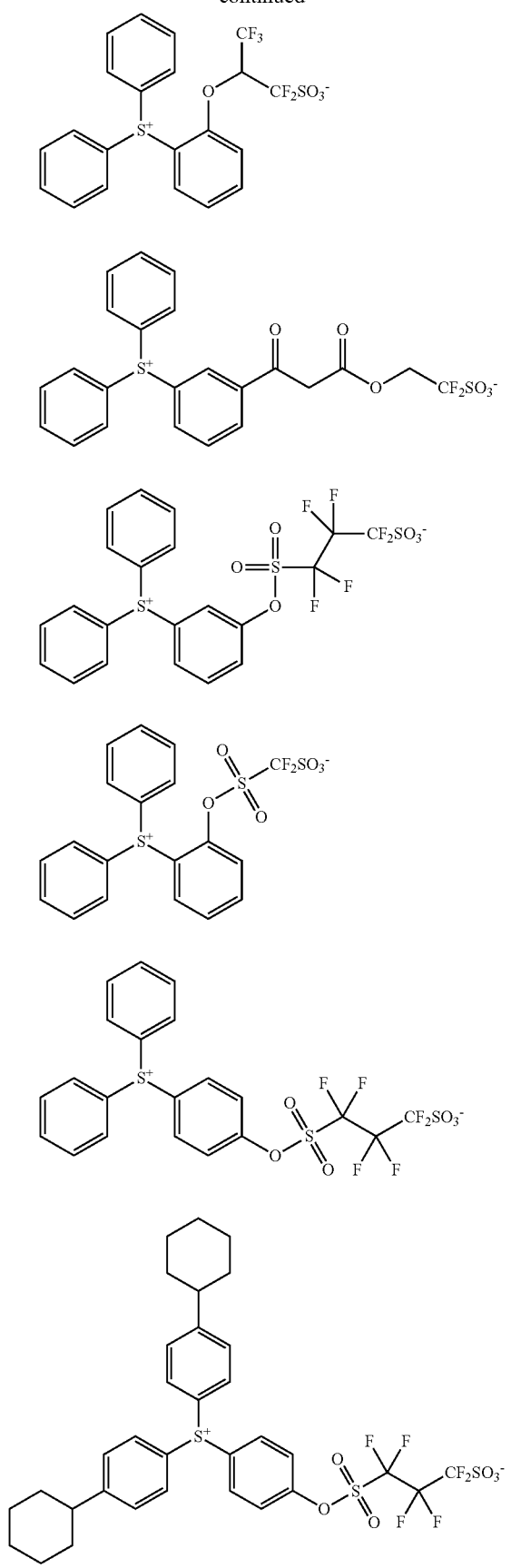
68
-continued
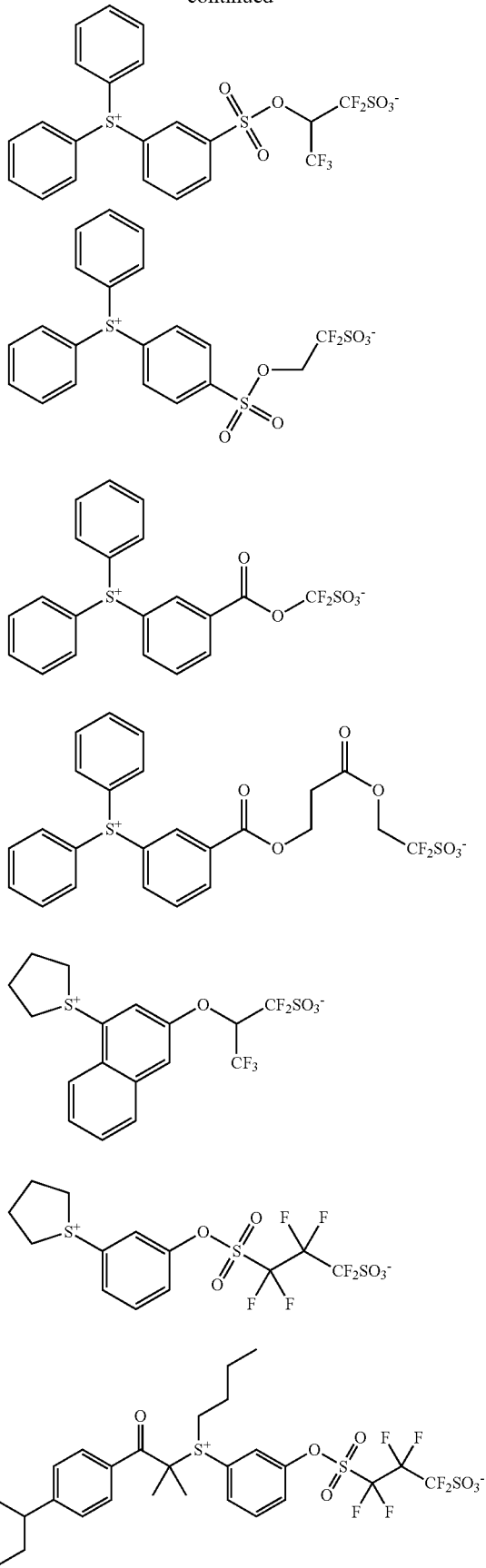

69
-continued
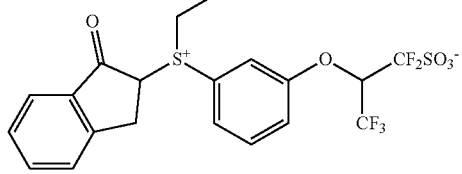
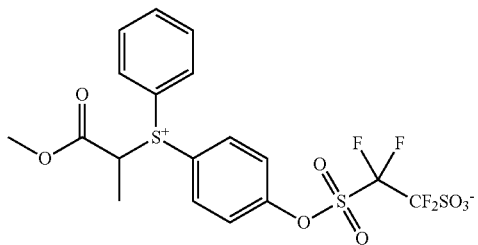
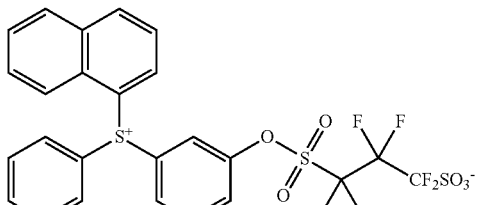
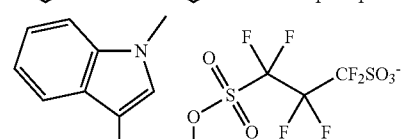
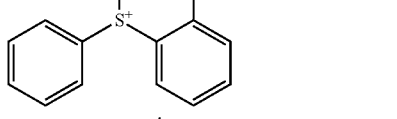
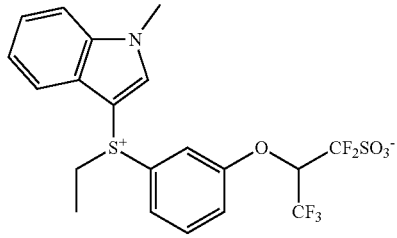
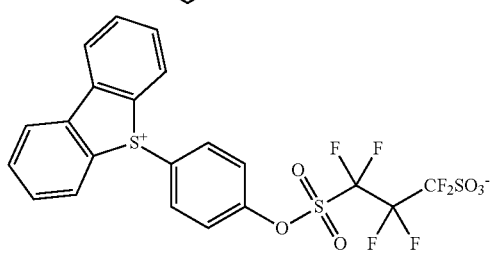
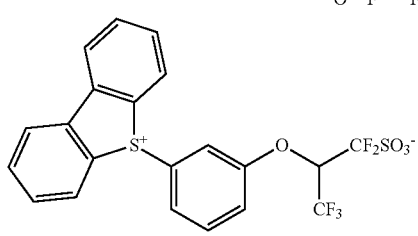
70
-continued
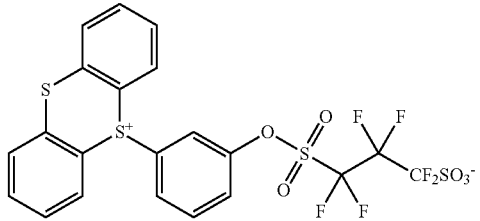
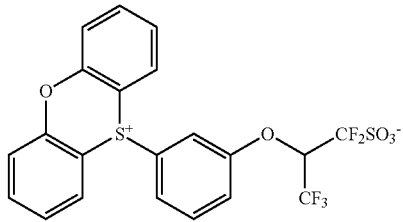
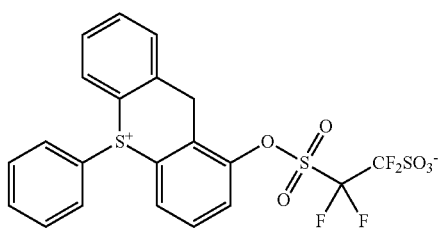
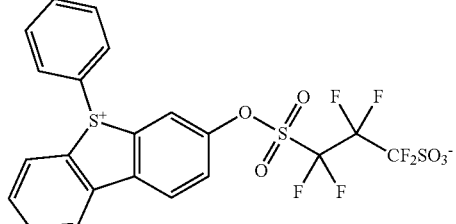
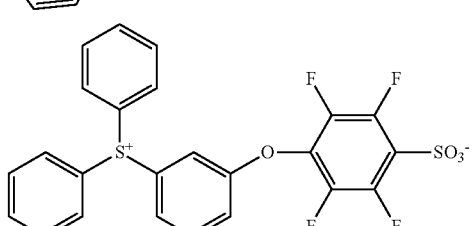
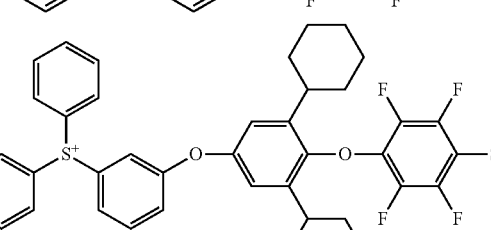
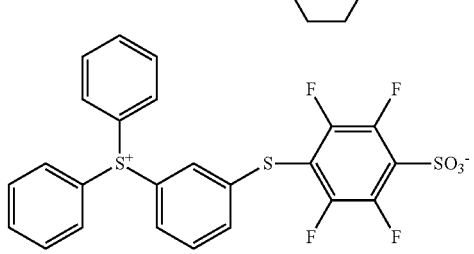

71
-continued
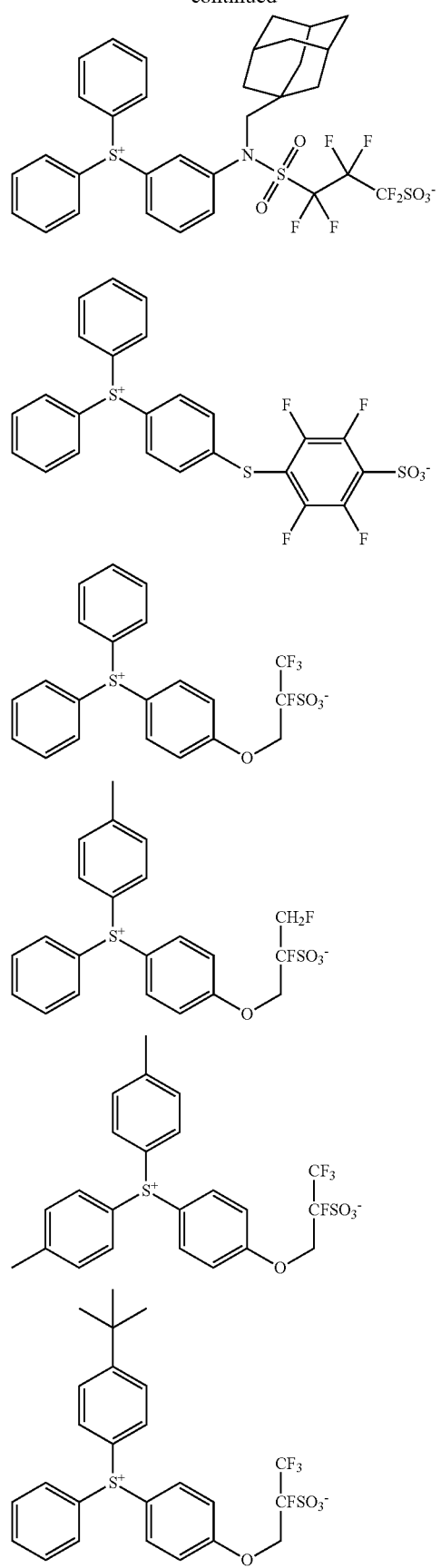
72
-continued
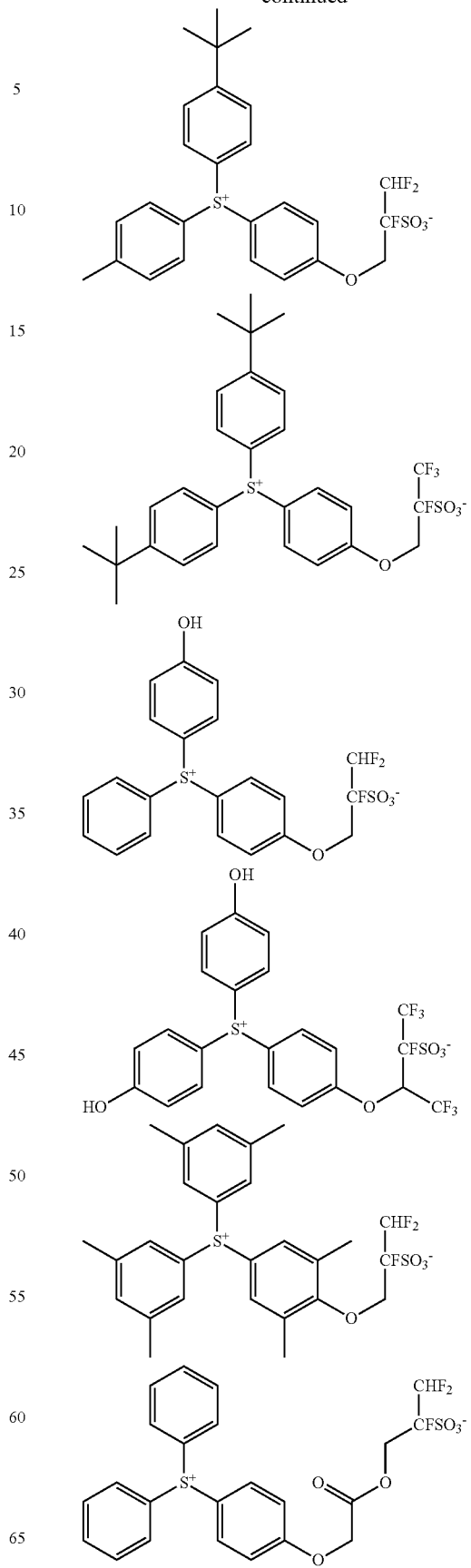

-continued
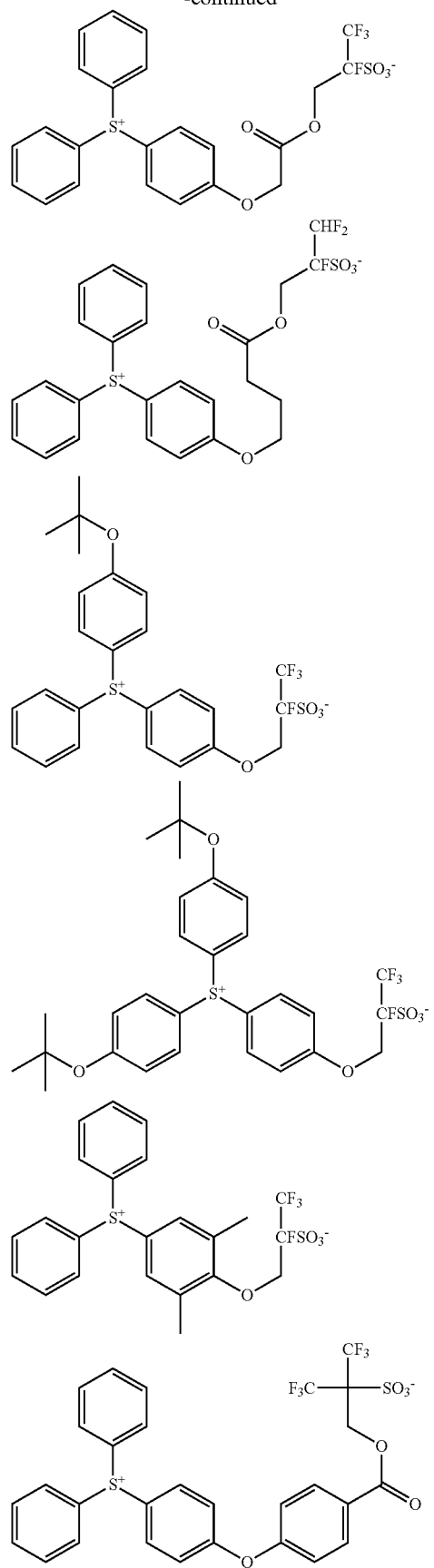
-continued
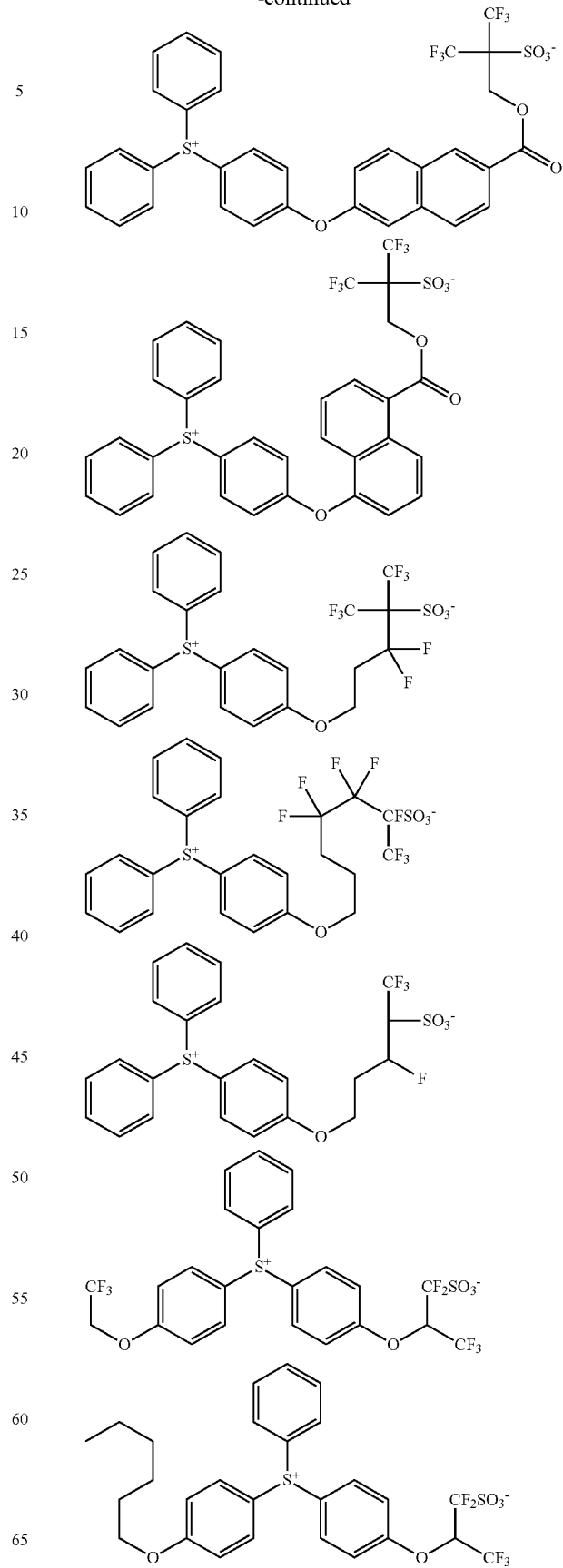

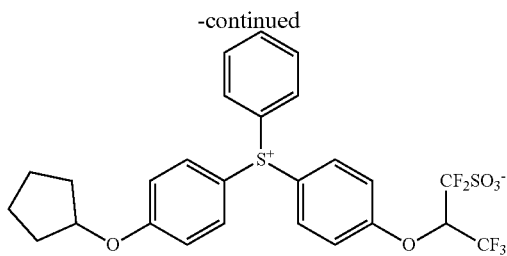

The compound shown by (P-0) can be added in an amount of 0.001 to 40 parts by mass, preferably 0.1 to 40 parts by mass, further preferably 0.1 to 20 parts by mass, based on 100 parts by mass of a thermosetting silicon-containing material (Sx: thermally crosslinkable polysiloxane resin). This range is preferable because favorable resolution is obtained and no problem of foreign matters will arise after resist development or during removal. Further, as necessary, one kind of (P-0) can be used alone, or two or more kinds thereof can be used in combination.

[Other Components]
(Crosslinking Catalyst)

In the present invention, a crosslinking catalyst (Xc) may further be blended into the composition for forming a silicon-containing resist underlayer film.

The crosslinking catalyst that may be contained in the inventive composition for forming a silicon-containing resist underlayer film can promote siloxane bond formation when a thermosetting polysiloxane is cured, and a silicon-containing resist underlayer film crosslinked at high density can be formed. In this manner, not only is the diffusion of acid generated from the acid generator of the present invention reduced, it is also possible to inactivate the acid that exists in excess by containing a nitrogen-containing compound having a substituent that is decomposed by acid and in this way, diffusion of acid to the upper layer resist is suppressed and an upper layer resist pattern excellent in LWR and CDU can be formed.

An example of the blendable crosslinking catalyst includes a compound shown by the following general formula (Xc0):

$$L_aH_bA \quad\quad (Xc0)$$

where L represents lithium, sodium, potassium, rubidium, cesium, sulfonium, iodonium, phosphonium, or ammonium; H represents hydrogen; A represents a non-nucleophilic counter ion; "a" represents an integer of 1 or more; "b" represents an integer of 0 or 1 or more; and a+b represents a valence of the non-nucleophilic counter ion.

Examples of the crosslinking catalyst used in the present invention as specific (Xc0) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, and the like.

Examples of the sulfonium salt (Xc-1), the iodonium salt (Xc-2), and the phosphonium salt (Xc-3) are shown below.

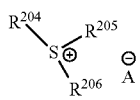

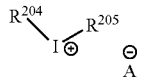

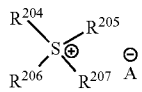

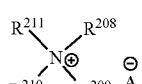

Moreover, an example of the ammonium salt (Xc-4) is shown below.

In the formulae, $R^{214}$, $R^{203}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of the hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. $A^-$ represents a non-nucleophilic counter ion. $R^{208}$, $R^{209}$, $R^{210}$, and $R^{211}$ are the same as $R^{204}$, $R^{205}$, $R^{206}$, and $R^{207}$, and may be each a hydrogen atom. $R^{208}$ and $R^{209}$, or $R^{208}$ and $R^{209}$ and $R^{210}$, may form a ring; when a ring is formed, $R^{208}$ and $R^{209}$, or $R^{208}$ and $R^{209}$ and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be identical to or different from one another. Specific examples thereof include alkyl groups such as a methyl group, an ethyl group, a propyl group, an isopropyl group, an n-butyl group, a sec-butyl group, a tert-butyl group, a pentyl group, a hexyl group, a heptyl group, and an octyl group; a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, and the like, and also include a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, and the like; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

Examples of the non-nucleophilic counter ion A-include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, and the like.

Examples of the alkaline metal salt include salts of lithium, sodium, potassium, cesium, magnesium, and calcium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, and the like.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, and the like.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, and the like.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, and the like.

Meanwhile, specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium trifluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium trifluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethylphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenylammonium formate, benzyldimethylphenylammonium acetate, benzyldimethylphenylammonium propionate, benzyldimethylphenylammonium butanoate, benzyldimethylphenylammonium benzoate, benzyldimethylphenylammonium phthalate, benzyldimethylphenylammonium isophthalate, benzyldimethylphenylammonium terephthalate, benzyldimethylphenylammonium salicylate, benzyldimethylphenylammonium trifluoromethanesulfonate, benzyldimethylphenylammonium trifluoroacetate, benzyldimethylphenylammonium monochloroacetate, benzyldimethylphenyllammonium dichloroacetate, benzyldimethylphenyllammonium trichloroacetate, benzyldimethylphenyllammonium hydroxide, benzyldimethylphenyllammonium nitrate, benzyldimethylphenyllammonium chloride, benzyldimethylphenyllammonium bromide, benzyldimethylphenyllammonium iodide, benzyldimethylphenyllammonium methanesulfonate, benzyldimethylphenyllammonium monomethylsulfate, benzyldimethylphenyllammonium oxalate, benzyldimethylphenyllammonium malonate, benzyldimethylphenyllammonium maleate, benzyldimethylphenyllammonium fumarate, benzyldimethylphenyllammonium citraconate, benzyldimethylphenyllammonium citrate, benzyldimethylphenyllammonium carbonate, bisbenzyldimethylphenyllammonium oxalate, bisbenzyldimethylphenyllammonium malonate, bisbenzyldimethylphenyllammonium maleate, bisbenzyldimethylphenyllammonium fumarate, bisbenzyldimethylphenyllammonium citraconate, bisbenzyldimethylphenyllammonium citrate, bisbenzyldimethylphenyllammonium carbonate, and the like.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, and the like.

In the present invention, a polysiloxane (Xc-10) having a structure partially containing one of the sulfonium salt, the iodonium salt, the phosphonium salt, and the ammonium salt may be blended as the crosslinking catalyst (Xc) into the composition for forming a silicon-containing resist underlayer film.

As a raw material for producing (Xc-10) used here, it is possible to employ a compound shown by the following general formula (Xm):

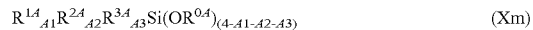

$$R^{1A}_{A1}R^{2A}_{A2}R^{3A}_{A3}Si(OR^{0A})_{(4-A1-A2-A3)} \quad (Xm)$$

where $R^{0A}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other (s) of $R^{1A}$, $R^{2A}$, and $R^{3A}$ represent a hydrogen atom or a monovalent organic group having 1 to 30 carbon atoms; and A1, A2, and A3 each represent 0 or 1, given that $1 \leq A1+A2+A3 \leq 3$.

Here, examples of $R^{0A}$ include a methyl group, an ethyl group, an n-propyl group, an iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

An example of Xm includes the following general formula (Xm-1), as a hydrolysable silicon compound having a structure partially containing the sulfonium salt:

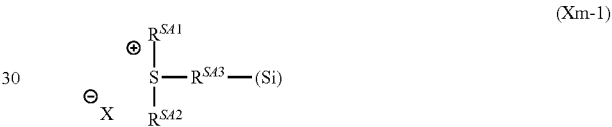

(Xm-1)

In the formula, $R^{SA1}$ and $R^{SA2}$ each represent a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of the hydrogen atoms of these groups are optionally substituted with an alkoxy group, an amino group, an alkylamino group, a halogen atom, or the like. Moreover, $R^{SA1}$ and $R^{SA2}$ may form a ring together with a nitrogen atom bonded to $R^{SA1}$ and $R^{SA2}$; when a ring is formed, $R^{SA1}$ and $R^{SA2}$ each represent an alkylene group having 1 to 6 carbon atoms. $R^{SA3}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Examples of $X^-$ include hydroxide ion, fluoride ion, chloride ion, bromide ion, iodide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, methanesulfonate ion, benzenesulfonate ion, toluenesulfonate ion, monomethylsulfate ion, hydrogen sulfate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and the like.
Specific examples include the following (X⁻ is the same as above).
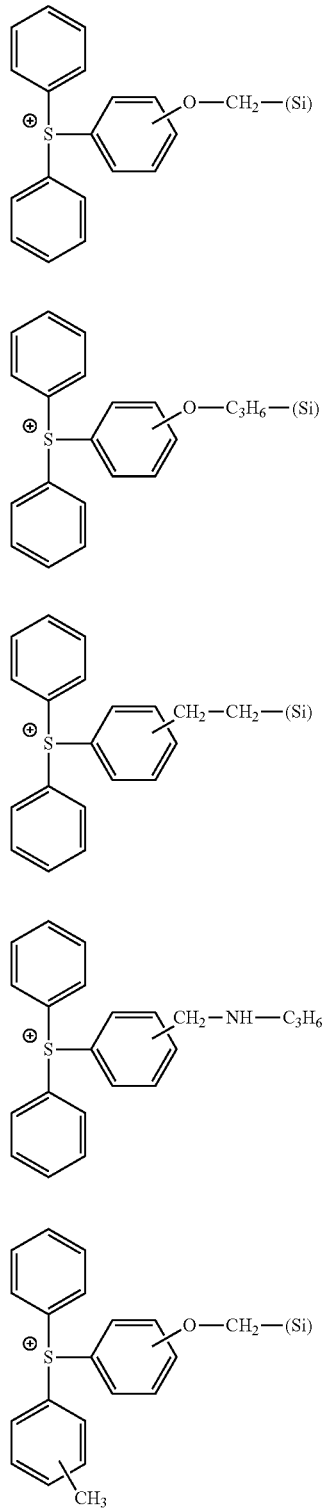
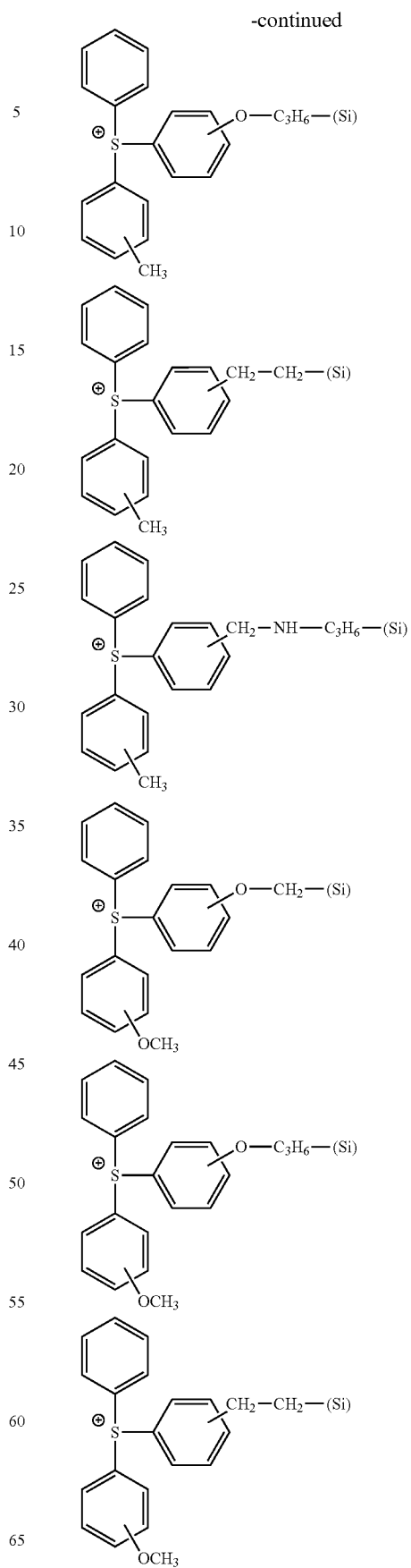

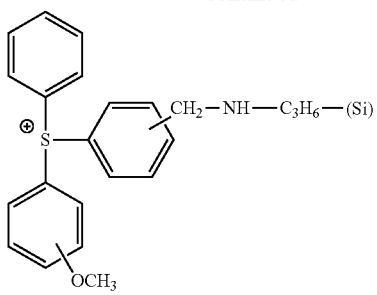

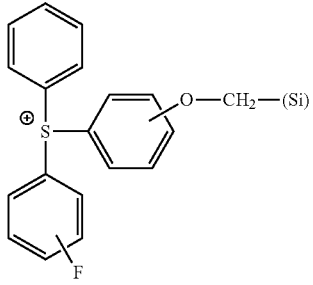

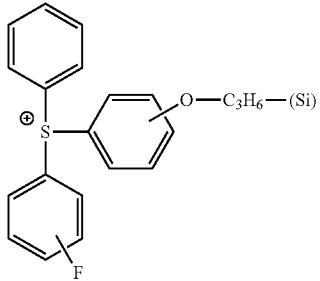

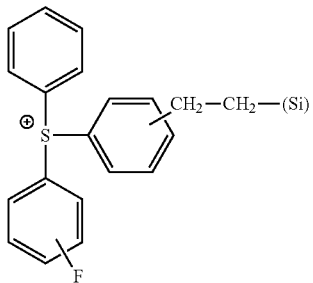

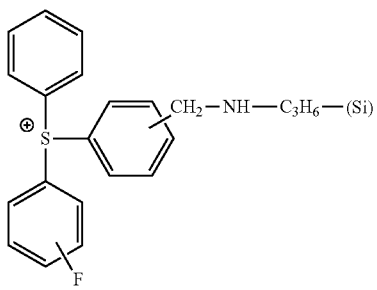

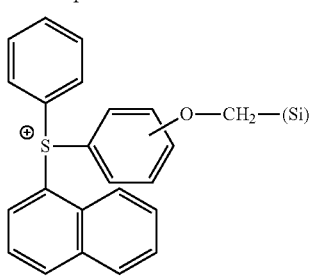

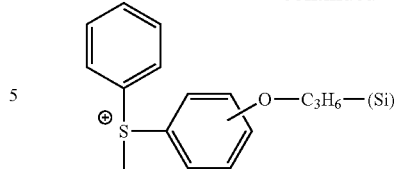

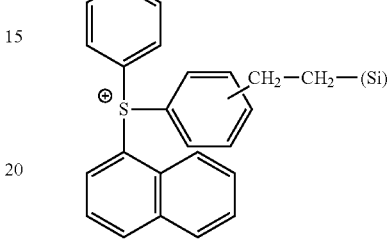

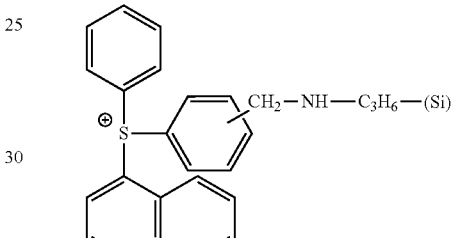

For example, a hydrolysable silicon compound having a structure partially containing the iodonium salt can be shown by the following general formula (Xm-2). X is the same as above.

(Xm-2)

In the formula, $R^{IA1}$ represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of the hydrogen atoms of these groups are optionally substituted with an alkoxy group, an amino group, an alkylamino group, a halogen atom, or the like. $R^{IA2}$ represents a divalent organic group such as a linear, branched, or cyclic alkylene group or alkenylene group having 1 to 20 carbon atoms, or a substituted or unsubstituted arylene group having 6 to 20 carbon atoms; some or all of the hydrogen atoms of these groups are optionally substituted with an alkoxy group, an amino group, an alkylamino group, or the like.

Specific examples include the following ($X^-$ is the same as above).

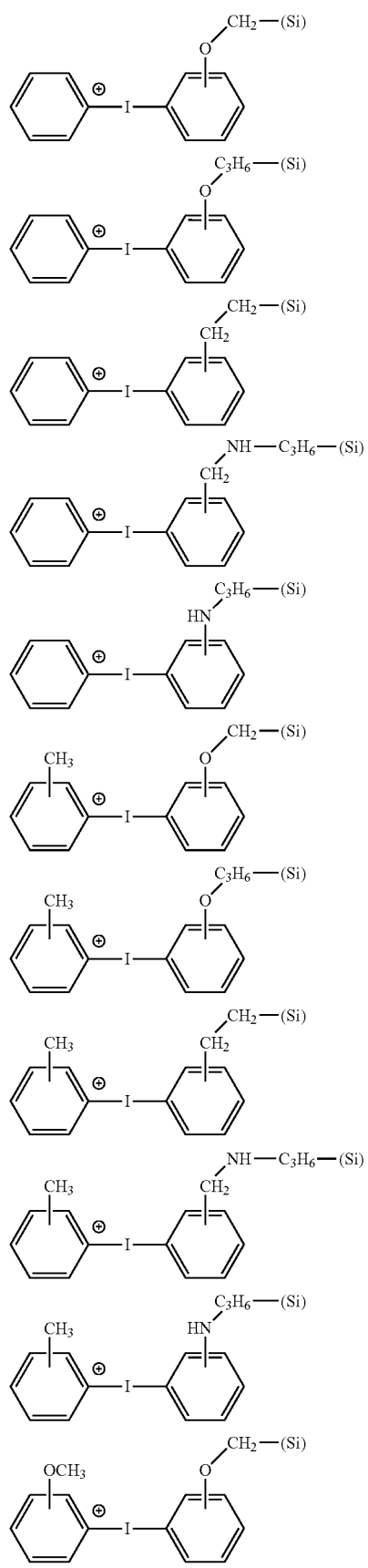
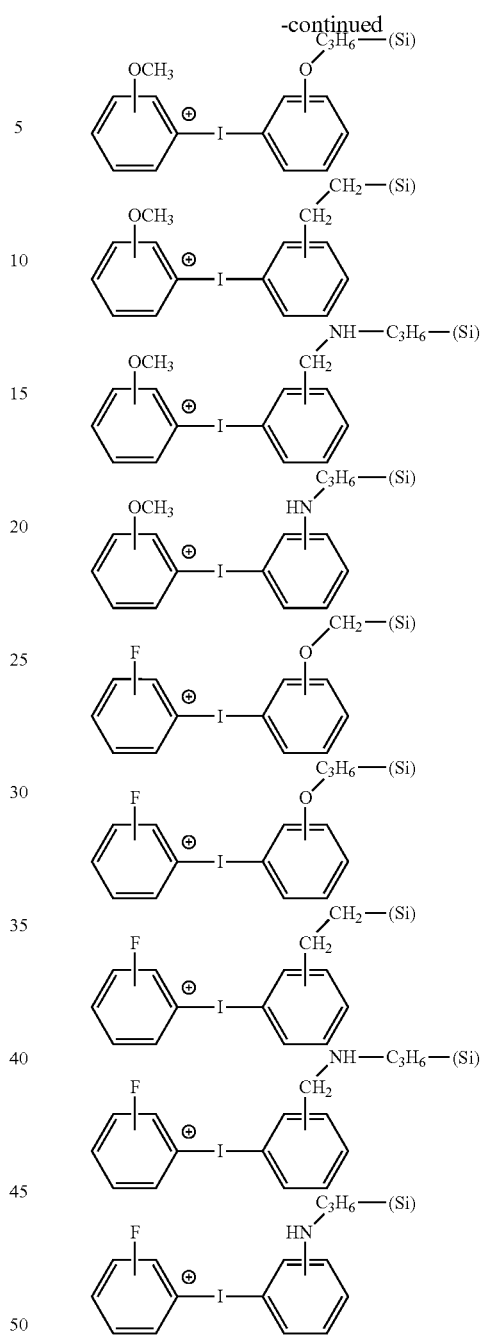
For example, a hydrolysable silicon compound having a structure partially containing the phosphonium salt can be shown by the following general formula (Xm-3). X⁻ is the same as above.
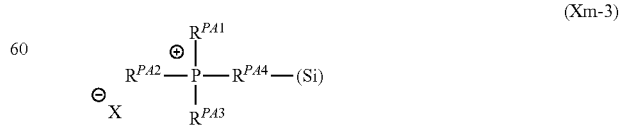
(Xm-3)
In the formula, $R^{PA}1$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of the hydrogen atoms of these groups are optionally substituted with an alkoxy group, an amino group, an alkylamino group, a halogen atom, or the like. Moreover, $R^{PA1}$ and $R^{PA2}$ may form a ring together with a nitrogen atom bonded to $R^{PA1}$ and $R^{PA2}$; when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group having 6 to 20 carbon atoms; some or all of the hydrogen atoms of these groups are optionally substituted with an alkoxy group, an amino group, an alkylamino group, or the like.

Specific examples include the following ($X^-$ is the same as above).

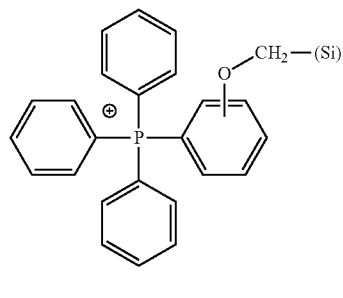

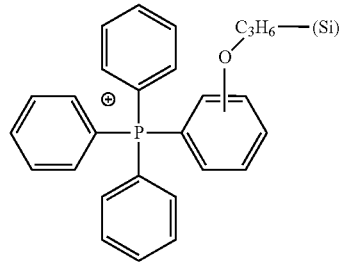

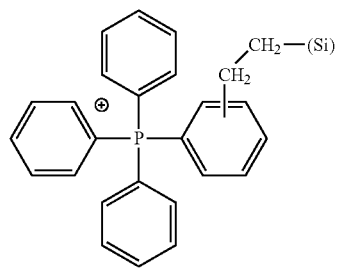

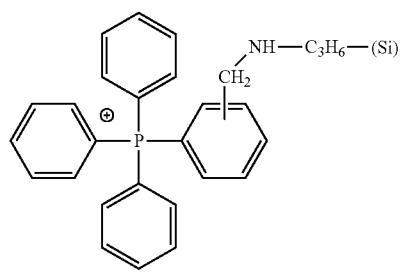

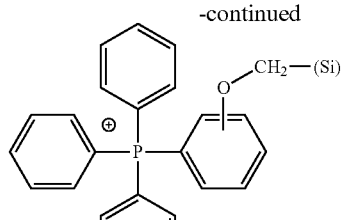

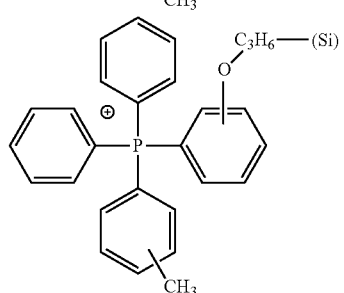

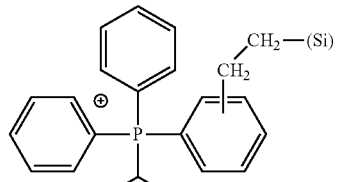

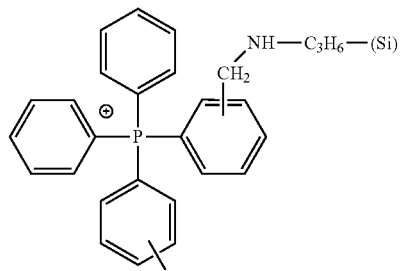

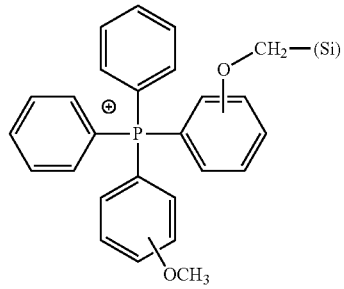

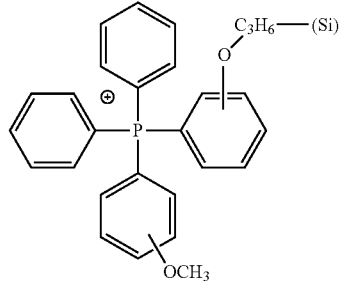

-continued
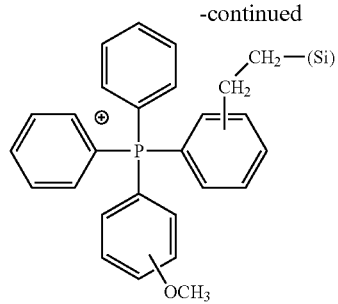
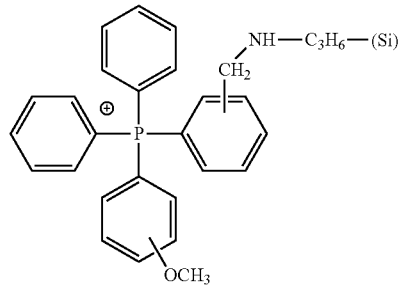
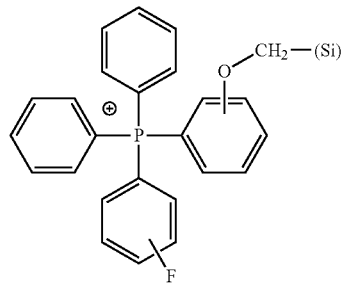
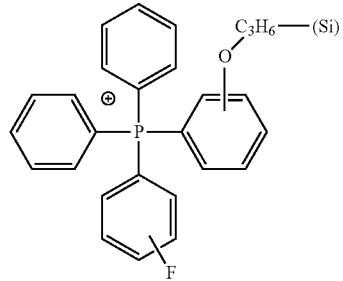
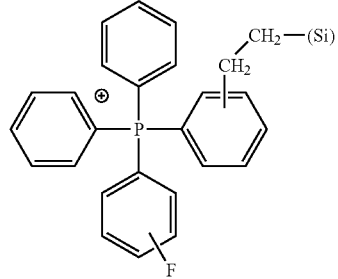
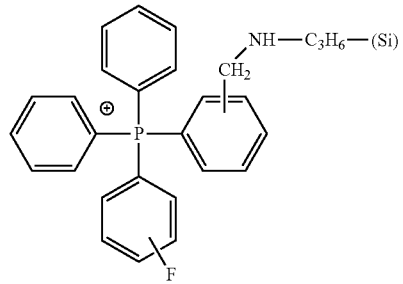
-continued
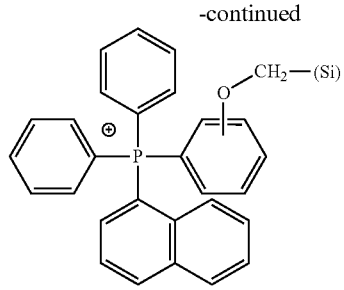
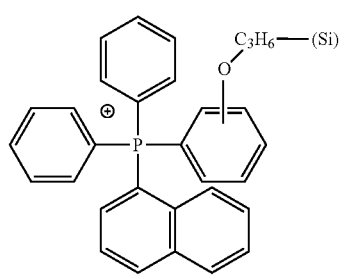
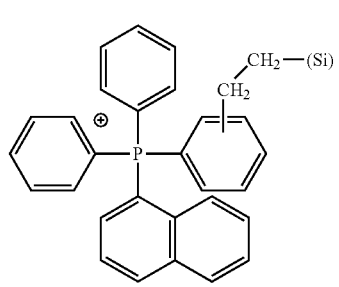
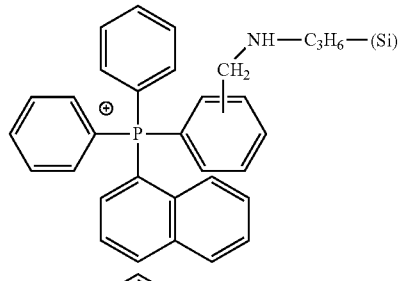
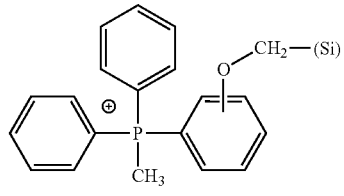
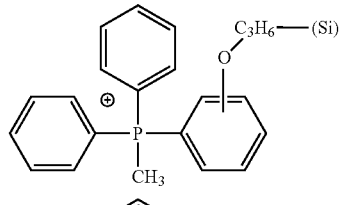
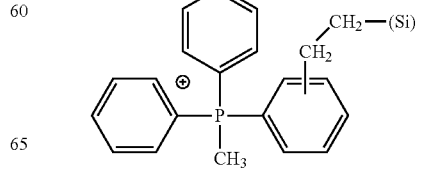

-continued
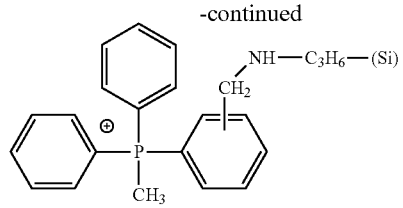
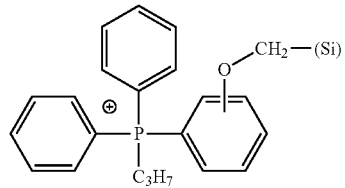
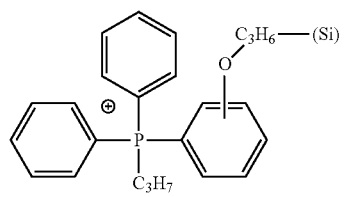
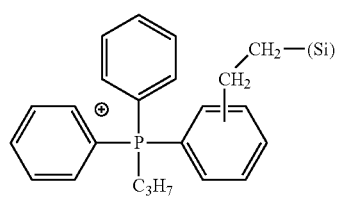
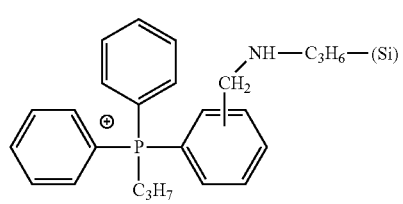
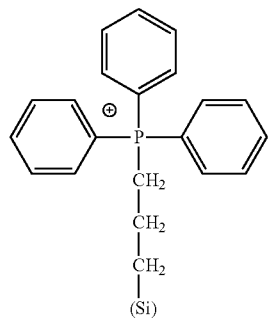
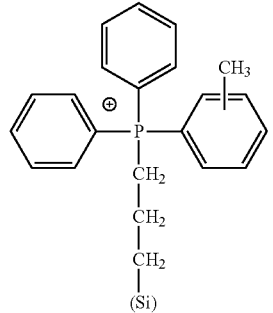
-continued
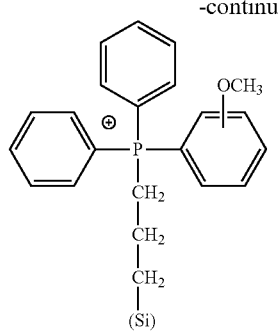
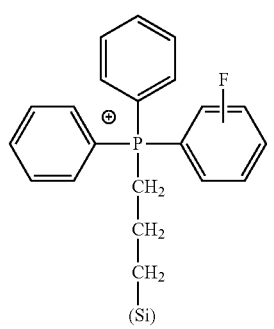
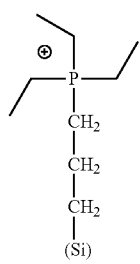
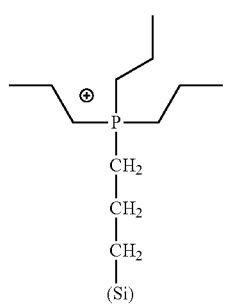
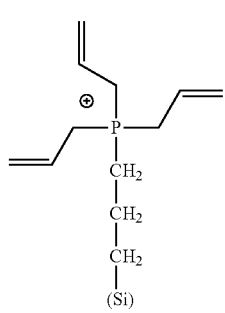

-continued

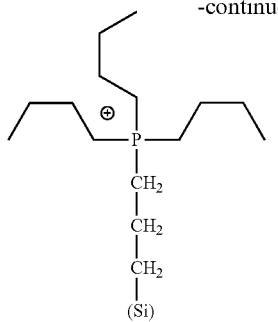

For example, a hydrolysable silicon compound having a structure partially containing the ammonium salt can be shown by the following general formula (Xm-4). X⁻ is the same as above.

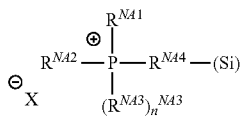

(Xm-4)

In the formula, $R^{NA1}$, $R^{NA2}$, and $R^{NA3}$ each represent hydrogen or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of the hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; when a ring is formed, $R^{NA1}$ and $R^{NA2}$ each represent an alkylene group having 1 to 6 carbon atoms or a heterocyclic ring or heteroaromatic ring containing nitrogen. $R^{NA4}$ represents a divalent organic group such as a linear, branched, or cyclic alkylene group or alkenylene group having 1 to 20 carbon atoms, or a substituted or unsubstituted arylene group having 6 to 20 carbon atoms; some or all of the hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$, form a cyclic structure which further contains unsaturated nitrogen, $n^{NA3}=0$; in the other cases, $n^{NA3}=1$.

Specific examples include the following (X is the same as above).

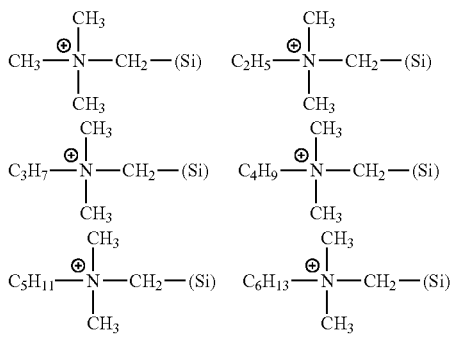

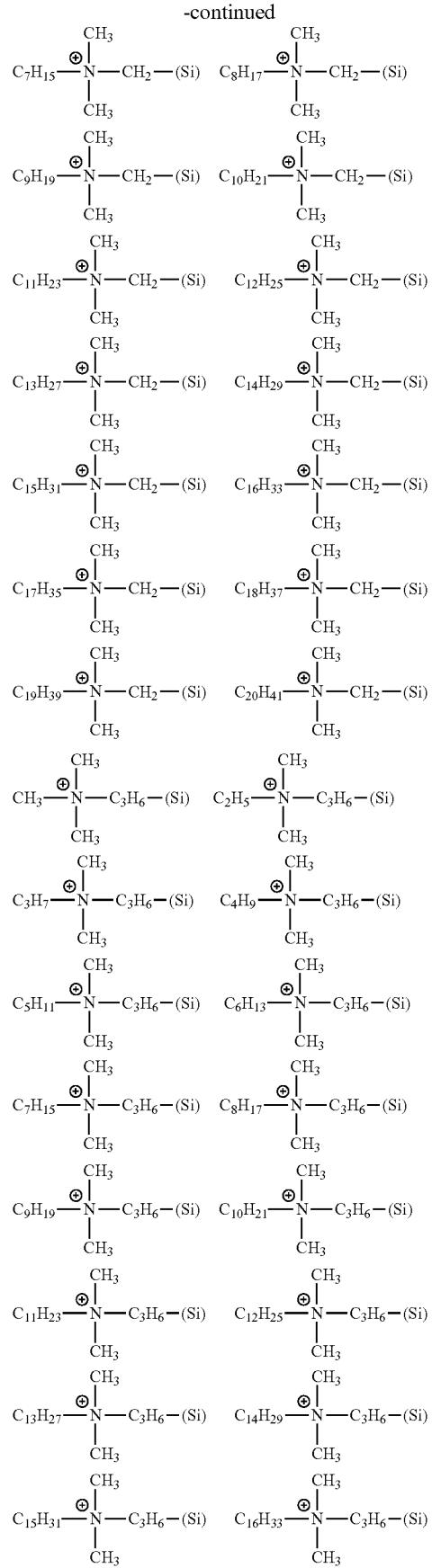

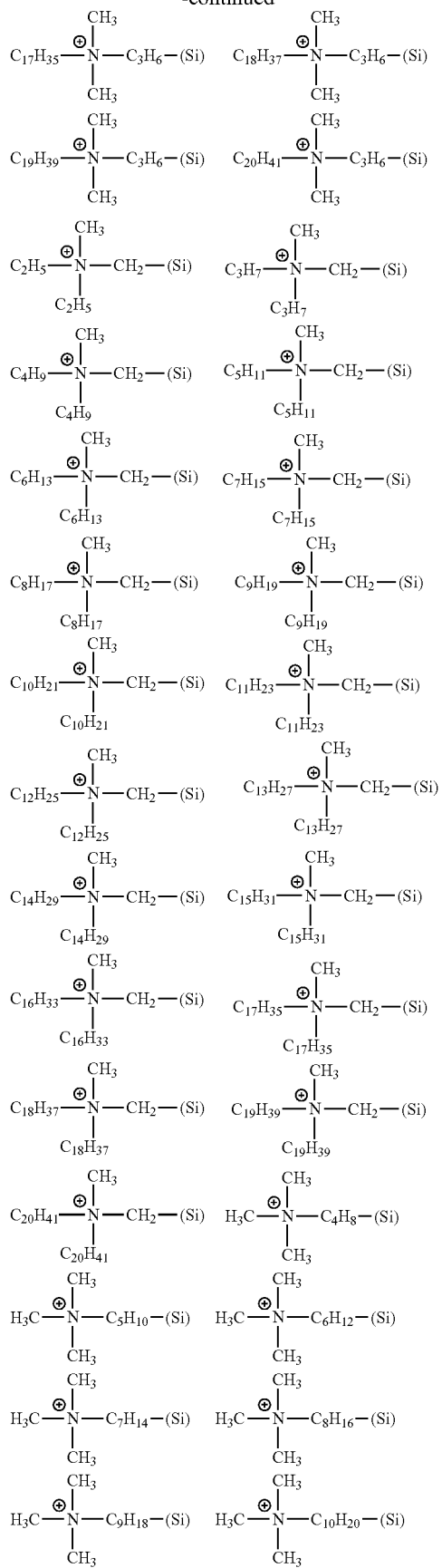
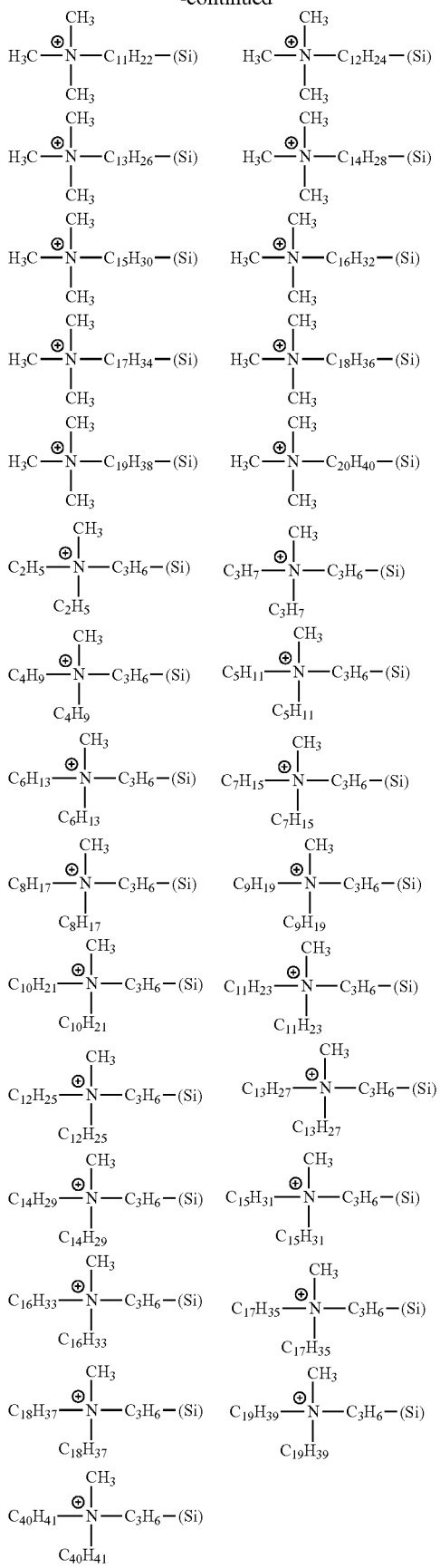

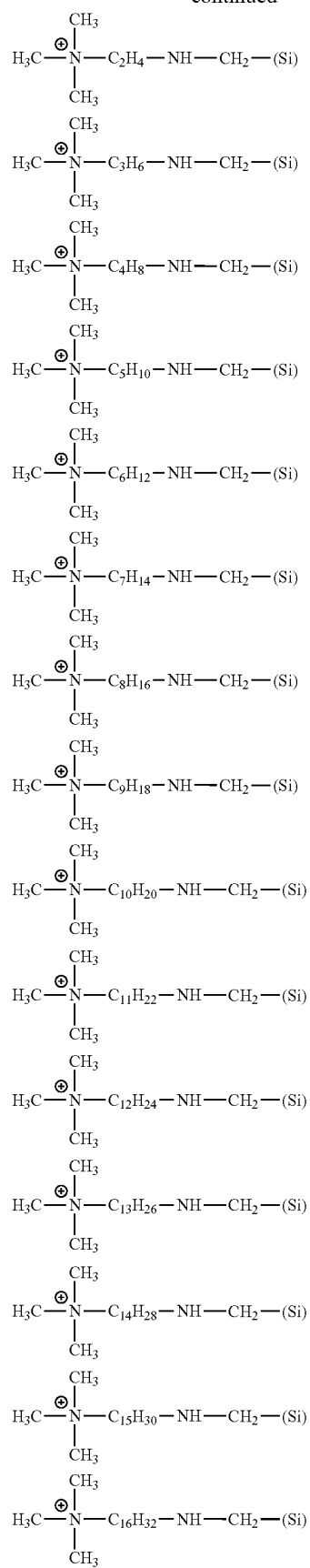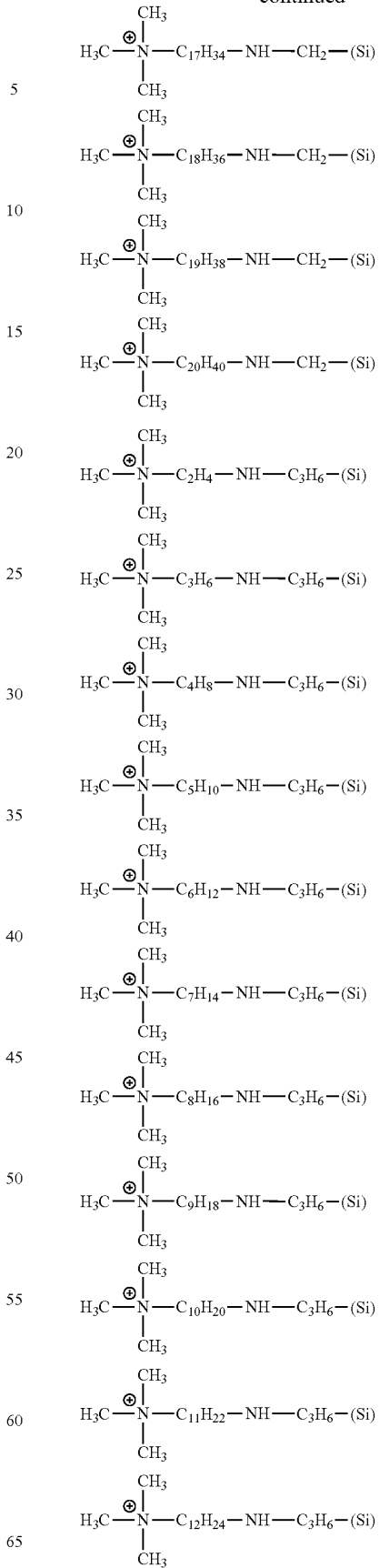

101
-continued
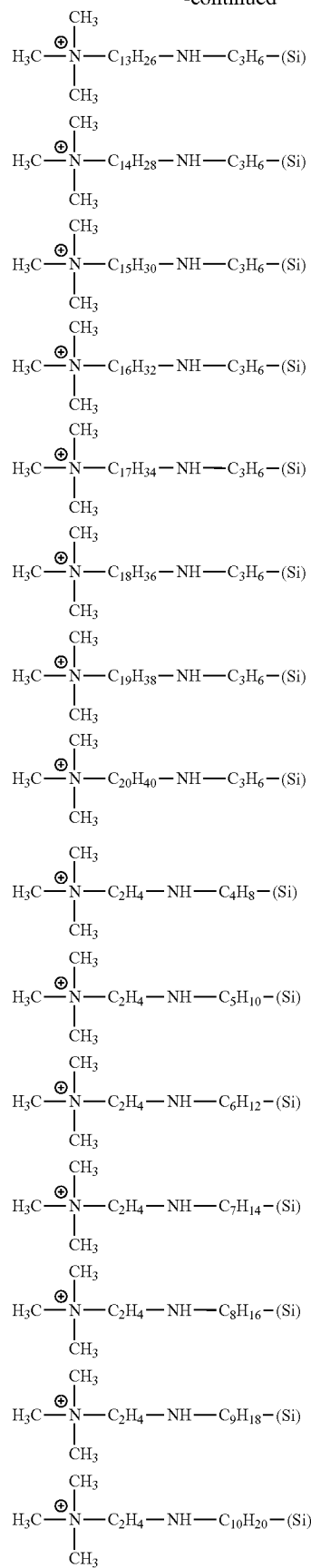
102
-continued
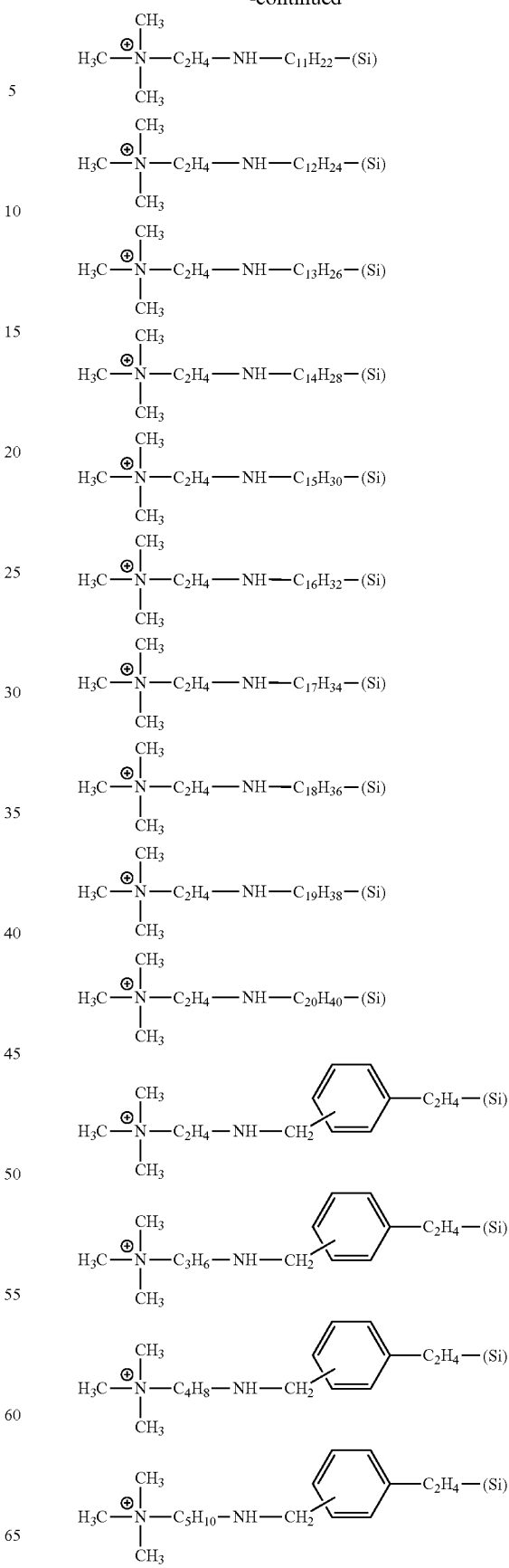

103

-continued $(CH_3)_2(H_3C)\overset{\oplus}{N}-C_6H_{12}-NH-CH_2-C_6H_4-C_2H_4-(Si)$ $(CH_3)_2(H_3C)\overset{\oplus}{N}-C_7H_{14}-NH-CH_2-C_6H_4-C_2H_4-(Si)$ $(CH_3)_2(H_3C)\overset{\oplus}{N}-C_8H_{16}-NH-CH_2-C_6H_4-C_2H_4-(Si)$ $(CH_3)_2(H_3C)\overset{\oplus}{N}-C_9H_{18}-NH-CH_2-C_6H_4-C_2H_4-(Si)$ $(CH_3)_2(H_3C)\overset{\oplus}{N}-C_{10}H_{20}-NH-CH_2-C_6H_4-C_2H_4-(Si)$ $(CH_3)_2(H_3C)\overset{\oplus}{N}-C_{11}H_{22}-NH-CH_2-C_6H_4-C_2H_4-(Si)$ $(CH_3)_2(H_3C)\overset{\oplus}{N}-C_{12}H_{24}-NH-CH_2-C_6H_4-C_2H_4-(Si)$ $(CH_3)_2(H_3C)\overset{\oplus}{N}-C_{13}H_{26}-NH-CH_2-C_6H_4-C_2H_4-(Si)$ $(CH_3)_2(H_3C)\overset{\oplus}{N}-C_{14}H_{28}-NH-CH_2-C_6H_4-C_2H_4-(Si)$ $(CH_3)_2(H_3C)\overset{\oplus}{N}-C_{15}H_{30}-NH-CH_2-C_6H_4-C_2H_4-(Si)$ $(CH_3)_2(H_3C)\overset{\oplus}{N}-C_{16}H_{32}-NH-CH_2-C_6H_4-C_2H_4-(Si)$ $(CH_3)_2(H_3C)\overset{\oplus}{N}-C_{17}H_{34}-NH-CH_2-C_6H_4-C_2H_4-(Si)$

104

-continued $(CH_3)_2(H_3C)\overset{\oplus}{N}-C_{18}H_{36}-NH-CH_2-C_6H_4-C_2H_4-(Si)$ $(CH_3)_2(H_3C)\overset{\oplus}{N}-C_{19}H_{38}-NH-CH_2-C_6H_4-C_2H_4-(Si)$ $(CH_3)_2(H_3C)\overset{\oplus}{N}-C_{20}H_{40}-NH-CH_2-C_6H_4-C_2H_4-(Si)$ $(CH_3)_3\overset{\oplus}{N}-CH_2-C_6H_4-C_2H_4-(Si)$ $(CH_3)_2(C_2H_5)\overset{\oplus}{N}-CH_2-C_6H_4-C_2H_4-(Si)$ $(CH_3)_2(C_3H_7)\overset{\oplus}{N}-CH_2-C_6H_4-C_2H_4-(Si)$ $(CH_3)_2(C_4H_9)\overset{\oplus}{N}-CH_2-C_6H_4-C_2H_4-(Si)$ $(CH_3)_2(C_5H_{11})\overset{\oplus}{N}-CH_2-C_6H_4-C_2H_4-(Si)$ $(CH_3)_2(C_6H_{13})\overset{\oplus}{N}-CH_2-C_6H_4-C_2H_4-(Si)$ $(CH_3)_2(C_7H_{15})\overset{\oplus}{N}-CH_2-C_6H_4-C_2H_4-(Si)$ $(CH_3)_2(C_8H_{17})\overset{\oplus}{N}-CH_2-C_6H_4-C_2H_4-(Si)$ $(CH_3)_2(C_9H_{19})\overset{\oplus}{N}-CH_2-C_6H_4-C_2H_4-(Si)$ 105
-continued
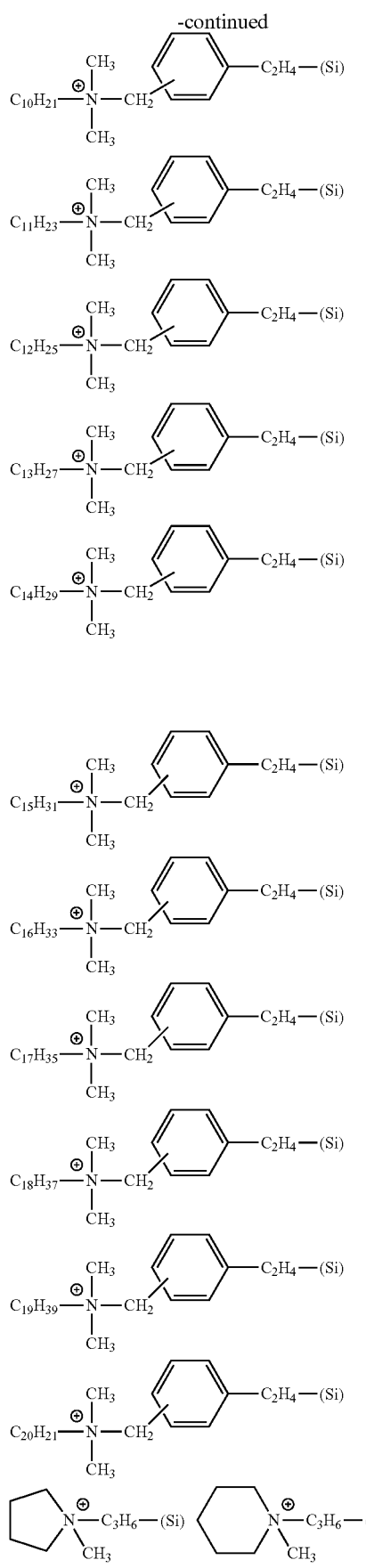
106
-continued
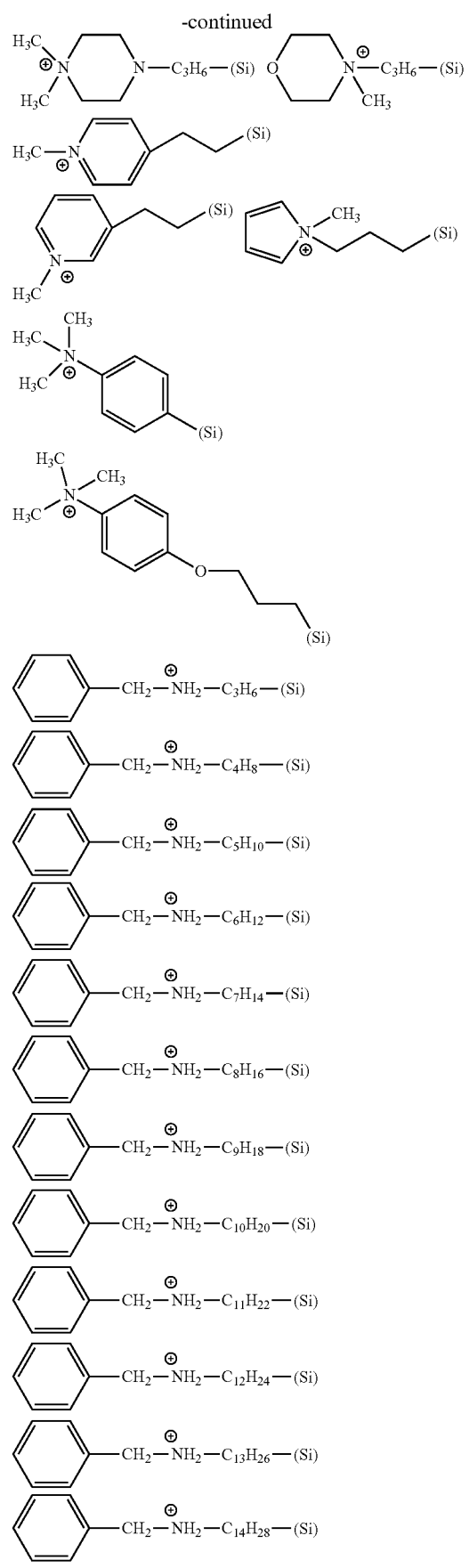

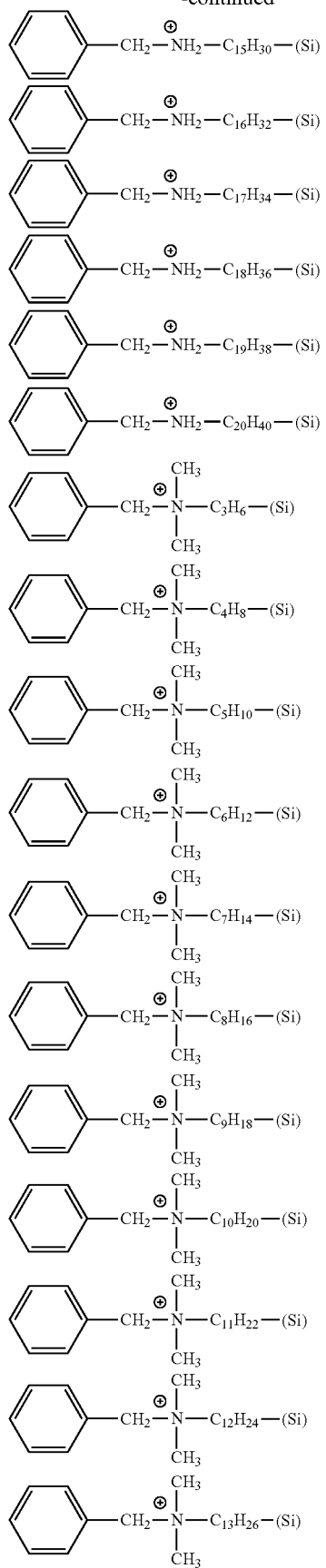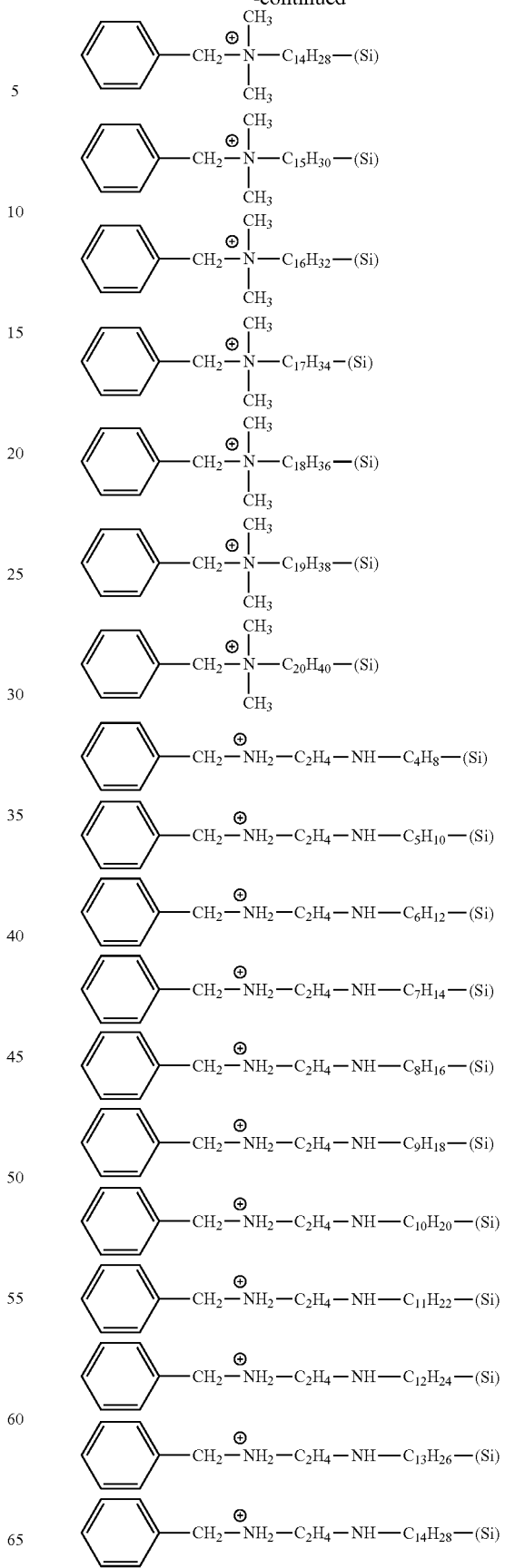

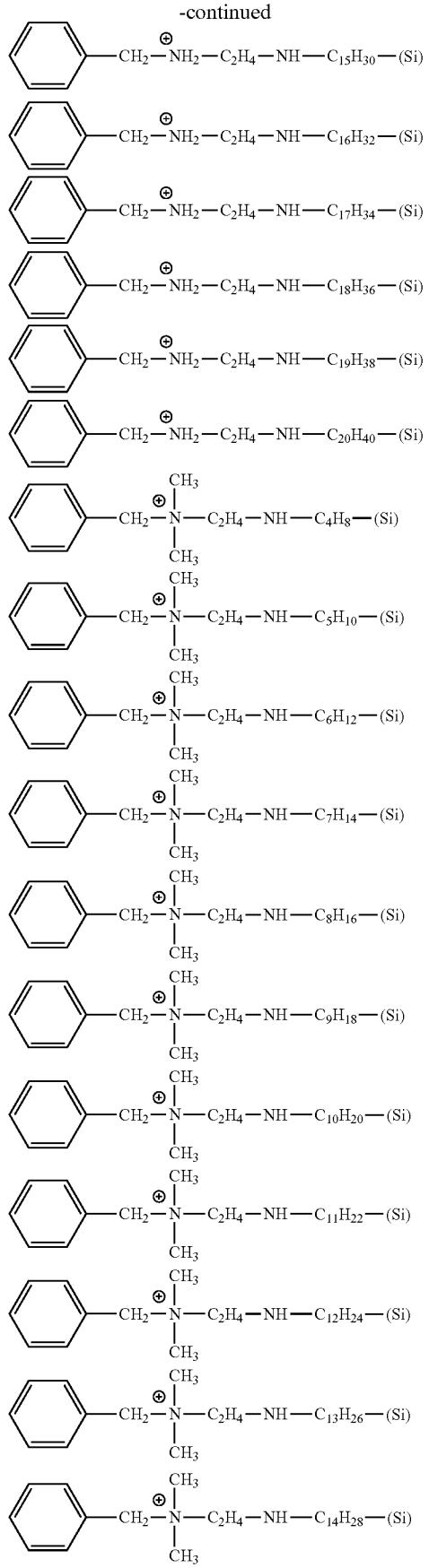
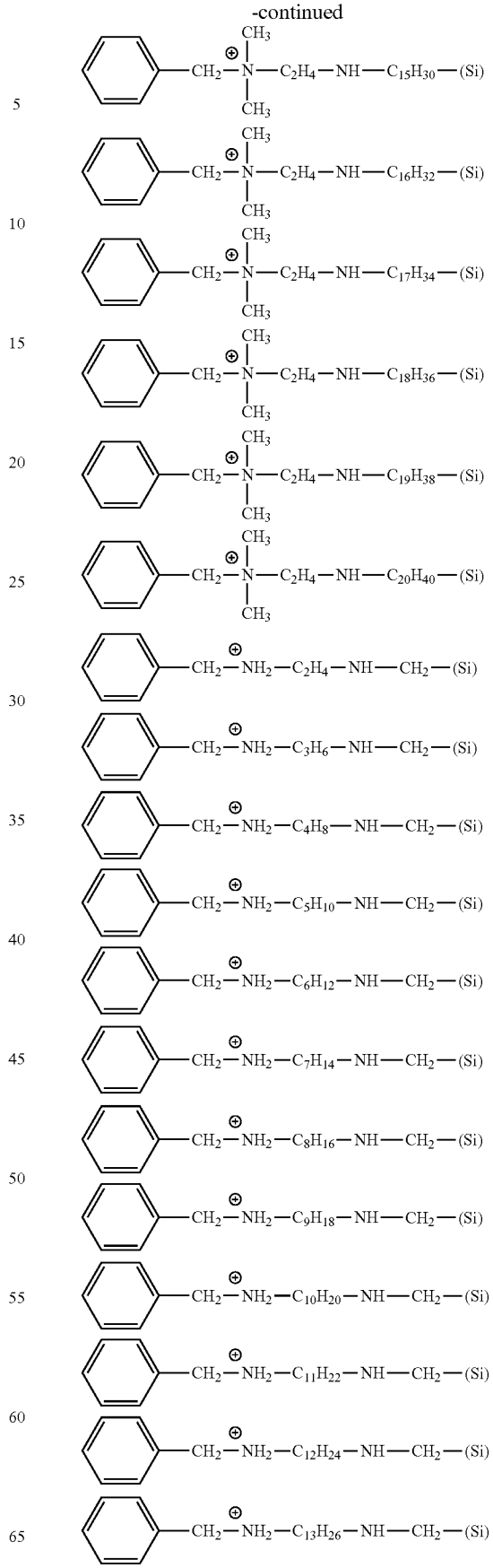

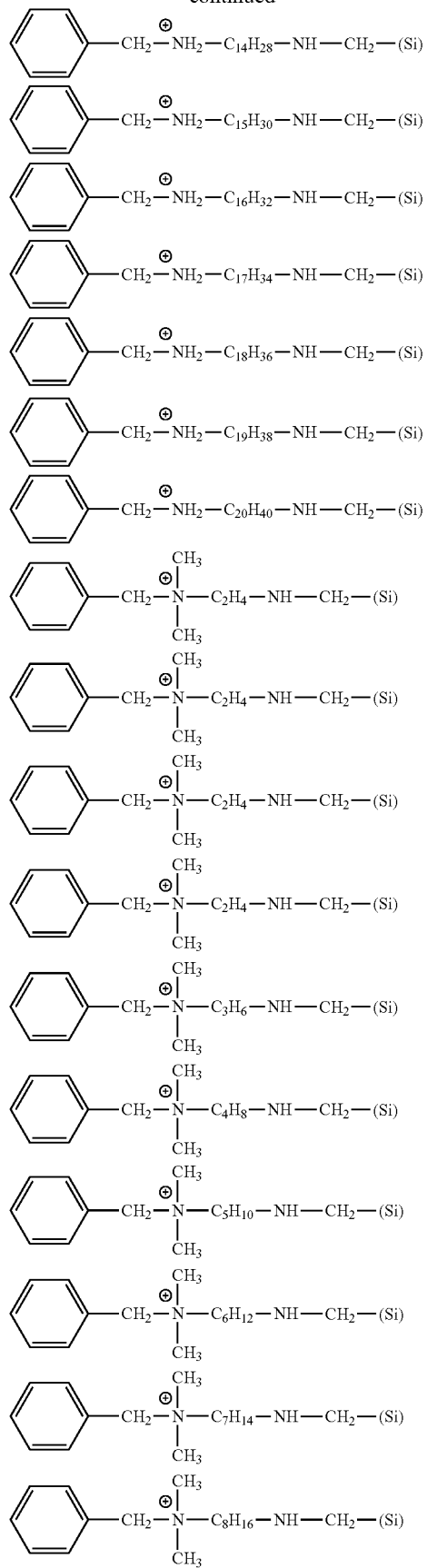
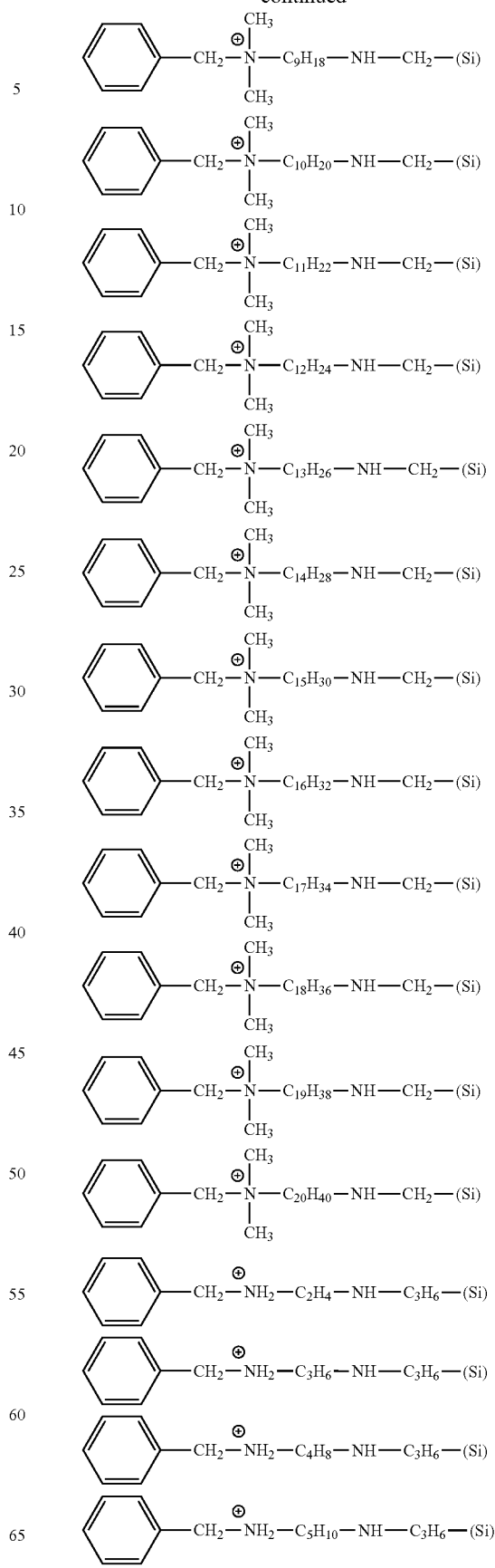

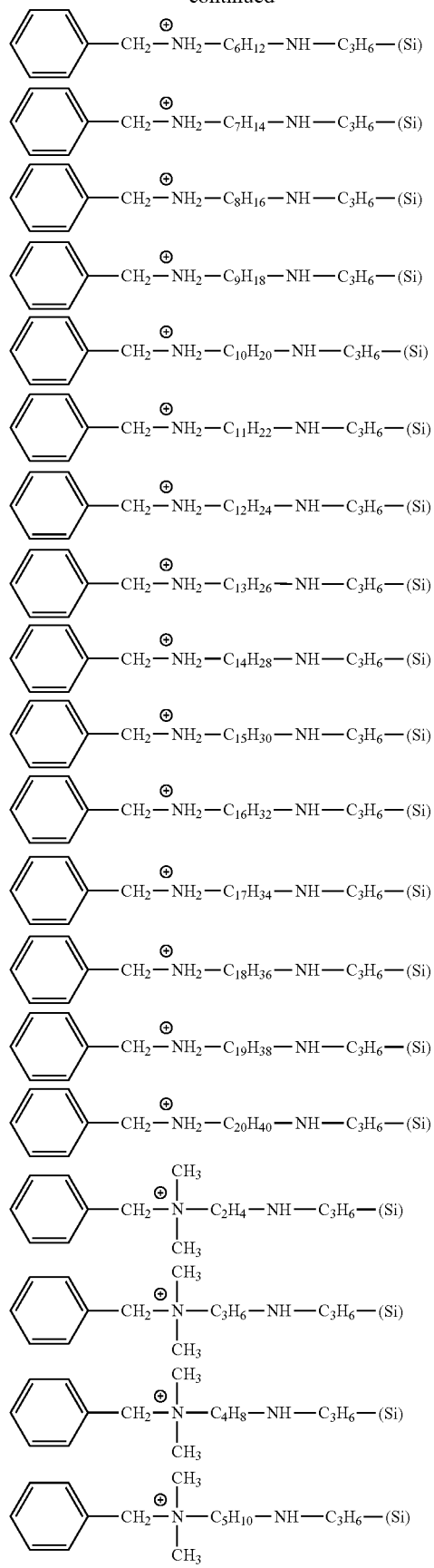
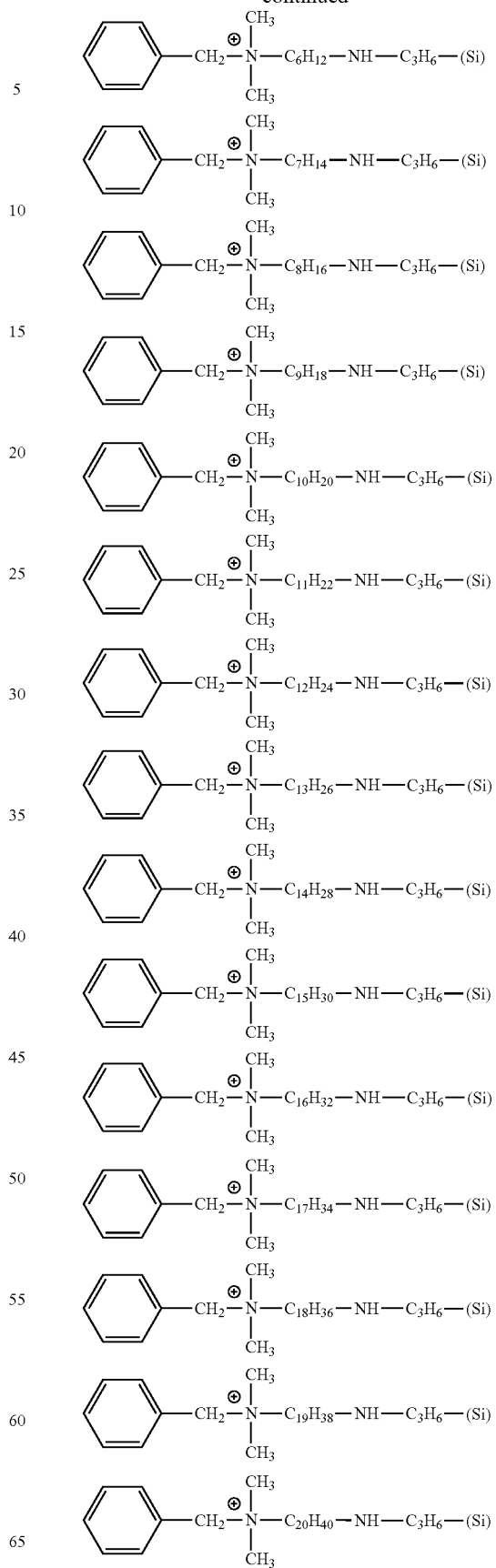

-continued

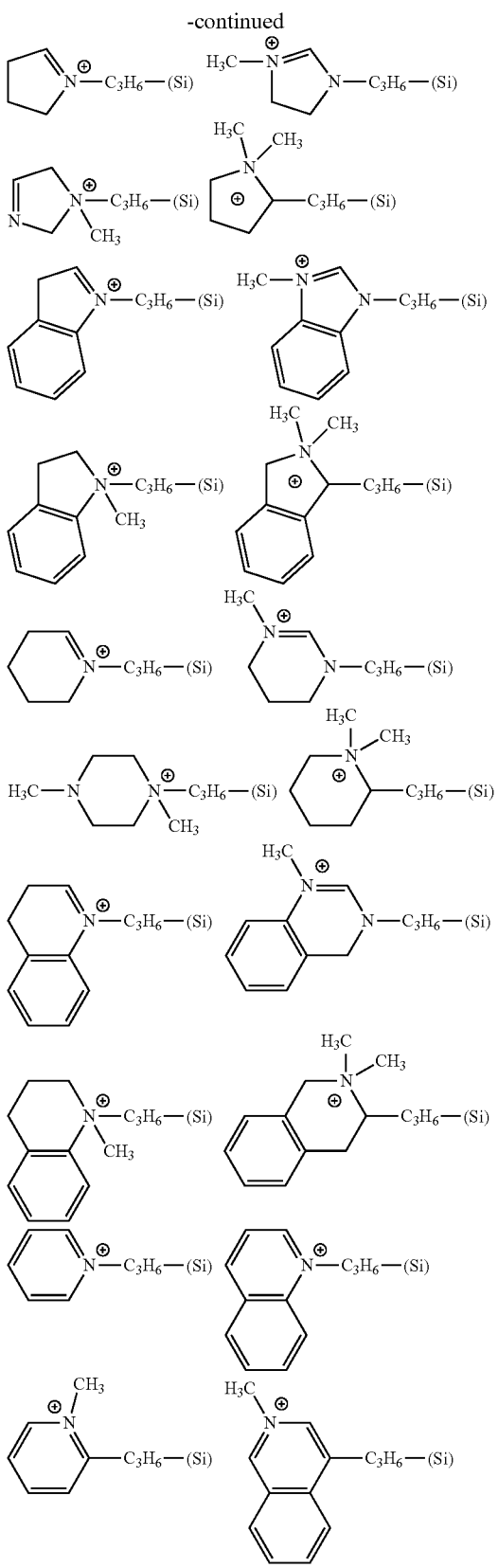

As a hydrolysable silicon compound simultaneously used with (Xm-1), (Xm-2), (Xm-3), and (Xm-4) to produce the crosslinking catalyst having a polysiloxane structure (Xc-10), the above-mentioned hydrolysable monomer (Sm) can be exemplified. Further, (Mm) may be added.

A reaction raw material for forming (Xc-10) can be prepared by: selecting at least one of the monomers (Xm-1), (Xm-2), (Xm-3), and (Xm-4) described above, in addition to at least one hydrolysable silicon compound shown above, and optionally at least one (Mm); and mixing the selected materials before or during the reaction. The reaction conditions may follow the same method as the method for synthesizing the thermosetting silicon-containing material (Sx).

The molecular weight of the obtained crosslinking catalyst (Xc-10) can be adjusted not only through the selection of the monomer but also by controlling the reaction conditions during polymerization. It is preferable to use the crosslinking catalyst having a weight average molecular weight of 100,000 or less, more preferably 200 to 50,000, further preferably 300 to 30,000. When a crosslinking catalyst having a weight average molecular weight of 100,000 or less is used, generation of foreign matters and coating spots do not occur.

Regarding data on the weight average molecular weight, the molecular weight is expressed in terms of polystyrene which is obtained by gel-permeation chromatography (GPC) using a refractive index (RI) detector, tetrahydrofuran as an eluent, and polystyrene as a reference substance.

Note that one of the crosslinking catalysts (Xc-1), (Xc-2), (Xc-3), (Xc-4), and (Xc-10) can be used alone, or two or more thereof can be used in combination. The amount of the crosslinking catalyst to be added is preferably 0.01 to 50 parts by mass, more preferably 0.1 to 40 parts by mass, based on 100 parts by mass of the base polymer (i.e., the thermosetting silicon-containing material (Sx) obtained by the above method).

(Nitrogen-Containing Compound Containing Acid-Decomposable Substituent)

In the present invention, an example of a nitrogen-containing compound (Qn) containing a substituent that is decomposed by acid (acid-decomposable substituent) includes a polysiloxane made from a hydrolysable silicon compound (Qn-1) having a substituent that is decomposed by acid at a nitrogen atom on a side chain, a hydrolysis condensate of the compound (Qn-1) or a mixture of a compound containing a silicon compound which contains the compound (Qn-1) as a part of a monomer.

Specific examples of (Qn-1) include the following, but the compounds are not limited to these compounds. Among these compounds, compounds having a cyclic structure are particularly favorable.

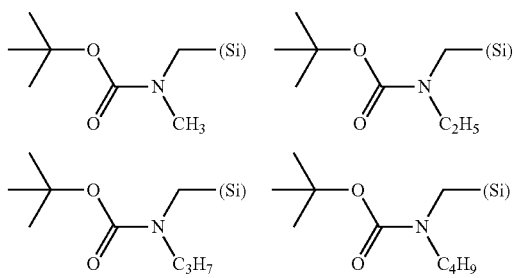

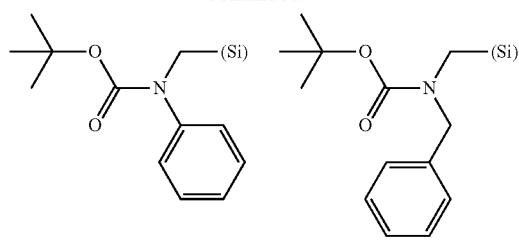
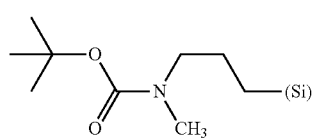
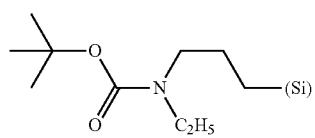
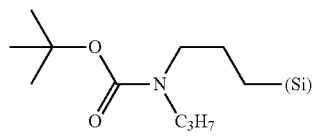
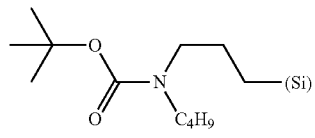
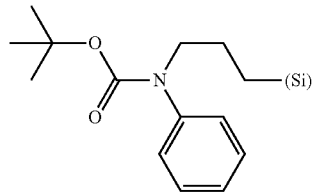
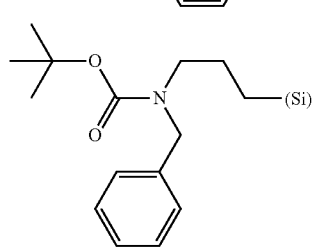
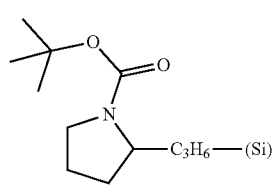
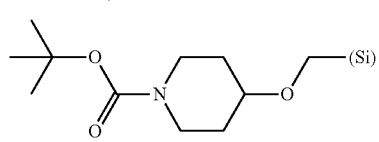
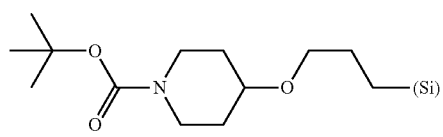
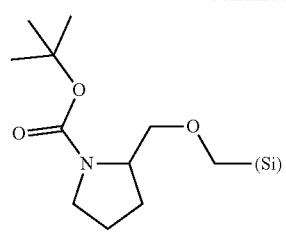
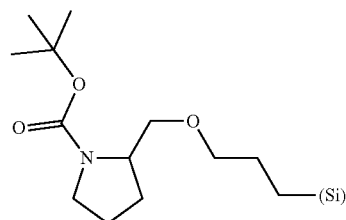
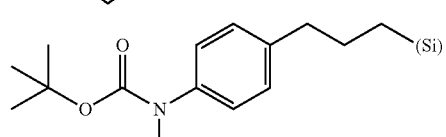
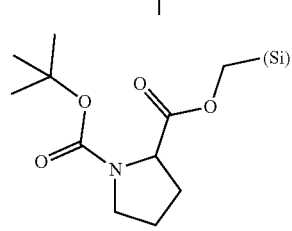
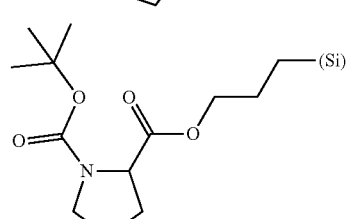
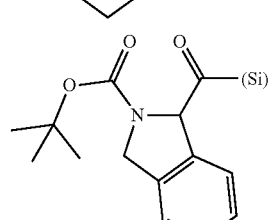
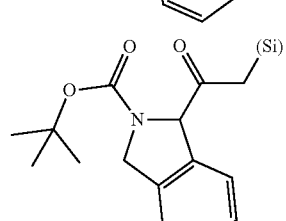
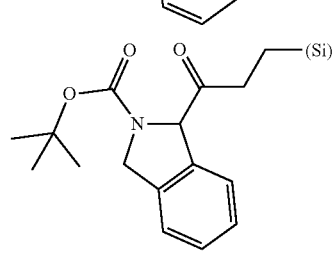

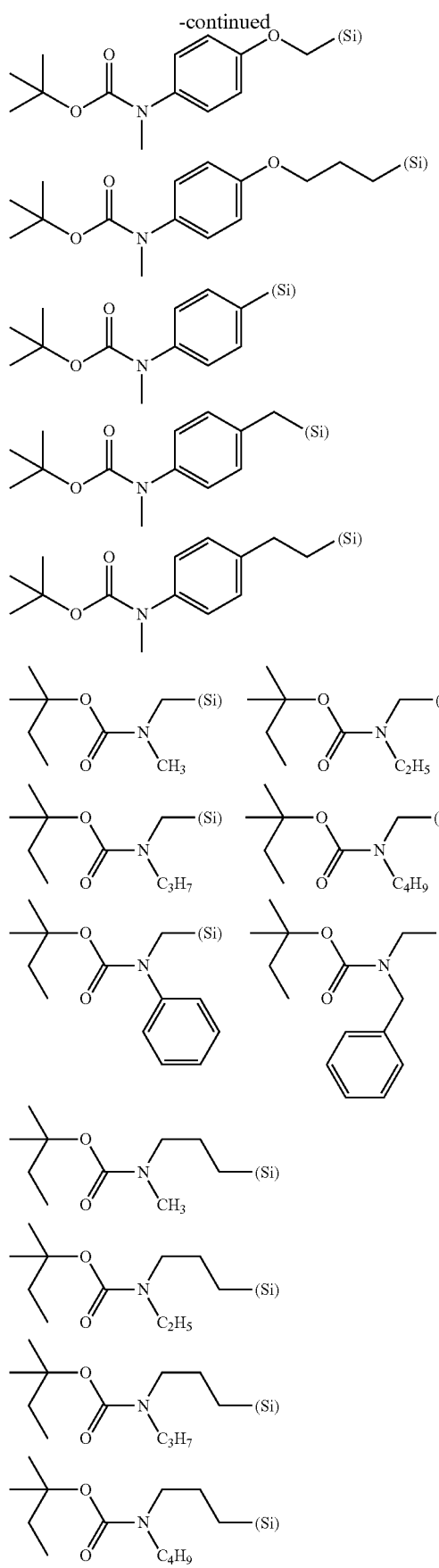
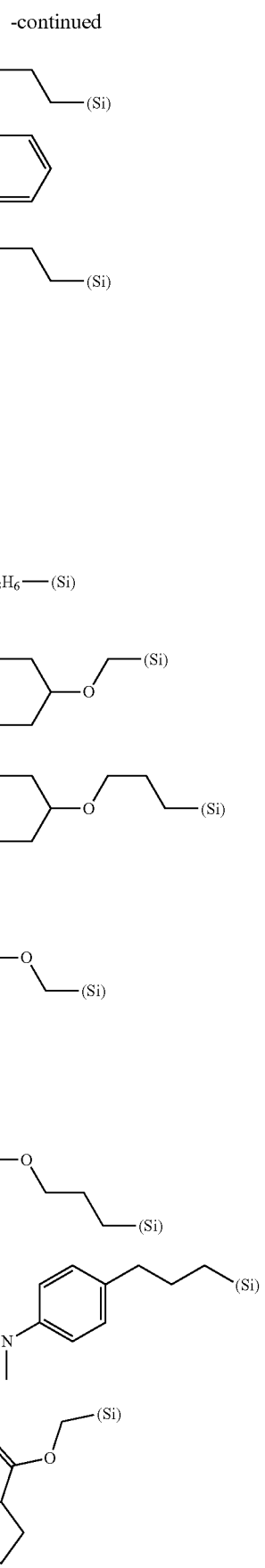

-continued

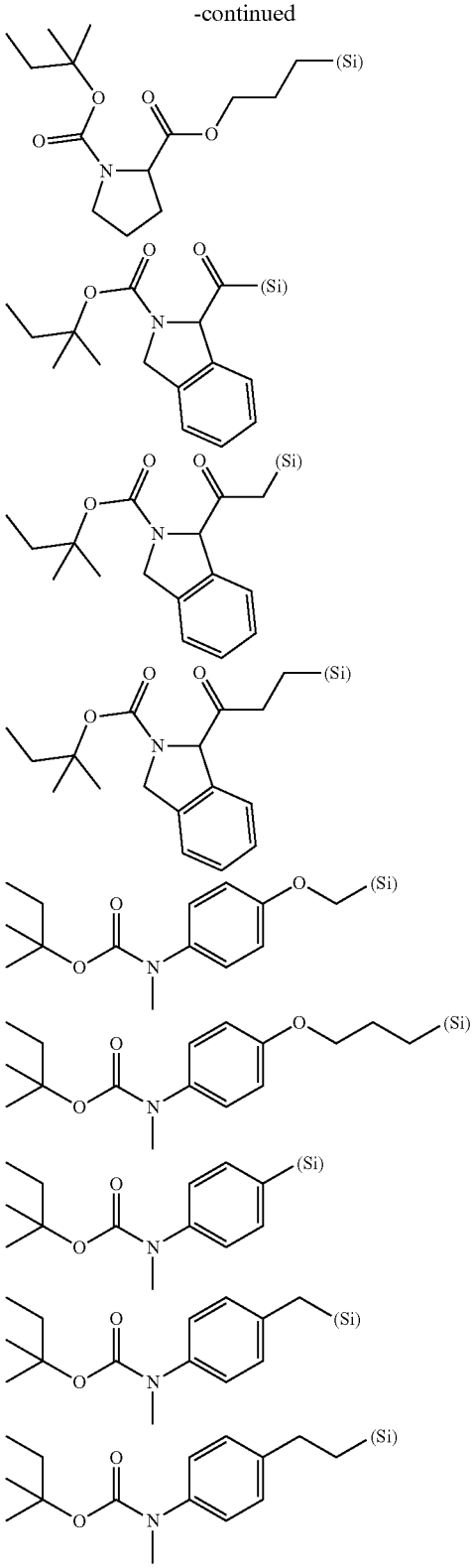

To produce a nitrogen-containing compound (Qn) containing an acid-decomposable substituent, a raw material for forming Qn can be prepared by, for example, selecting at least one of the hydrolysable silicon compounds (Qn-1) or (Qn-1) and at least one of the hydrolysable silicon compounds shown above, and optionally at least one (Mm) as necessary; and mixing the selected materials before or during the reaction. The reaction conditions may follow the same method as the method for synthesizing the thermosetting silicon-containing material (Sx).

The molecular weight of the obtained nitrogen-containing compound (Qn) containing a substituent that can be decomposed by acid can be adjusted not only through the selection of the monomer but also by controlling the reaction conditions during polymerization. It is preferable to use the compound having a weight average molecular weight of 100,000 or less, more preferably 200 to 50,000, further preferably 300 to 30,000. When a compound having a weight average molecular weight of 100,000 or less is used, generation of foreign matters and coating spots do not occur.

Regarding data on the weight average molecular weight, the molecular weight is expressed in terms of polystyrene which is obtained by gel-permeation chromatography (GPC) using a refractive index (RI) detector, tetrahydrofuran as an eluent, and polystyrene as a reference substance.

Note that the above-described Qn can be used alone or in combination of two or more thereof. The amount to be added is preferably 0.001 to 50 parts by mass, more preferably 0.01 to 10 parts by mass, based on 100 parts by mass of the base polymer (i.e., the thermosetting silicon-containing material (Sx) obtained by the above method).

(Organic Acid)

To improve the stability of the inventive composition for forming a silicon-containing resist underlayer film, it is preferable to add a monovalent, divalent, or polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Particularly, oxalic acid, maleic acid, formic acid, acetic acid, propionic acid, citric acid, and the like are preferable. Moreover, a mixture of two or more acids may be used to keep the stability. The amount of the organic acid to be added may be 0.001 to 25 parts by mass, preferably 0.01 to 15 parts by mass, more preferably 0.1 to 5 parts by mass, based on 100 parts by mass of silicon contained in the composition.

Otherwise, the organic acid may be blended based on the pH of the composition so as to satisfy preferably $0 \leq pH \leq 7$, more preferably $0.3 \leq pH \leq 6.5$, further preferably $0.5 \leq pH \leq 6$.

(Water)

In the present invention, water may be added to the composition. When water is added, the polysiloxane compound in the composition is hydrated, so that the lithography performance is improved. The water content in the solvent component of the composition may be more than 0 mass % and less than 50 mass %, particularly preferably 0.3 to 30 mass %, further preferably 0.5 to 20 mass %.

When the organic acid and the water are each added in an amount in the above range, uniformity of the silicon-containing resist underlayer film is not degraded, there is no risk of repelling, and there is no risk of lithography performance being lowered.

The solvent including water is used in a total amount of preferably 100 to 100,000 parts by mass, particularly preferably 200 to 50,000 parts by mass, based on 100 parts by mass of the polysiloxane compound, which is the base polymer.
(Photo-Acid Generator)

In the present invention, a photo-acid generator other than the compound shown by the general formula (P-0) may be added to the composition. As the photo-acid generator used in the present invention, it is possible to add, specifically, the materials described in paragraphs (0160) to (0179) of JP 2009-126940 A.
(Stabilizer)

Further, in the present invention, a stabilizer can be added to the composition. As the stabilizer, a monohydric, dihydric, or polyhydric alcohol having a cyclic ether as a substituent can be added.

Particularly, adding stabilizers shown in paragraphs (0181) to (0182) of JP 2009-126940 A enables stability improvement of the composition for forming a silicon-containing resist underlayer film.
(Surfactant)

Further, in the present invention, a surfactant can be blended into the composition as necessary. Specifically, the materials described in paragraph (0185) of JP 2009-126940 A can be added as the surfactant.
(Other Components)

Further, in the present invention, a high-boiling-point solvent having a boiling point of 180° C. or more can also be added to the composition as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, and the like.
[Negative-Type Patterning Process]
(Negative-Type Patterning Process 1)

The present invention can provide a patterning process including:
forming an organic underlayer film on a body to be processed using a coating-type organic underlayer film material;
forming a silicon-containing resist underlayer film on the organic underlayer film using the composition for forming a silicon-containing resist underlayer film described above;
forming a photoresist film on the silicon-containing resist underlayer film using a chemically amplified resist composition;
exposing the photoresist film to a high-energy beam or the like after a heat treatment and dissolving an unexposed portion of the photoresist film using an organic solvent developer to form a negative-type pattern;
transferring the pattern to the silicon-containing resist underlayer film by dry etching using the photoresist film having the formed negative-type pattern as a mask;
transferring the pattern to the organic underlayer film by dry etching using the silicon-containing resist underlayer film having the transferred pattern as a mask; and
transferring the pattern to the body to be processed by dry etching using the organic underlayer film having the transferred pattern as a mask (what is called "multilayer resist method").
(Negative-Type Patterning Process 2)

Furthermore, the present invention can provide a patterning process including:
forming an organic hard mask mainly containing carbon on a body to be processed by a CVD method;
forming a silicon-containing resist underlayer film on the organic hard mask using the composition for forming a silicon-containing resist underlayer film described above;
forming a photoresist film on the silicon-containing resist underlayer film using a chemically amplified resist composition;
exposing the photoresist film to a high-energy beam or the like after a heat treatment and dissolving an unexposed portion of the photoresist film using an organic solvent developer to form a negative-type pattern;
transferring the pattern to the silicon-containing resist underlayer film by dry etching using the photoresist film having the formed negative-type pattern as a mask;
transferring the pattern to the organic hard mask by dry etching using the silicon-containing resist underlayer film having the transferred pattern as a mask; and
transferring the pattern to the body to be processed by dry etching using the organic hard mask having the transferred pattern as a mask (what is called "multilayer resist method").

When a negative-type pattern is formed using the resist underlayer film of the present invention, the combination with the CVD film or the organic underlayer film is optimized as described above, so that the pattern formed in the photoresist can be formed onto the substrate without changing the size during the transfer.

Furthermore, in the photoresist film exposure, the contact angle of the part of the silicon-containing resist underlayer film corresponding to the exposed portion of the exposed photoresist film is preferably lowered by 10 degrees or more after the exposure than before the exposure.

When the contact angle of the exposed portion of the silicon-containing resist underlayer film is lowered by 10 degrees or more compared to before the exposure, difference in contact angle with the resist pattern after the negative development becomes small, adhesiveness is improved, and pattern collapse is prevented so that fine patterns can be formed.

The silicon-containing resist underlayer film used in the inventive patterning process can be prepared on the body to be processed from the inventive composition for forming a silicon-containing resist underlayer film by a spin-coating method or the like as with the photoresist film. After spin-coating, the composition is preferably baked to evaporate the solvent to promote crosslinking reaction and prevent mixing with the photoresist film. A baking temperature in the range of 50 to 500° C. and a baking duration in the range of 10 to 300 seconds are favorably used. A particularly favorable temperature range depends on the structure of the device to be manufactured, but to reduce heat damage to the device, 400° C. or less is preferable.

Here, as the body to be processed, a semiconductor device substrate or a semiconductor device substrate having any of a metal film, an alloy film, a metal carbide film, a metal oxide film, a metal nitride film, a metal oxycarbide film, and a metal oxynitride film formed as the layer to be processed (portion to be processed) or the like can be used.

As the semiconductor device substrate, a silicon substrate is generally used, but the substrate is not particularly limited, and may have a different material to the layer to be processed, such as Si, amorphous silicon (a-Si), p-Si, $SiO_2$, SiN, SiON, W, TiN, or Al.

As the metal of the body to be processed, any of silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof can be used. A layer to be processed containing such metal includes a film of Si, $SiO_2$, SiN, SiON, SiOC, p-Si, α-Si, TiN, WSi, BPSG, SOG, Cr, CrO, CrON, MoSi, W, W—Si, Al, Cu, Al—Si, or the like, various low dielectric constant films, or an etching stopper film thereof can be used, for example. The layer can normally be formed with a thickness of 50 to 10,000 nm, in particular, 100 to 5,000 nm.

In the negative-type patterning process of the present invention, the photoresist film can be a chemically amplified type, and is not particularly limited as long as a negative-type pattern can be formed by a development with an organic solvent developer.

For example, when the exposure process in the present invention is an exposure process by ArF excimer laser beam, any resist composition for a normal ArF excimer laser beam can be used to form the photoresist film.

Many candidates for such a resist composition for an ArF excimer laser beam are already known, and the known resins are broadly divided into poly(meth)acrylic types, COMA (Cyclo Olefin Maleic Anhydride) types, COMA-(meth)acryl hybrid types, ROMP (Ring Opening Methathesis Polymerization) types, polynorbornene types, and the like. In particular, a resist composition containing a poly(meth)acrylic resin ensures etching resistance by introducing an alicyclic skeleton to a side chain, and therefore, resolution performance is more excellent than other types of resins.

In the negative-type patterning process, a silicon-containing resist underlayer film is formed, then a photoresist film is formed thereon with a photoresist composition solution, and as with the silicon-containing resist underlayer film the spin-coating method is favorably used. After spin-coating the photoresist composition, the composition is prebaked, and a temperature in the range of 80 to 180° C. and a duration in the range of 10 to 300 seconds are preferable. Subsequently, exposure is performed, and organic solvent development is performed to obtain a negative-type resist pattern. In addition, a post-exposure bake (PEB) is preferably performed after the exposure.

As the organic solvent developer, a developer containing one or more solvents selected from 2-octanone, 2-nonanone, 2-heptanone, 3-heptanone, 4-heptanone, 2-hexanone, 3-hexanone, diisobutyl ketone, methyl cyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobuthyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate as a component can be used. A developer having one type of developer component or a total of two or more types in an amount of 50 mass % or more is preferablly used from the viewpoint of improving pattern collapse or the like.

When using a silicon-containing resist underlayer film as an etching mask in the inventive patterning process, the etching can be performed using a gas mainly containing a fluorine-containing gas such as a fluorocarbon-based gas. To reduce film loss of the photoresist film, the silicon-containing resist underlayer film preferably has a high etching speed to the gas.

When an organic underlayer film is provided between the silicon-containing resist underlayer film and the body to be processed and the organic underlayer film is used as an etching mask of the body to be processed in such a multi-layer resist method, the organic underlayer film is preferably an organic film having an aromatic skeleton, but when the organic underlayer film is a sacrificial film or the like, the organic underlayer film may be a silicon-containing organic underlayer film as long as the silicon content is 15 mass % or less.

As such an organic underlayer film, a known organic underlayer film for a 3-layer resist method, an organic underlayer film known as an underlayer film for a 2-layer resist method using a silicon resist composition, a 4,4'-(9-fluorenylidene)bisphenol novolak resin (molecular weight 11,000) disclosed in JP 2005-128509 A, or various resins including novolak resins such as those known as resist underlayer film materials for a 2-layer resist method or a 3-layer resist method can be used. In addition, when a higher heat resistance than a normal novolak resin is desired, a polycyclic skeleton such as a 6,6'-(9-fluorenylidene)-di(2-naphthol)novolak resin can be introduced, and a polyimide resin may further be selected (see, for example, JP 2004-153125 A).

The organic underlayer film can be formed on the body to be processed using a composition solution by a spin-coating method or the like as with the photoresist composition. After forming the organic underlayer film by a spin-coating method or the like, the composition is preferably baked to evaporate the organic solvent. A baking temperature in the range of 80 to 300° C. and a baking duration in the range of 10 to 300 seconds are favorably used.

Note that the organic underlayer film preferably has a thickness of 5 nm or more, in particular, 20 nm or more, and 50,000 nm or less, and the silicon-containing resist underlayer film according to the present invention preferably has a thickness of 1 nm or more and 500 nm or less, more preferably 300 nm or less, and further preferably 200 nm or less, although the thicknesses are not particularly limited and vary depending on etching conditions. In addition, the photoresist film preferably has a thickness of 1 nm or more and 200 nm or less.

[Inventive Patterning Process by 3-Layer Resist Method]

The negative-type patterning process of the present invention by a 3-layer resist method as described above is as follows (see FIG. 1). In this process, firstly, an organic underlayer film 2 is prepared on a body to be processed 1 by spin-coating (FIG. 1 (I-A)). This organic underlayer film 2 preferably has a high etching resistance since the organic underlayer film 2 acts as a mask when etching the body to be processed 1, and the organic underlayer film 2 is preferably crosslinked by heat or acid after being formed by spin-coating since the organic underlayer film 2 is required not to mix with a silicon-containing resist underlayer film 3 to be formed thereon.

Then, the silicon-containing resist underlayer film 3 is formed thereon by spin-coating using the inventive composition for forming a silicon-containing resist underlayer film (FIG. 1 (I-B)), and a photoresist film 4 is formed thereon by spin-coating (FIG. 1 (I-C)). Note that the silicon-containing resist underlayer film 3 can be formed using a composition such that when the photoresist film 4 is exposed, the silicon-containing resist underlayer film 3 corresponding to the exposed portion has a contact angle with pure water of 40 degrees or more and less than 70 degrees after the exposure.

Using a mask 5, the photoresist film 4 is subjected to a usual pattern exposure using a light source P appropriate for the photoresist film 4, for example, KrF excimer laser beam, ArF excimer laser beam, $F_2$ laser beam, or EUV beam. A pattern can be formed preferably by any of a photolithography with a wavelength of 10 nm or more and 300 nm or less, direct drawing with electron beam, and nanoimprinting, or a combination thereof (FIG. 1 (I-D)). Thereafter, heat treatment is performed under a condition matching with the photoresist film (FIG. 1 (I-E)). After that, development (negative development) with an organic developer and then, if necessary, rinsing are performed, so that a negative-type resist pattern 4a can be obtained (FIG. 1 (I-F)). Note that in FIG. 1 (I-D), 4' is a portion of photoresist film 4 that was changed by the pattern exposure.

Next, using this negative-type resist pattern 4a as an etching mask, dry etching is performed, for example, with fluorine-based gas plasma, under a dry etching condition where the etching speed of the silicon-containing resist underlayer film 3 is significantly high relative to the photoresist film 4. As a result, a negative-type silicon-containing resist underlayer film pattern 3a can be obtained with little influence from pattern change due to the side etching of the photoresist film (FIG. 1 (I-G)).

Next, the organic underlayer film 2 is dry-etched under a dry etching condition where the etching speed of the organic underlayer film 2 is significantly high relative to the substrate having the negative-type silicon-containing resist underlayer film pattern 3a obtained by transferring the negative-type resist pattern 4a. The dry etching may be, for example, reactive dry etching with gas plasma containing oxygen, or reactive dry etching with gas plasma containing hydrogen and nitrogen. By this etching, a negative-type organic underlayer film pattern 2a is obtained, and the uppermost photoresist film is usually lost at the same time (FIG. 1 (I-H)). Then, using the negative-type organic underlayer film pattern 2a thus obtained as an etching mask, the body to be processed 1 is dry-etched, for example, by employing fluorine-based dry etching or chlorine-based dry etching. In this way, the body to be processed 1 can be etched precisely, thereby transferring a negative-type pattern 1a to the body to be processed 1 (FIG. 1 (I-I)).

Furthermore, in the patterning process by the 3-layer resist method, when the photoresist film 4 is exposed to form a pattern, not only the photoresist film 4 but also the silicon-containing resist underlayer film 3 formed underneath is also sometimes changed. Hereinafter, this will be described with reference to FIG. 2. Note that description will be omitted where it is the same as above.

A pattern is formed in the photoresist film 4 by a pattern exposure using the mask 5 (FIG. 2 (II-D)). Next, a heat treatment is performed, and for example, when a thermosetting silicon-containing material (Sx) contained in the silicon-containing resist underlayer film 3 has a protecting group, the protecting group of the thermosetting silicon-containing material contained in the silicon-containing resist underlayer film 3 formed underneath the photoresist film 4 is eliminated by the action of acid that is generated in the exposed portion of the photoresist film 4, and a hydrophilic group (hydroxy group, carboxy group, or the like) is generated. As a result, a portion 3' where the silicon-containing resist underlayer film 3 changed is formed underneath the portion 4' where the photoresist film 4 changed after the exposure (FIG. 2 (II-E)). The contact angle of this changed portion 3' to pure water becomes lower than the contact angle of the silicon-containing resist underlayer film 3 by the elimination of the protecting group (that is, the generation of the hydrophilic group). By using this change, the contact angle to pure water of the portion 3' of the silicon-containing resist underlayer film 3 that changed after the exposure corresponding to the exposed portion of the photoresist film 4 when the photoresist film 4 is exposed, can be set to 40 degrees or more and less than 70 degrees even when the contact angle of the silicon-containing resist underlayer film 3 itself is high.

The subsequent process can be performed as described above (FIG. 2 (II-F) to (II-I)).

In this manner, the contact angle of the changed portion 3' of the silicon-containing resist underlayer film 3 can be adjusted by the presence or absence of a protecting group of the thermosetting silicon-containing material contained in the silicon-containing resist underlayer film 3. In this way, the degree of freedom of the component of the composition for forming a silicon-containing resist underlayer film that can be used is raise, and in addition, the degree of freedom in development means can also be raised.

Note that, although a case where the thermosetting silicon-containing material has a protecting group that is removed by acid is described above, the protecting group can also be removed by the heat at the time of the exposure, there can be a change other than the removal of a protecting group, and there are no particular limitations. In addition, the mode of the change in the silicon-containing resist underlayer film 3 after exposure and patterning is also not particularly limited.

Furthermore, in the above-described process according to the 3-layer resist method, an organic hard mask formed by a CVD method is also applicable in place of the organic underlayer film 2. In this case also, the body to be processed can be processed by the same procedure as described above.

The inventive composition for forming a silicon-containing resist underlayer film makes it possible to form an upper layer resist pattern with favorable LWR and CDU, and also to form a semiconductor-device pattern on a substrate with high yield because of excellent dry etching selectivity relative to an upper layer resist and an underlayer organic film or an organic hard mask such as a CVD carbon film.

EXAMPLE

Hereinafter, the present invention will be specifically described with reference to Synthesis Examples, Examples, and Comparative Examples. However, the present invention is not limited to these descriptions. Note that, in the following examples, % means mass %, and the molecular weight measurement was carried out by GPC.

Synthesis of Silicon-Containing Polymer

Synthesis Example 1

To a mixture containing 200 g of methanol, 0.1 g of methanesulfonic acid and 60 g of deionized water, a mixture containing 17.0 g of Monomer 101, 53.3 g of Monomer 102, and 7.5 g of Monomer 130 was added and maintained at 40° C. for 12 hours to perform hydrolysis condensation. After completion of the reaction, 200 g of propylene glycol ethyl ether (PGEE) was added thereto. Then, by-produced alcohol was distilled off under reduced pressure. 1000 ml of ethyl acetate and 280 g of PGEE were added thereto and the resulting water layer was separated. Into the remaining organic layer, 100 ml of ion-exchanged water was added; and the resulting mixture was stirred, settled, and separated into the layers. This procedure was repeated three times. The remaining organic layer was concentrated under reduced pressure to obtain 480 g of the PGEE solution of the silicon-containing compound 1 (compound concentration of 10%). The molecular weight thereof was measured in terms of polystyrene and found Mw=2,400.

Synthesis Example 2 to Synthesis Example 55 were carried out under the same conditions as in Synthesis Example 1 by using the monomers (reaction raw materials for silicon-containing polymers) shown in Tables 1-1 and 1-2 to obtain the target products.

Synthesis Example 56

To a mixture containing 200 g of methanol, 0.1 g of 35% hydrochloric acid, and 60 g of deionized water, a mixture containing 6.8 g of Monomer 101, 60.9 g of Monomer 102, and 20.1 g of Monomer 149 was added and maintained at 40° C. for 12 hours to perform hydrolysis condensation. After completion of the reaction, 620 g of propylene glycol ethyl ether (PGEE) was added thereto. Then, by-produced alcohol was distilled off under reduced pressure to obtain 570 g of the PGEE solution of the silicon-containing compound 20 (compound concentration of 10%). The molecular weight thereof was measured in terms of polystyrene and found Mw=2,100.

Synthesis Example 57 to Synthesis Example 60 were carried out under the same conditions as in Synthesis Example 56 by using the monomers shown in Table 1-2 to obtain the target products.

TABLE 1-1

| Synthesis Example | Reaction Raw Material | Mw |
|---|---|---|
| 1 | Monomer 101: 17.0 g, Monomer 102: 53.3 g, Monomer 130: 7.5 g | 2400 |
| 2 | Monomer 100: 5.0 g, Monomer 101: 13.6 g, Monomer 102: 53.3 g, Monomer 131: 7.6 g | 2700 |
| 3 | Monomer 100: 5.0 g, Monomer 101: 13.6 g, Monomer 102: 53.3 g, Monomer 132: 7.9 g | 2700 |
| 4 | Monomer 100: 5.0 g, Monomer 101: 13.6 g, Monomer 102: 53.3 g, Monomer 133: 6.5 g | 2200 |
| 5 | Monomer 100: 5.0 g, Monomer 101: 13.6 g, Monomer 102: 53.3 g, Monomer 134: 6.9 g | 2600 |
| 6 | Monomer 101: 17.0 g, Monomer 102: 53.3 g, Monomer 135: 6.4 g | 2700 |
| 7 | Monomer 100: 5.0 g, Monomer 101: 13.6 g, Monomer 102: 53.3 g, Monomer 136: 6.8 g | 2600 |
| 8 | Monomer 101: 13.6 g, Monomer 102: 53.3 g, Monomer 137: 15.7 g | 2400 |
| 9 | Monomer 101: 13.6 g, Monomer 102: 53.3 g, Monomer 138: 13.1 g | 2600 |
| 10 | Monomer 101: 13.6 g, Monomer 102: 53.3 g, Monomer 139: 14.8 g | 2500 |
| 11 | Monomer 101: 13.6 g, Monomer 102: 53.3 g, Monomer 140: 13.9 g | 2400 |
| 12 | Monomer 101: 13.6 g, Monomer 102: 53.3 g, Monomer 141: 10.4 g | 2700 |
| 13 | Monomer 101: 13.6 g, Monomer 102: 53.3 g, Monomer 142: 20.8 g | 2200 |
| 14 | Monomer 101: 13.6 g, Monomer 102: 53.3 g, Monomer 143: 19.1 g | 2400 |
| 15 | Monomer 101: 13.6 g, Monomer 102: 53.3 g, Monomer 144: 9.0 g | 2300 |
| 16 | Monomer 101: 13.6 g, Monomer 102: 53.3 g, Monomer 145: 13.2 g | 2300 |
| 17 | Monomer 101: 13.6 g, Monomer 102: 53.3 g, Monomer 146: 12.7 g | 2800 |
| 18 | Monomer 101: 13.6 g, Monomer 102: 53.3 g, Monomer 147: 13.3 g | 2900 |
| 19 | Monomer 101: 13.6 g, Monomer 102: 53.3 g, Monomer 148: 12.1 g | 2800 |
| 20 | Monomer 101: 17.0 g, Monomer 102: 45.7 g, Monomer 154: 21.6 g | 2800 |
| 21 | Monomer 101: 17.0 g, Monomer 102: 45.7 g, Monomer 155: 20.3 g | 2800 |
| 22 | Monomer 101: 17.0 g, Monomer 102: 45.7 g, Monomer 156: 20.3 g | 2300 |
| 23 | Monomer 101: 17.0 g, Monomer 102: 45.7 g, Monomer 157: 23.4 g | 2700 |
| 24 | Monomer 101: 17.0 g, Monomer 102: 45.7 g, Monomer 158: 23.6 g | 2200 |
| 25 | Monomer 101: 20.4 g, Monomer 102: 38.1 g, Monomer 159: 27 g | 2700 |
| 26 | Monomer 101: 20.4 g, Monomer 102: 38.1 g, Monomer 160: 34.3 g | 2200 |
| 27 | Monomer 101: 20.4 g, Monomer 102: 38.1 g, Monomer 161: 26.7 g, Monomer 170: 8.4 g | 2000 |
| 28 | Monomer 101: 20.4 g, Monomer 102: 38.1 g, Monomer 162: 19.1 g, Monomer 170: 8.4 g | 2300 |
| 29 | Monomer 101: 20.4 g, Monomer 102: 38.1 g, Monomer 163: 20.0 g, Monomer 170: 8.4 g | 2400 |
| 30 | Monomer 101: 13.6 g, Monomer 102: 53.3 g, Monomer 140: 7.0 g, Monomer 111: 7.0 g | 2800 |
| 31 | Monomer 101: 13.6 g, Monomer 102: 53.3 g, Monomer 130: 7.5 g, Monomer 111: 7.0 g | 2300 |
| 32 | Monomer 101: 13.6 g, Monomer 102: 53.3 g, Monomer 140: 7.0 g, Monomer 114: 6.2 g | 2200 |
| 33 | Monomer 101: 13.6 g, Monomer 102: 53.3 g, Monomer 144: 4.5 g, Monomer 111: 7.0 g | 2300 |
| 34 | Monomer 101: 13.6 g, Monomer 102: 53.3 g, Monomer 151: 6.6 g, Monomer 116: 8.9 g | 2400 |
| 35 | Monomer 101: 13.6 g, Monomer 102: 53.3 g, Monomer 134: 6.9 g, Monomer 114: 6.2 g | 2600 |
| 36 | Monomer 101: 10.2 g, Monomer 102: 53.3 g, Monomer 133: 13.0 g, Monomer 115: 5.1 g | 2200 |

TABLE 1-1-continued

| Synthesis Example | Reaction Raw Material | Mw |
|---|---|---|
| 37 | Monomer 101: 10.2 g, Monomer 102: 53.3 g, Monomer 138: 13.1 g, Monomer 113: 7.3 g | 2200 |
| 38 | Monomer 101: 10.2 g, Monomer 102: 53.3 g, Monomer 139: 14.8 g, Monomer 113: 7.3 g | 2500 |
| 39 | Monomer 101: 10.2 g, Monomer 102: 53.3 g, Monomer 159: 13.5 g, Monomer 113: 7.3 g | 2400 |
| 40 | Monomer 101: 10.2 g, Monomer 102: 53.3 g, Monomer 157: 15.6 g, Monomer 110: 5.9 g | 2600 |
| 41 | Monomer 101: 10.2 g, Monomer 102: 53.3 g, Monomer 146: 12.7 g, Monomer 110: 5.9 g | 3000 |
| 42 | Monomer 101: 10.2 g, Monomer 102: 53.3 g, Monomer 144: 9.0 g, Monomer 113: 7.3 g | 2800 |
| 43 | Monomer 101: 10.2 g, Monomer 102: 53.3 g, Monomer 158: 15.7 g, Monomer 111: 7.0 g | 2000 |
| 44 | Monomer 101: 10.2 g, Monomer 102: 53.3 g, Monomer 144: 9.0 g, Monomer 110: 5.9 g | 2900 |

TABLE 1-2

| Synthesis Example | Reaction Raw Material | Mw |
|---|---|---|
| 45 | Monomer 101: 10.2 g, Monomer 102: 53.3 g, Monomer 158: 15.7 g, Monomer 116: 8.9 g | 2600 |
| 46 | Monomer 101: 6.8 g, Monomer 102: 53.3 g, Monomer 135: 19.2 g, Monomer 112: 6.6 g | 2000 |
| 47 | Monomer 101: 6.8 g, Monomer 102: 53.3 g, Monomer 146: 19.1 g, Monomer 116: 8.9 g | 2300 |
| 48 | Monomer 101: 6.8 g, Monomer 102: 53.3 g, Monomer 143: 28.7 g, Monomer 112: 6.6 g | 2500 |
| 49 | Monomer 101: 6.8 g, Monomer 102: 53.3 g, Monomer 133: 19.5 g, Monomer 110: 5.9 g | 2100 |
| 50 | Monomer 101: 6.8 g, Monomer 102: 53.3 g, Monomer 150: 19.4 g, Monomer 111: 7.0 g | 2500 |
| 51 | Monomer 101: 6.8 g, Monomer 102: 53.3 g, Monomer 150: 19.4 g, Monomer 116: 8.9 g | 2900 |
| 52 | Monomer 101: 6.8 g, Monomer 102: 53.3 g, Monomer 133: 19.5 g, Monomer 114: 6.2 g | 2400 |
| 53 | Monomer 101: 6.8 g, Monomer 102: 53.3 g, Monomer 147: 20.0 g, Monomer 111: 7.0 g | 2500 |
| 54 | Monomer 101: 6.8 g, Monomer 102: 53.3 g, Monomer 143: 28.7 g, Monomer 111: 7.0 g | 2700 |
| 55 | Monomer 101: 6.8 g, Monomer 102: 53.3 g, Monomer 146: 19.1 g, Monomer 111: 7.0 g | 2800 |
| 56 | Monomer 101: 6.8 g, Monomer 102: 60.9 g, Monomer 149: 20.1 g | 2100 |
| 57 | Monomer 101: 6.8 g, Monomer 102: 60.9 g, Monomer 150: 12.9 g | 2500 |
| 58 | Monomer 101: 6.8 g, Monomer 102: 60.9 g, Monomer 151: 13.2 g | 2000 |
| 59 | Monomer 101: 6.8 g, Monomer 102: 60.9 g, Monomer 152: 15.9 g | 2200 |
| 60 | Monomer 101: 6.8 g, Monomer 102: 60.9 g, Monomer 153: 14.7 g | 2000 |

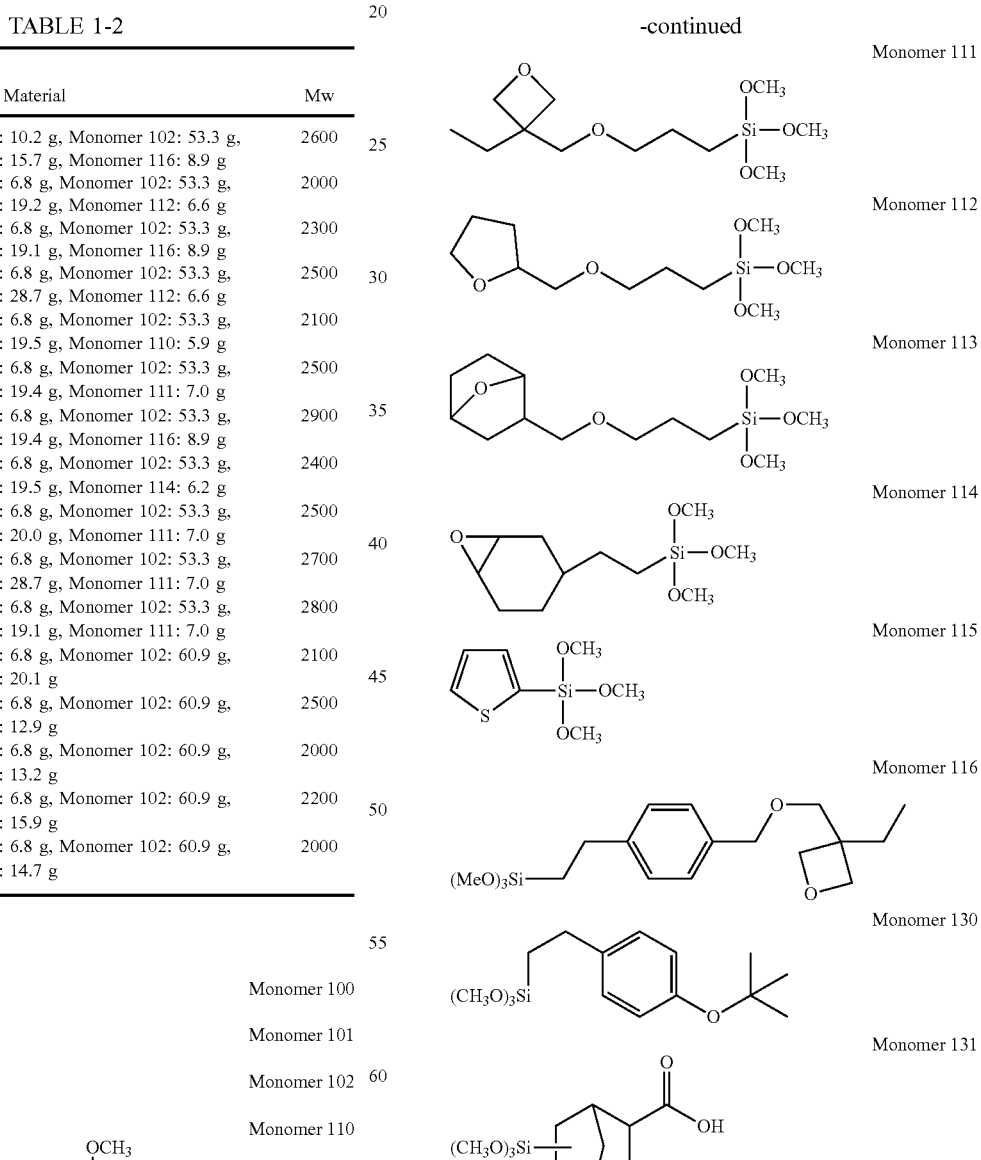

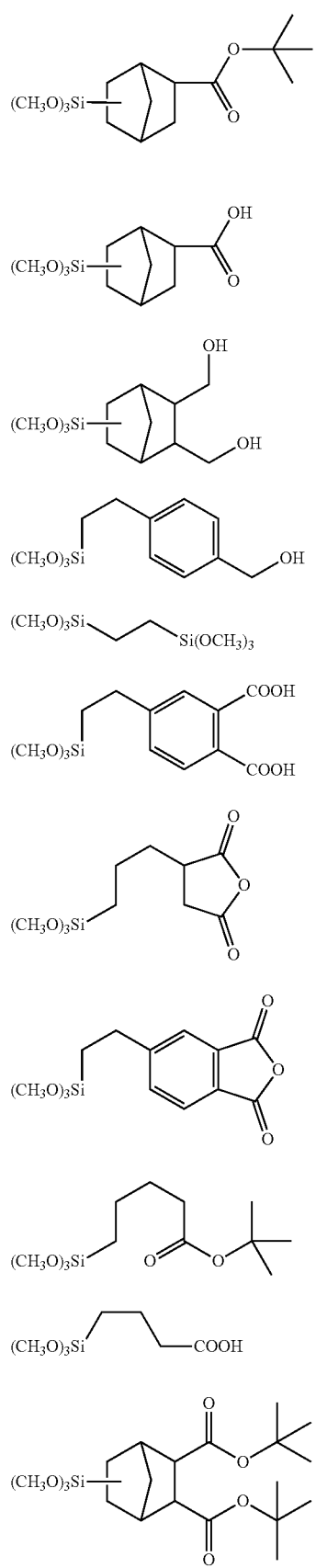

-continued

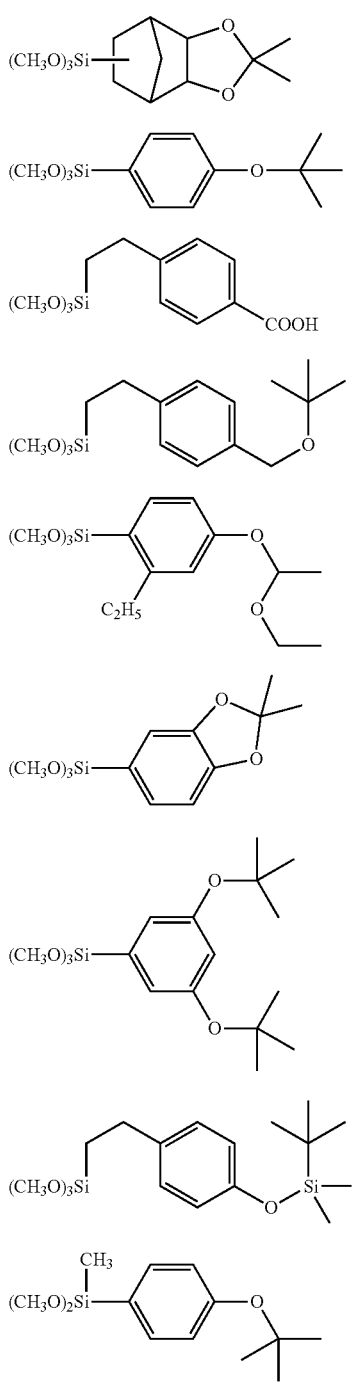

Monomer 154
Monomer 155
Monomer 156
Monomer 157
Monomer 158
Monomer 159
Monomer 160
Monomer 161
Monomer 162

-continued

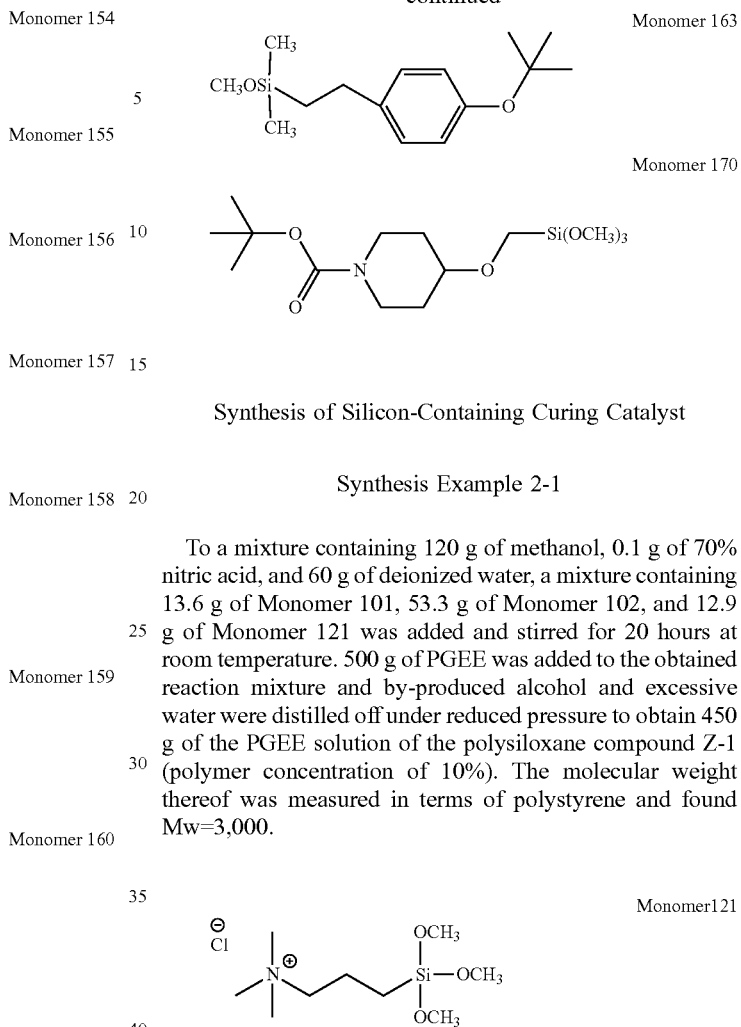

Monomer 163
Monomer 170
Monomer 121

Synthesis of Silicon-Containing Curing Catalyst

Synthesis Example 2-1

To a mixture containing 120 g of methanol, 0.1 g of 70% nitric acid, and 60 g of deionized water, a mixture containing 13.6 g of Monomer 101, 53.3 g of Monomer 102, and 12.9 g of Monomer 121 was added and stirred for 20 hours at room temperature. 500 g of PGEE was added to the obtained reaction mixture and by-produced alcohol and excessive water were distilled off under reduced pressure to obtain 450 g of the PGEE solution of the polysiloxane compound Z-1 (polymer concentration of 10%). The molecular weight thereof was measured in terms of polystyrene and found Mw=3,000.

Examples and Comparative Examples

Silicon-Containing Compounds 1 to 60 obtained in the Synthesis Example, heat-curing catalysts, additives, photo-acid generators shown in Table 3 (compounds shown by the general formula (P-0) or the like), solvents, and water were mixed at ratios shown in Tables 2-1 to 2-4. Each mixture was filtered through a 0.1 μm filter made of fluorinated resin. Thus, composition solutions for forming a silicon-containing resist underlayer film were prepared and referred to as Sol. 1 to 77.

TABLE 2-1

| Sol. No. | Silicon-containing compound (parts by mass) | Heat-curing catalyst (parts by mass) | Additive (parts by mass) | Photo-acid generator (parts by mass) | Solvent (parts by mass) | Water (parts by mass) |
|---|---|---|---|---|---|---|
| 1 | 1 (1.0) | TPSNO$_3$ (0.01) | Maleic acid (0.01) | PAG-1 (0.01) | PGEE (150) | Water (15) |
| 2 | 2 (1.0) | TPSNO$_3$ (0.01) | Maleic acid (0.01) | PAG-6 (0.01) | PGEE (150) | Water (15) |
| 3 | 3 (1.0) | TPSNO$_3$ (0.01) | Maleic acid (0.01) | PAG-7 (0.01) | PGEE (150) | Water (15) |

TABLE 2-1-continued

| Sol. No. | Silicon-containing compound (parts by mass) | Heat-curing catalyst (parts by mass) | Additive (parts by mass) | Photo-acid generator (parts by mass) | Solvent (parts by mass) | Water (parts by mass) |
|---|---|---|---|---|---|---|
| 4 | 4 (1.0) | TPSNO$_3$ (0.01) | Maleic acid (0.01) | PAG-8 (0.01) | PGEE (150) | Water (15) |
| 5 | 5 (1.0) | TPSNO$_3$ (0.01) | Maleic acid (0.01) | PAG-9 (0.01) | PGEE (150) | Water (15) |
| 6 | 6 (1.0) | TPSNO$_3$ (0.01) | Maleic acid (0.01) | PAG-10 (0.01) | PGEE (150) | Water (15) |
| 7 | 7 (1.0) | TPSNO$_3$ (0.01) | Maleic acid (0.01) | PAG-11 (0.01) | PGEE (150) | Water (15) |
| 8 | 1 (1.0) | QBANO$_3$ (0.01) | Maleic acid (0.01) | PAG-12 (0.01) | PGEE (150) | Water (15) |
| 9 | 2 (1.0) | QBANO$_3$ (0.01) | Maleic acid (0.01) | PAG-12 (0.01) | PGEE (150) | Water (15) |
| 10 | 3 (1.0) | QBANO$_3$ (0.01) | Maleic acid (0.01) | PAG-1 (0.01) | PGEE (150) | Water (15) |
| 11 | 4 (1.0) | QBANO$_3$ (0.01) | Maleic acid (0.01) | PAG-2 (0.01) | PGEE (150) | Water (15) |
| 12 | 5 (1.0) | QBANO$_3$ (0.01) | Maleic acid (0.01) | PAG-3 (0.01) | PGEE (150) | Water (15) |
| 13 | 6 (1.0) | QBANO$_3$ (0.01) | Maleic acid (0.01) | PAG-4 (0.01) | PGEE (150) | Water (15) |
| 14 | 7 (1.0) | QBANO$_3$ (0.01) | Maleic acid (0.01) | PAG-5 (0.01) | PGEE (150) | Water (15) |
| 15 | 1 (1.0) | QBANO3 (0.01) | Maleic acid (0.01) | PAG-13 (0.01) | PGEE (150) | Water (15) |
| 16 | 1 (1.0) | TPSMA (0.01) | Maleic acid (0.01) | PAG-14 (0.01) | PGEE (150) | Water (15) |
| 17 | 1 (1.0) | TPSNO$_3$ (0.01) | Maleic acid (0.01) | PAG-15 (0.01) | PGEE (150) | Water (15) |
| 18 | 8 (1.0) | TPSNO$_3$ (0.01) | Maleic acid (0.01) | PAG-12 (0.01) | PGEE (450) | Water (45) |
| 19 | 9 (1.0) | TPSNO$_3$ (0.01) | Maleic acid (0.01) | PAG-1 (0.01) | PGEE (450) | Water (45) |
| 20 | 10 (1.0) | TPSNO$_3$ (0.01) | Maleic acid (0.01) | PAG-2 (0.01) | PGEE (450) | Water (45) |
| 21 | 11 (1.0) | TPSNO$_3$ (0.01) | Maleic acid (0.01) | PAG-3 (0.01) | PGEE (450) | Water (45) |
| 22 | 12 (1.0) | TPSNO$_3$ (0.01) | Maleic acid (0.01) | PAG-4 (0.01) | PGEE (450) | Water (45) |
| 23 | 13 (1.0) | TPSNO$_3$ (0.01) | Maleic acid (0.01) | PAG-5 (0.01) | PGEE (450) | Water (45) |
| 24 | 14 (1.0) | TPSNO$_3$ (0.01) | Maleic acid (0.01) | PAG-6 (0.01) | PGEE (450) | Water (45) |
| 25 | 15 (1.0) | TPSNO$_3$ (0.01) | Maleic acid (0.01) | PAG-7 (0.01) | PGEE (450) | Water (45) |

TABLE 2-2

| Sol. No. | Silicon-containing compound (parts by mass) | Heat-curing catalyst (parts by mass) | Additive (parts by mass) | Photo-acid generator (parts by mass) | Solvent (parts by mass) | Water (parts by mass) |
|---|---|---|---|---|---|---|
| 26 | 16 (1.0) | TPSNO$_3$ (0.01) | Maleic acid (0.01) | PAG-8 (0.01) | PGEE (450) | Water (45) |
| 27 | 17 (1.0) | TPSNO$_3$ (0.01) | Maleic acid (0.01) | PAG-9 (0.01) | PGEE (450) | Water (45) |
| 28 | 18 (1.0) | TPSNO$_3$ (0.01) | Maleic acid (0.01) | PAG-10 (0.01) | PGEE (450) | Water (45) |
| 29 | 19 (1.0) | TPSNO$_3$ (0.01) | Maleic acid (0.01) | PAG-11 (0.01) | PGEE (450) | Water (45) |
| 30 | 20 (1.0) | TPSNO$_3$ (0.01) | Maleic acid (0.01) | PAG-12 (0.01) | PGEE (450) | Water (45) |
| 31 | 21 (1.0) | TPSMA (0.01) | Maleic acid (0.01) | PAG-2 (0.01) | PGEE (450) | Water (45) |
| 32 | 21 (1.0) | QBANO$_3$ (0.04) | Maleic acid (0.01) | PAG-3 (0.01) | PGEE (450) | Water (45) |
| 33 | 21 (1.0) | TPSTFA (0.04) | Maleic acid (0.01) | PAG-4 (0.01) | PGEE (450) | Water (45) |
| 34 | 21 (1.0) | QMAMA (0.04) | Maleic acid (0.01) | PAG-5 (0.01) | PGEE (450) | Water (45) |
| 35 | 21 (1.0) | TPSNO$_3$ (0.01) | Maleic acid (0.01) | PAG-1 (0.01) | PGEE (450) | Water (45) |

TABLE 2-2-continued

| Sol. No. | Silicon-containing compound (parts by mass) | Heat-curing catalyst (parts by mass) | Additive (parts by mass) | Photo-acid generator (parts by mass) | Solvent (parts by mass) | Water (parts by mass) |
|---|---|---|---|---|---|---|
| 36 | 22 (1.0) | TPSNO$_3$ (0.01) | Maleic acid (0.01) | PAG-2 (0.01) | PGEE (450) | Water (45) |
| 37 | 23 (1.0) | TPSNO$_3$ (0.01) | Maleic acid (0.01) | PAG-3 (0.01) | PGEE (450) | Water (45) |
| 38 | 24 (1.0) | TPSNO$_3$ (0.01) | Maleic acid (0.01) | PAG-4 (0.01) | PGEE (450) | Water (45) |
| 39 | 25 (1.0) | TPSNO$_3$ (0.01) | Maleic acid (0.01) | PAG-5 (0.01) | PGEE (450) | Water (45) |
| 40 | 26 (1.0) | TPSNO$_3$ (0.01) | Maleic acid (0.01) | PAG-6 (0.01) | PGEE (450) | Water (45) |
| 41 | 27 (1.0) | TPSNO$_3$ (0.01) | Maleic acid (0.01) | PAG-7 (0.01) | PGEE (450) | Water (45) |
| 42 | 28 (1.0) | TPSNO$_3$ (0.01) | Maleic acid (0.01) | PAG-8 (0.01) | PGEE (450) | Water (45) |
| 43 | 29 (1.0) | TMPANO$_3$ (0.01) | Maleic acid (0.01) | PAG-9 (0.01) | PGEE (450) | Water (45) |
| 44 | 30 (1.0) | TMPANO$_3$ (0.01) | Maleic acid (0.01) | PAG-10 (0.01) | PGEE (450) | Water (45) |
| 45 | 31 (1.0) | QBANO$_3$ (0.01) | Maleic acid (0.01) | PAG-6 (0.01) | PGEE (450) | Water (45) |
| 46 | 32 (1.0) | QBANO$_3$ (0.01) | Maleic acid (0.01) | PAG-7 (0.01) | PGEE (450) | Water (45) |
| 47 | 33 (1.0) | QBANO$_3$ (0.01) | Maleic acid (0.01) | PAG-8 (0.01) | PGEE (450) | Water (45) |
| 48 | 34 (1.0) | QBANO$_3$ (0.01) | Maleic acid (0.01) | PAG-9 (0.01) | PGEE (450) | Water (45) |
| 49 | 35 (1.0) | QBANO$_3$ (0.01) | Maleic acid (0.01) | PAG-10 (0.01) | PGEE (450) | Water (45) |
| 50 | 36 (1.0) | QBANO$_3$ (0.01) | Maleic acid (0.01) | PAG-11 (0.01) | PGEE (450) | Water (45) |

TABLE 2-3

| Sol. No. | Silicon-containing compound (parts by mass) | Heat-curing catalyst (parts by mass) | Additive (parts by mass) | Photo-acid generator (parts by mass) | Solvent (parts by mass) | Water (parts by mass) |
|---|---|---|---|---|---|---|
| 51 | 37 (1.0) | QBANO$_3$ (0.01) | Maleic acid (0.01) | PAG-12 (0.01) | PGEE (450) | Water (45) |
| 52 | 38 (1.0) | QBANO$_3$ (0.01) | Maleic acid (0.01) | PAG-1 (0.01) | PGEE (450) | Water (45) |
| 53 | 39 (1.0) | QBANO$_3$ (0.01) | Maleic acid (0.01) | PAG-2 (0.01) | PGEE (450) | Water (45) |
| 54 | 40 (1.0) | QBANO$_3$ (0.01) | Maleic acid (0.01) | PAG-3 (0.01) | PGEE (450) | Water (45) |
| 55 | 41 (1.0) | QBANO$_3$ (0.01) | Maleic acid (0.01) | PAG-4 (0.01) | PGEE (450) | Water (45) |
| 56 | 42 (1.0) | QBANO$_3$ (0.01) | Maleic acid (0.01) | PAG-5 (0.01) | PGEE (450) | Water (45) |
| 57 | 43 (1.0) | QBANO$_3$ (0.01) | Maleic acid (0.01) | PAG-6 (0.01) | PGEE (450) | Water (45) |
| 58 | 44 (1.0) | QBANO$_3$ (0.01) | Maleic acid (0.01) | PAG-7 (0.01) | PGEE (450) | Water (45) |
| 59 | 45 (1.0) | QBANO$_3$ (0.01) | Maleic acid (0.01) | PAG-8 (0.01) | PGEE (450) | Water (45) |
| 60 | 46 (1.0) | QBANO$_3$ (0.01) | Maleic acid (0.01) | PAG-9 (0.01) | PGEE (450) | Water (45) |
| 61 | 47 (1.0) | QBANO$_3$ (0.01) | Maleic acid (0.01) | PAG-10 (0.01) | PGEE (450) | Water (45) |
| 62 | 48 (1.0) | QBANO$_3$ (0.01) | Maleic acid (0.01) | PAG-11 (0.01) | PGEE (450) | Water (45) |
| 63 | 49 (1.0) | QBANO$_3$ (0.01) | Maleic acid (0.01) | PAG-12 (0.01) | PGEE (450) | Water (45) |
| 64 | 50 (1.0) | QBANO$_3$ (0.01) | Maleic acid (0.01) | PAG-1 (0.01) | PGEE (450) | Water (45) |
| 65 | 51 (1.0) | QBANO$_3$ (0.01) | Maleic acid (0.01) | PAG-2 (0.01) | PGEE (450) | Water (45) |
| 66 | 52 (1.0) | QBANO$_3$ (0.01) | Maleic acid (0.01) | PAG-3 (0.01) | PGEE (450) | Water (45) |
| 67 | 53 (1.0) | QBANO$_3$ (0.01) | Maleic acid (0.01) | PAG-4 (0.01) | PGEE (450) | Water (45) |

TABLE 2-3-continued

| Sol. No. | Silicon-containing compound (parts by mass) | Heat-curing catalyst (parts by mass) | Additive (parts by mass) | Photo-acid generator (parts by mass) | Solvent (parts by mass) | Water (parts by mass) |
|---|---|---|---|---|---|---|
| 68 | 54 (1.0) | QBANO$_3$ (0.01) | Maleic acid (0.01) | PAG-5 (0.01) | PGEE (450) | Water (45) |
| 69 | 55 (1.0) | QBANO$_3$ (0.01) | Maleic acid (0.01) | PAG-6 (0.01) | PGEE (450) | Water (45) |
| 70 | 56 (1.0) | QBANO$_3$ (0.01) | Maleic acid (0.01) | PAG-7 (0.01) | PGEE (450) | Water (45) |
| 71 | 57 (1.0) | QBANO$_3$ (0.01) | Maleic acid (0.01) | PAG-8 (0.01) | PGEE (450) | Water (45) |
| 72 | 58 (1.0) | QBANO$_3$ (0.01) | Maleic acid (0.01) | PAG-9 (0.01) | PGEE (450) | Water (45) |
| 73 | 59 (1.0) | QBANO$_3$ (0.01) | Maleic acid (0.01) | PAG-10 (0.01) | PGEE (450) | Water (45) |
| 74 | 60 (1.0) | Z-1 (0.01) | Maleic acid (0.01) | PAG-11 (0.01) | PGEE (450) | Water (45) |

TABLE 2-4

| Sol. No. | Silicon-containing compound (parts by mass) | Heat-curing catalyst (parts by mass) | Additive (parts by mass) | Photo-acid generator (parts by mass) | Solvent (parts by mass) | Water (parts by mass) |
|---|---|---|---|---|---|---|
| 75 | 19 (1.0) | QBANO$_3$ (0.01) | Maleic acid (0.01) | PAG-13 (0.01) | PGEE (450) | Water (45) |
| 76 | 19 (1.0) | TPSMA (0.01) | Maleic acid (0.01) | PAG-14 (0.01) | PGEE (450) | Water (45) |
| 77 | 19 (1.0) | TPSNO$_3$ (0.01) | Maleic acid (0.01) | PAG-15 (0.01) | PGEE (450) | Water (45) |

TPSNO$_3$ triphenylsulfonium nitrate
TMPANO$_3$: trimethylphenylammonium nitrate
TPSMA mono(triphenylsulfonium)maleate
QBANO$_3$ tetrabutylammonium nitrate
TPSTFA triphenylsulfonium trifluoroacetate
QMAMA mono(tetramethylammonium)maleate
PGEE propylene glycol ethyl ether

TABLE 3

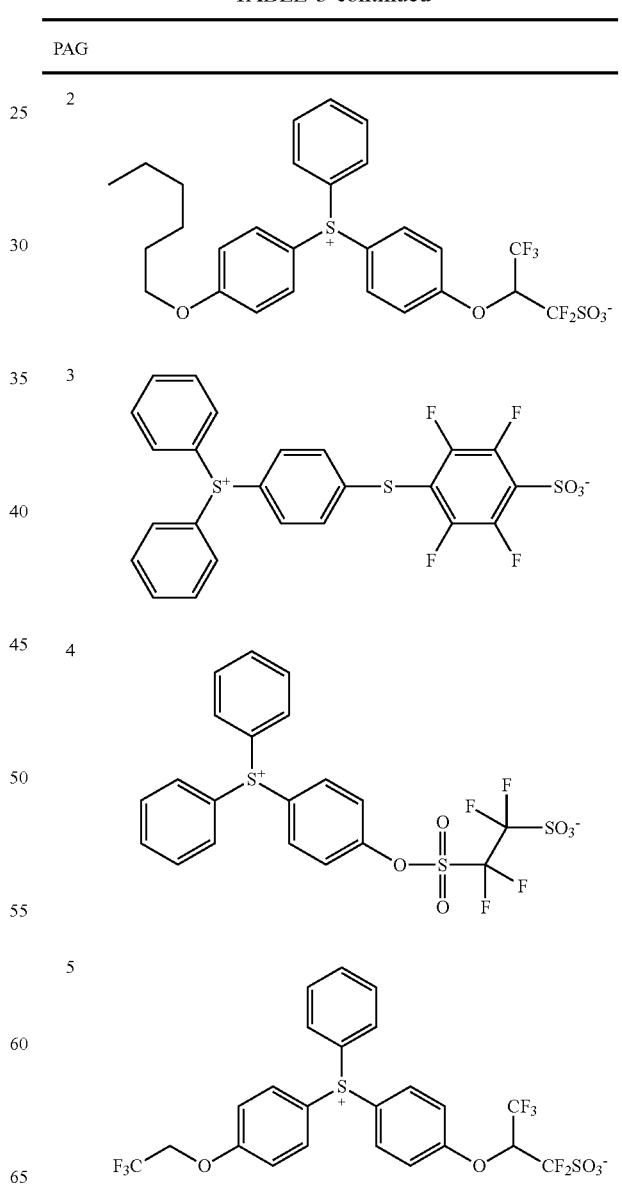

PAG
1

TABLE 3-continued

PAG
2

3

4

5

TABLE 3-continued

| PAG | |
|---|---|
| 6 | (structure) |
| 7 | (structure) |
| 8 | (structure) |
| 9 | (structure) |
| 10 | (structure) |
| 11 | (structure) |
| 12 | (structure) |
| 13 | (structure) |
| 14 | (structure) |
| 15 | (structure) |

Patterning Test by ArF Exposure and Negative-Type Development

A spin-on carbon film ODL-301 (carbon content of 88 mass %) available from Shin-Etsu Chemical Co., Ltd., was formed with a thickness of 200 nm on a silicon wafer. The composition for forming a silicon-containing resist underlayer film Sols. 1 to 17 were applied thereon and heated at 240° C. for 60 seconds to prepare silicon-containing films: Film 1 to 17 having a film thickness of 35 nm.

Subsequently, an ArF resist solution for negative development shown in Table 4 (PR-A1 and PR-A2) was applied onto the silicon-containing film and baked at 100° C. for 60 seconds to form a photoresist layer with a thickness of 100 nm. A liquid immersion top coat (TC-1) was applied onto the photoresist film and baked at 90° C. for 60 seconds to form a top coat with a thickness of 50 nm.

An ArF resist solution for negative development shown in Table 4 (PR-A3) was separately applied onto the silicon-containing film and baked at 100° C. for 60 seconds to form a photoresist layer with a thickness of 100 nm.

Subsequently, this was exposed with an ArF liquid immersion exposure apparatus (NSR-S610C manufactured by Nikon Corporation, NA: 1.30, σ: 0.98/0.65, 35° polarized dipole illumination, 6% halftone phase shift mask), followed by baking (PEB) at 100° C. for 60 seconds. With rotating at 30 rpm, a developer of butyl acetate was discharged from a developer nozzle for 3 seconds. Then the rotation was stopped to perform puddle-development for 27 seconds, spin-drying was performed after rinsing with diisoamyl ether, and baking was performed at 100° C. for 20 seconds to evaporate the rinse solvent.

By this patterning, a negative-type line-and-space pattern of 43 nm was obtained. The cross-sectional profile of the obtained pattern was measured by an electron microscope (S-4700) manufactured by Hitachi, Ltd. and the pattern roughness (LWR) was measured by an electron microscope (CG4000) manufactured by Hitachi High-Technologies Corp. (Tables 6-1 and 6-2).

TABLE 4

| PR | Polymer (parts by mass) | Acid generator (parts by mass) | Base (parts by mass) | Water-repellent polymer (parts by mass) | Solvent (parts by mass) |
|---|---|---|---|---|---|
| PR-A1 | PRP-A1 (100) | PAG1 (7.0) | Quencher (1.0) | None | PGMEA (2,500) |
| PR-A2 | PRP-A2 (100) | PAG1 (7.0) | Quencher (1.0) | None | PGMEA (2,500) |
| PR-A3 | PRP-A2 (100) | PAG1 (10.0) | Quencher (2.0) | Water-repellent polymer 1 (4.0) | PGMEA (2,500) |

Polymer for a resist: PRP-A1
  Molecular weight (Mw)=8,600
  Dispersity (Mw/Mn)=1.88

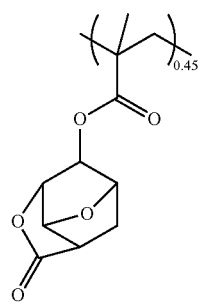

Polymer for a resist: PRP-A2
  Molecular weight (Mw)=8,900
  Dispersity (Mw/Mn)=1.93

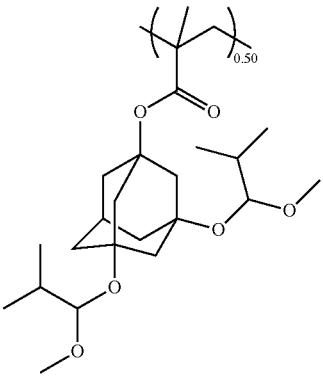

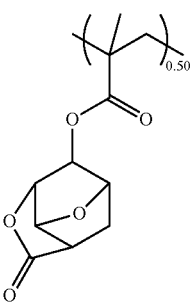

Acid generator: PAG 1 (shown in Table 4)

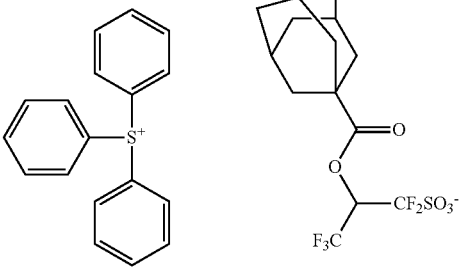

Base: Quencher

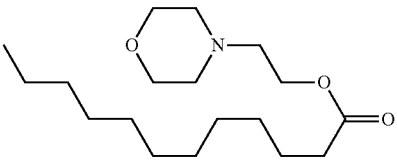 [SMILES: CCCCCCCCCCCC(=O)OCCN1CCOCC1]

The liquid immersion top coat (TC-1) was prepared by dissolving a resin of the composition shown in Table 5 in a solvent and filtering through a 0.1 μm filter made of fluorinated resin.

Top coat polymer
  Molecular weight (Mw)=8,800
  Dispersity (Mw/Mn)=1.69

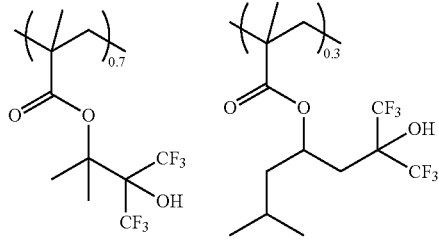

TABLE 5

| | Polymer (parts by mass) | Organic solvent (parts by mass) |
|---|---|---|
| TC-1 | Top coat polymer (100) | Diisoamyl ether (2700) 2-methyl-1-butanol (270) |

TABLE 6-1

| Example | Silicon-containing resist underlayer film | ArF resist | Pattern sectional profile after development | LWR |
|---|---|---|---|---|
| Example 1-1 | Film 1 | PR-A1 | Vertical profile | 1.6 |
| Example 1-2 | Film 2 | PR-A1 | Vertical profile | 1.7 |
| Example 1-3 | Film 3 | PR-A1 | Vertical profile | 1.6 |
| Example 1-4 | Film 4 | PR-A1 | Vertical profile | 1.7 |
| Example 1-5 | Film 5 | PR-A1 | Vertical profile | 1.6 |
| Example 1-6 | Film 6 | PR-A1 | Vertical profile | 1.6 |
| Example 1-7 | Film 7 | PR-A1 | Vertical profile | 1.6 |
| Example 1-8 | Film 8 | PR-A1 | Vertical profile | 1.6 |
| Example 1-9 | Film 9 | PR-A1 | Vertical profile | 1.6 |
| Example 1-10 | Film 10 | PR-A1 | Vertical profile | 1.7 |
| Example 1-11 | Film 11 | PR-A1 | Vertical profile | 1.6 |
| Example 1-12 | Film 12 | PR-A1 | Vertical profile | 1.6 |
| Example 1-13 | Film 13 | PR-A1 | Vertical profile | 1.7 |
| Example 1-14 | Film 14 | PR-A1 | Vertical profile | 1.7 |
| Example 1-15 | Film 1 | PR-A2 | Vertical profile | 1.6 |
| Example 1-16 | Film 2 | PR-A2 | Vertical profile | 1.6 |
| Example 1-17 | Film 3 | PR-A2 | Vertical profile | 1.7 |
| Example 1-18 | Film 4 | PR-A2 | Vertical profile | 1.6 |
| Example 1-19 | Film 5 | PR-A2 | Vertical profile | 1.7 |
| Example 1-20 | Film 6 | PR-A2 | Vertical profile | 1.6 |
| Example 1-21 | Film 7 | PR-A2 | Vertical profile | 1.6 |
| Example 1-22 | Film 8 | PR-A2 | Vertical profile | 1.6 |
| Example 1-23 | Film 9 | PR-A2 | Vertical profile | 1.6 |
| Example 1-24 | Film 10 | PR-A2 | Vertical profile | 1.6 |
| Example 1-25 | Film 11 | PR-A2 | Vertical profile | 1.7 |
| Example 1-26 | Film 12 | PR-A2 | Vertical profile | 1.7 |
| Example 1-27 | Film 13 | PR-A2 | Vertical profile | 1.6 |
| Example 1-28 | Film 14 | PR-A2 | Vertical profile | 1.6 |
| Example 1-29 | Film 1 | PR-A3 | Vertical profile | 1.6 |
| Example 1-30 | Film 2 | PR-A3 | Vertical profile | 1.6 |
| Example 1-31 | Film 3 | PR-A3 | Vertical profile | 1.7 |
| Example 1-32 | Film 4 | PR-A3 | Vertical profile | 1.7 |
| Example 1-33 | Film 5 | PR-A3 | Vertical profile | 1.6 |
| Example 1-34 | Film 6 | PR-A3 | Vertical profile | 1.6 |
| Example 1-35 | Film 7 | PR-A3 | Vertical profile | 1.6 |
| Example 1-36 | Film 8 | PR-A3 | Vertical profile | 1.6 |
| Example 1-37 | Film 9 | PR-A3 | Vertical profile | 1.6 |
| Example 1-38 | Film 10 | PR-A3 | Vertical profile | 1.6 |
| Example 1-39 | Film 11 | PR-A3 | Vertical profile | 1.6 |
| Example 1-40 | Film 12 | PR-A3 | Vertical profile | 1.7 |
| Example 1-41 | Film 13 | PR-A3 | Vertical profile | 1.6 |
| Example 1-42 | Film 14 | PR-A3 | Vertical profile | 1.6 |

TABLE 6-2

| Example | Silicon-containing resist underlayer film | ArF resist | Pattern sectional profile after development | LWR |
|---|---|---|---|---|
| Comparative Example 1-1 | Film 15 | PR-A1 | Vertical profile | 1.9 |
| Comparative Example 1-2 | Film 16 | PR-A1 | Vertical profile | 2.2 |
| Comparative Example 1-3 | Film 17 | PR-A1 | Vertical profile | 2.1 |
| Comparative Example 1-4 | Film 15 | PR-A2 | Vertical profile | 1.9 |
| Comparative Example 1-5 | Film 16 | PR-A2 | Vertical profile | 2.0 |
| Comparative Example 1-6 | Film 17 | PR-A2 | Vertical profile | 2.0 |
| Comparative Example 1-7 | Film 15 | PR-A3 | Vertical profile | 2.0 |
| Comparative Example 1-8 | Film 16 | PR-A3 | Vertical profile | 2.0 |
| Comparative Example 1-9 | Film 17 | PR-A3 | Vertical profile | 2.1 |

As shown in Tables 6-1 and 6-2, it was confirmed that when the acid generator of the present invention is added, a pattern with smaller LWR can be formed compared to conventional acid generators shown in the Comparative Examples.

Patterning Test by EUV Exposure and Negative-Type Development

The composition for forming a silicon-containing resist underlayer film Sols. 18 to 77 were applied onto a silicon wafer and heated at 240° C. for 60 seconds to prepare silicon-containing films: Film 18 to 77 having a film thickness of 20 nm.

Subsequently, a resist material having the following components dissolved at ratios shown in Table 7 was spin-coated onto the Films 18 to 77 and prebaked at 105° C. for 60 seconds using a hot plate to prepare a resist film with a thickness of 60 nm. The resultant was exposed using an EUV scanner NXE3300 (manufactured by ASML, NA: 0.33, σ: 0.9/0.6, quadrupole illumination, with a pitch of 50 nm (on-wafer size)), followed by PEB at 100° C. for 60 seconds on the hot plate. With rotating at 30 rpm, a developer of butyl acetate was discharged from a developer nozzle for 3 seconds, and then the rotation was stopped to perform puddle-development for 27 seconds, spin-drying was performed after rinsing with diisoamyl ether, and baking was performed at 100° C. for 20 seconds to evaporate the rinse solvent. Thus, hole patterns with a dimension of 25 nm were obtained.

Using a CD-SEM (CG5000) manufactured by Hitachi High-Technologies Corporation, an cross-sectional profile at which a hole dimension of 25 nm was formed was observed and in this event, the dimensions of 50 holes were measured, from which the dimensional variation (CDU, 3σ) was determined. The results are shown in Tables 10-1 and 10-2.

TABLE 7
| | Base resin (parts by mass) | Photo-acid generator (parts by mass) | Basic compound (parts by mass) | Surfactant (parts by mass) | Solvent (parts by mass) |
|---|---|---|---|---|---|
| PR-E1 | PRP-E1 (85) | PAG-E1 (15.0) | Q-E1 (0.3) | FC-4430 (0.1) | PGMEA(2800) CyHO(1400) |
| PR-E2 | PRP-E2 (85) | PAG-E1 (15.0) | Q-E1 (0.3) | FC-4430 (0.1) | PGMEA(2800) CyHO(1400) |
Surfactant: FC-4430 Manufactured by 3M
TABLE 8
| | Constitutional unit | | | | Mw | Mw/Mn |
|---|---|---|---|---|---|---|
| | Unit-1 | Unit-2 | Unit-3 | Unit-4 | | |
| PRP-E1 | 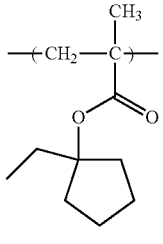 (50) | 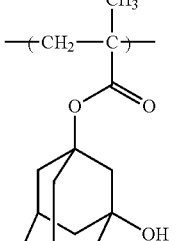 (10) | 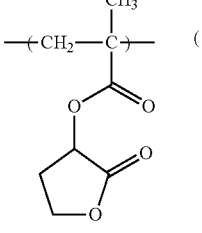 (20) | 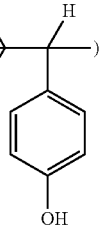 (20) | 9200 | 1.9 |
| PRP-E2 | 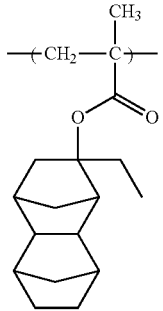 (10) | 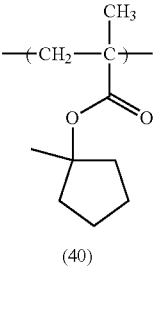 (40) | 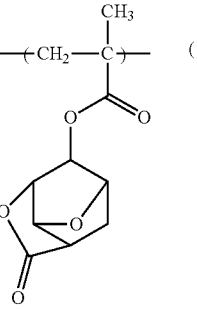 (20) | 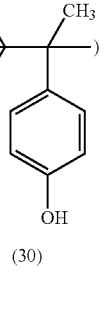 (30) | 8500 | 1.8 |
TABLE 9
| PAG-E1 | Q-E1 |
|---|---|
| 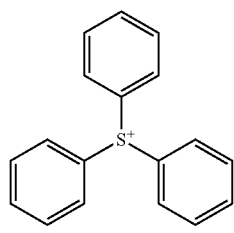 | 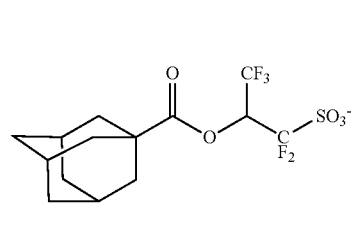 |

TABLE 10-1

| Example | Silicon-containing resist underlayer film | EUV resist | Sectional profile of hole pattern | CDU |
|---|---|---|---|---|
| Example 2-1 | Film 18 | PR-E1 | Vertical profile | 2.6 |
| Example 2-2 | Film 19 | PR-E1 | Vertical profile | 2.8 |
| Example 2-3 | Film 20 | PR-E1 | Vertical profile | 2.6 |
| Example 2-4 | Film 21 | PR-E1 | Vertical profile | 2.5 |
| Example 2-5 | Film 22 | PR-E1 | Vertical profile | 2.7 |
| Example 2-6 | Film 23 | PR-E1 | Vertical profile | 2.9 |
| Example 2-7 | Film 24 | PR-E1 | Vertical profile | 2.8 |
| Example 2-8 | Film 25 | PR-E1 | Vertical profile | 2.5 |
| Example 2-9 | Film 26 | PR-E1 | Vertical profile | 2.5 |
| Example 2-10 | Film 27 | PR-E1 | Vertical profile | 2.8 |
| Example 2-11 | Film 28 | PR-E1 | Vertical profile | 2.7 |
| Example 2-12 | Film 29 | PR-E1 | Vertical profile | 2.7 |
| Example 2-13 | Film 30 | PR-E1 | Vertical profile | 2.6 |
| Example 2-14 | Film 31 | PR-E1 | Vertical profile | 2.7 |
| Example 2-15 | Film 32 | PR-E1 | Vertical profile | 2.5 |
| Example 2-16 | Film 33 | PR-E1 | Vertical profile | 2.7 |
| Example 2-17 | Film 34 | PR-E1 | Vertical profile | 2.8 |
| Example 2-18 | Film 35 | PR-E1 | Vertical profile | 2.6 |
| Example 2-19 | Film 36 | PR-E1 | Vertical profile | 2.7 |
| Example 2-20 | Film 37 | PR-E1 | Vertical profile | 2.5 |
| Example 2-21 | Film 38 | PR-E1 | Vertical profile | 2.7 |
| Example 2-22 | Film 39 | PR-E1 | Vertical profile | 2.7 |
| Example 2-23 | Film 40 | PR-E1 | Vertical profile | 2.8 |
| Example 2-24 | Film 41 | PR-E1 | Vertical profile | 2.9 |
| Example 2-25 | Film 42 | PR-E1 | Vertical profile | 2.8 |
| Example 2-26 | Film 43 | PR-E2 | Vertical profile | 2.8 |
| Example 2-27 | Film 44 | PR-E2 | Vertical profile | 2.6 |
| Example 2-28 | Film 45 | PR-E2 | Vertical profile | 2.5 |
| Example 2-29 | Film 46 | PR-E2 | Vertical profile | 2.7 |
| Example 2-30 | Film 47 | PR-E2 | Vertical profile | 2.7 |
| Example 2-31 | Film 48 | PR-E2 | Vertical profile | 2.9 |
| Example 2-32 | Film 49 | PR-E2 | Vertical profile | 2.6 |
| Example 2-33 | Film 50 | PR-E2 | Vertical profile | 2.6 |
| Example 2-34 | Film 51 | PR-E2 | Vertical profile | 2.6 |
| Example 2-35 | Film 52 | PR-E2 | Vertical profile | 2.6 |
| Example 2-36 | Film 53 | PR-E2 | Vertical profile | 2.6 |
| Example 2-37 | Film 54 | PR-E2 | Vertical profile | 2.5 |
| Example 2-38 | Film 55 | PR-E2 | Vertical profile | 2.6 |
| Example 2-39 | Film 56 | PR-E2 | Vertical profile | 2.6 |
| Example 2-40 | Film 57 | PR-E2 | Vertical profile | 2.9 |
| Example 2-41 | Film 58 | PR-E2 | Vertical profile | 2.8 |
| Example 2-42 | Film 59 | PR-E2 | Vertical profile | 2.5 |

TABLE 10-2

| Example | Silicon-containing resist underlayer film | EUV resist | Sectional profile of hole pattern | CDU |
|---|---|---|---|---|
| Example 2-43 | Film 60 | PR-E2 | Vertical profile | 2.7 |
| Example 2-44 | Film 61 | PR-E2 | Vertical profile | 2.6 |
| Example 2-45 | Film 62 | PR-E2 | Vertical profile | 2.6 |
| Example 2-46 | Film 63 | PR-E2 | Vertical profile | 2.5 |
| Example 2-47 | Film 64 | PR-E2 | Vertical profile | 2.4 |
| Example 2-48 | Film 65 | PR-E2 | Vertical profile | 2.5 |
| Example 2-49 | Film 66 | PR-E2 | Vertical profile | 2.6 |
| Example 2-50 | Film 67 | PR-E2 | Vertical profile | 2.6 |
| Example 2-51 | Film 68 | PR-E2 | Vertical profile | 2.7 |
| Example 2-52 | Film 69 | PR-E2 | Vertical profile | 2.4 |
| Example 2-53 | Film 70 | PR-E2 | Vertical profile | 2.6 |
| Example 2-54 | Film 71 | PR-E2 | Vertical profile | 2.6 |
| Example 2-55 | Film 72 | PR-E2 | Vertical profile | 2.5 |
| Example 2-56 | Film 73 | PR-E2 | Vertical profile | 2.5 |
| Example 2-57 | Film 74 | PR-E2 | Vertical profile | 2.6 |
| Comparative Example 2-1 | Film 75 | PR-E1 | Vertical profile | 3.1 |
| Comparative Example 2-2 | Film 76 | PR-E1 | Vertical profile | 3.0 |
| Comparative Example 2-3 | Film 77 | PR-E1 | Vertical profile | 3.0 |
| Comparative Example 2-4 | Film 75 | PR-E2 | Vertical profile | 3.0 |
| Comparative Example 2-5 | Film 76 | PR-E2 | Vertical profile | 3.3 |
| Comparative Example 2-6 | Film 77 | PR-E2 | Vertical profile | 3.1 |

As shown in Tables 10-1 and 10-2, it was confirmed that when the acid generator of the present invention is added, a pattern excellent in CDU can be formed compared to conventional acid generators shown in the Comparative Examples.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming a silicon-containing resist underlayer film comprising:
   a thermosetting silicon-containing material containing any one or more of a repeating unit shown by the following general formula (Sx-1), a repeating unit shown by the following general formula (Sx-2), and a partial structure shown by the following general formula (Sx-3):

(Sx-1)

(Sx-2)

(Sx-3)

wherein:
   $R^1$ represents an organic group having one or more silanol groups, hydroxy groups, or carboxy groups, or an organic group from which a protecting group is eliminated by an action of acid and/or heat to generate one or more silanol groups, hydroxy groups, or carboxy groups; and
   $R^2$ and $R^3$ are each independently the same as $R^1$ or each represent a hydrogen atom or a monovalent substituent having 1 to 30 carbon atoms; and
   a compound shown by the following general formula (P-0):

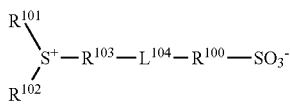 (P-0)

wherein in the formula (P-0), $R^{100}$ represents a divalent organic group substituted with one or more fluorine atoms;

$R^{101}$ and $R^{102}$ each independently represents a linear, branched, or cyclic monovalent hydrocarbon group having 1 to 20 carbon atoms substituted or unsubstituted with a hetero atom selected from the group consisting of an oxygen atom, a sulfur atom, a nitrogen atom, and a halogen atom;

$R^{103}$ represents a linear, branched, or cyclic divalent hydrocarbon group having 1 to 20 carbon atoms substituted or unsubstituted with a hetero atom selected from the group consisting of an oxygen atom, a sulfur atom, a nitrogen atom, and a halogen atom;

$R^{101}$ and $R^{102}$, or $R^{101}$ and $R^{103}$, are optionally bonded to each other to form a ring with a sulfur atom in the formula; and $L^{104}$ represents a single bond or a linear, branched, or cyclic divalent hydrocarbon group having 1 to 20 carbon atoms substituted or unsubstituted with a hetero atom selected from the group consisting of an oxygen atom, a sulfur atom, a nitrogen atom, and a halogen atom.

2. The composition for forming a silicon-containing resist underlayer film according to claim 1, further comprising a crosslinking catalyst selected from the group consisting of a sulfonium salt represented by the following general formula (Xc-1), an iodonium salt, a phosphonium salt, an ammonium salt and a polysiloxane having a structure partially containing one of these salts or an alkaline metal salt,

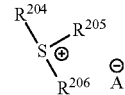 (Xc-1)

wherein:

$R^{204}$, $R^{205}$, and $R^{206}$ may be identical to or different from one another and each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms, and some or all of the hydrogen atoms of these groups are optionally substituted with an alkoxy group;

$R^{205}$ and $R^{206}$ may form a ring, and when a ring is formed, $R^{205}$ and $R^{206}$ each represent an alkylene group having 1 to 6 carbon atoms; and $A^-$ represents a non-nucleophilic counter ion.

3. The composition for forming a silicon-containing resist underlayer film according to claim 2, further comprising a nitrogen-containing compound having an acid-decomposable substituent.

4. The composition for forming a silicon-containing resist underlayer film according to claim 1, further comprising a nitrogen-containing compound having an acid-decomposable substituent.

* * * * *